US011211768B2

(12) United States Patent
Matsumoto et al.

(10) Patent No.: US 11,211,768 B2
(45) Date of Patent: Dec. 28, 2021

(54) SEMICONDUCTOR OPTICAL INTEGRATED DEVICE

(71) Applicant: Mitsubishi Electric Corporation, Tokyo (JP)

(72) Inventors: Keisuke Matsumoto, Tokyo (JP); Yoshimichi Morita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/614,345

(22) PCT Filed: Oct. 3, 2017

(86) PCT No.: PCT/JP2017/035920
§ 371 (c)(1),
(2) Date: Nov. 15, 2019

(87) PCT Pub. No.: WO2019/069359
PCT Pub. Date: Apr. 11, 2019

(65) Prior Publication Data
US 2020/0274318 A1 Aug. 27, 2020

(51) Int. Cl.
*H01S 5/026* (2006.01)
*G02B 6/12* (2006.01)
*H01L 31/12* (2006.01)

(52) U.S. Cl.
CPC ........ *H01S 5/0264* (2013.01); *G02B 6/12004* (2013.01); *H01L 31/12* (2013.01); *H01S 5/0268* (2013.01)

(58) Field of Classification Search
CPC ... G02B 6/12004; G02B 6/4286; H01L 31/12; H01S 5/0268; H01S 3/00; H01S 5/0264; H01S 3/19; H01S 3/04; H01S 5/00
(Continued)

(56) References Cited

U.S. PATENT DOCUMENTS

| | | | | |
|---|---|---|---|---|
| 5,134,671 A * | 7/1992 | Koren | ................ | G02B 6/12004 385/1 |
| 6,111,903 A * | 8/2000 | Isaksson | ............. | H01S 5/02257 372/50.21 |
| 7,110,170 B2 * | 9/2006 | Lee | ........................... | H01S 5/50 359/344 |

(Continued)

FOREIGN PATENT DOCUMENTS

| JP | S63-273386 A | 11/1988 |
|---|---|---|
| JP | H04-254380 A | 9/1992 |

(Continued)

OTHER PUBLICATIONS

International Search Report; Written Opinion; and Notification of Transmittal of the International Search Report and the Written Opinion of the International Searching Authority, or the Declaration issued in PCT/JP2017/035920; dated Jan. 9, 2018.

(Continued)

*Primary Examiner* — Tuan N Nguyen
(74) *Attorney, Agent, or Firm* — Studebaker & Brackett PC

(57) ABSTRACT

A semiconductor optical integrated device according to the present invention includes a conductive substrate, a laser provided to the conductive substrate, a semi-insulating semiconductor layer provided on the conductive substrate, a photodiode provided on the semi-insulating semiconductor layer and a waveguide that is provided on the conductive substrate and guides output light of the laser to the photodiode, wherein an anode of the photodiode and a cathode of the photodiode are drawn from an upper surface side of the photodiode, and the waveguide and the photodiode are separated from each other by the semi-insulating semiconductor layer.

7 Claims, 68 Drawing Sheets

(58) Field of Classification Search
USPC .................................. 372/6, 50.22; 359/344
See application file for complete search history.

(56) References Cited

U.S. PATENT DOCUMENTS

| | | | |
|---|---|---|---|
| 7,343,061 B2* | 3/2008 | Forrest | G02B 6/12004 372/50.21 |
| 8,098,969 B2* | 1/2012 | Tolstikhin | H01S 5/5018 385/14 |
| 2003/0072076 A1* | 4/2003 | Yoon | H01S 5/50 359/344 |
| 2007/0110357 A1 | 5/2007 | Forrest et al. | |

FOREIGN PATENT DOCUMENTS

| | | |
|---|---|---|
| JP | H11-186661 A | 7/1999 |
| JP | 2000-150925 A | 5/2000 |
| JP | 2008-204970 A | 9/2008 |
| JP | 2013-153015 A | 8/2013 |
| JP | 2013-251505 A | 12/2013 |
| JP | 2015-122440 A | 7/2015 |

OTHER PUBLICATIONS

Office Action issued in JP 2018-512441; mailed by the Japanese Patent Office dated May 15, 2018.
An Office Action mailed by China National Intellectual Property Administration dated Jun. 21, 2021, which corresponds to Chinese Patent Application No. 201780095438.4 and is related to U.S. Appl. No. 16/614,345; with English language translation.

\* cited by examiner

SEMICONDUCTOR OPTICAL INTEGRATED DEVICE

FIELD

The present invention relates to a semiconductor optical integrated device.

BACKGROUND

Patent Literature 1 discloses a semiconductor laser in which a semiconductor laser unit and a modulator unit are provided along an optical waveguide. An optical monitor unit is provided in a portion of the optical waveguide. The optical waveguide, the semiconductor laser, the modulator unit, and the optical monitor unit are provided on a semiconductor substrate. Since the modulator unit, the optical monitor unit, and the semiconductor laser unit are all configured in the same optical waveguide, a cathode is common to these units. A cathode electrode is provided on the back surface of the semiconductor substrate. The cathode electrode which is a common terminal serves as ground.

CITATION LIST

Patent Literature

[PTL 1] JP H11-186661 A

SUMMARY

Technical Problem

When a semiconductor laser is used as a light source of an optical communication system, a photodiode for monitoring an optical output of the semiconductor laser is generally required. When a semiconductor laser is mounted in a module or the like, a photodiode of another chip may be arranged behind the semiconductor laser. However, the use of the other chip photodiode may cause increase of the manufacturing cost and increase of the number of steps caused by assembly. In addition, the module capacity may be increased due to a space in which the photodiode is arranged.

Therefore, an example in which a photodiode is integrated on the same substrate as the semiconductor laser as disclosed in Patent Literature 1 has been reported. In Patent literature 1, n-type InP is used as a semiconductor substrate. At this time, the polarity of an electrode on an upper surface side of the photodiode serving as a monitor unit is an anode. When the cathode serves as ground, a voltage to be applied to the electrode on the upper surface side of the photodiode is negative. Here, as a configuration of the module, a positive polarity power source is desired to be connected to the electrode on the upper surface side of the photodiode in some cases. In such a case, the configuration of Patent Literature 1 may cause inconvenience.

Furthermore, a structure in which a photodiode is formed on a semi-insulating InP substrate and an anode and a cathode of the photodiode are formed on the upper surface side of the photodiode may be considered. In this case, with respect to a laser and a modulator integrated on the semi-insulating InP substrate, electrodes of both polarities may be also considered to be provided on the upper surface sides thereof. Accordingly, there is a problem that the number of electrode terminals increases as compared with a case where a conductive substrate is used.

In a semiconductor device in which a photodiode and a laser are monolithically integrated, a reverse bias may be applied to the photodiode and the laser. In order to suppress deterioration of characteristics caused by reactive current generated at this time, it may be required to electrically separate the photodiode and the laser from each other.

The present invention has been made to solve the above-described problems, and has an object to obtain a semiconductor optical integrated device that can enhance the degree of freedom of the polarity of a power source connected to a photodiode and improve characteristics.

Solution to Problem

A semiconductor optical integrated device according to the present invention includes a conductive substrate, a laser provided to the conductive substrate, a semi-insulating semiconductor layer provided on the conductive substrate, a photodiode provided on the semi-insulating semiconductor layer and a waveguide that is provided on the conductive substrate and guides output light of the laser to the photodiode, wherein an anode of the photodiode and a cathode of the photodiode are drawn from an upper surface side of the photodiode, and the waveguide and the photodiode are separated from each other by the semi-insulating semiconductor layer.

Advantageous Effects of Invention

In the semiconductor optical integrated device according to the invention of the present application, the conductive substrate and the photodiode are electrically separated from each other by the semi-insulating semiconductor layer. Therefore, both of an anode and a cathode can be drawn from the upper surface side of the photodiode. Accordingly, the degree of freedom of the polarity of the power source connected to the photodiode is enhanced. Furthermore, the reactive current can be suppressed because the waveguide and the photodiode are separated from each other by the semi-insulating semiconductor layer. Therefore, the characteristics can be improved.

BRIEF DESCRIPTION OF DRAWINGS

FIG. 120 is a cross-sectional view obtained by cutting FIG. 118 along a line III-IV.

FIG. 121 is a cross-sectional view obtained by cutting FIG. 118 along a line V-VI.

FIG. 122 is a cross-sectional view obtained by cutting FIG. 118 along a line VII-VIII.

FIG. 123 is a plan view showing a state in which the openings have been formed in the insulating film in the second embodiment.

FIG. 124 is a cross-sectional view obtained by cutting FIG. 123 along a line I-II.

FIG. 125 is a cross-sectional view obtained by cutting FIG. 123 along a line III-IV.

FIG. 126 is a cross-sectional view obtained by cutting FIG. 123 along a line V-VI.

FIG. 127 is a cross-sectional view obtained by cutting FIG. 123 along a line VII-VIII.

DESCRIPTION OF EMBODIMENTS

Figure 1:
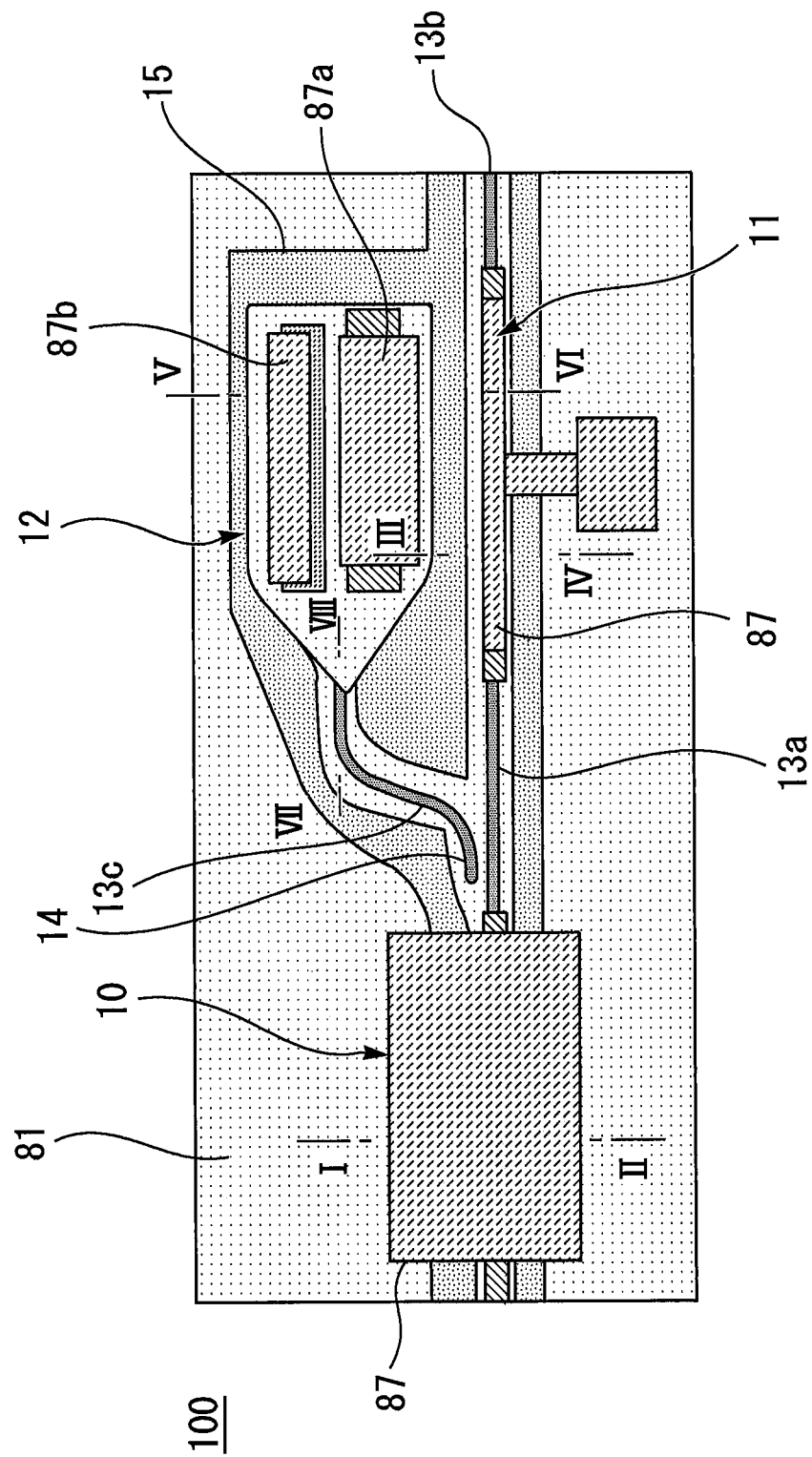
FIG. 1 is a plan view of a semiconductor optical integrated device according to a first embodiment.

A semiconductor optical integrated device according to an embodiment of the present invention are described with reference to drawings. Identical or corresponding constitutional elements are given the same reference numerals, and the repeated description of such constitutional elements may be omitted.

First Embodiment

FIG. 1 is a plan view of a semiconductor optical integrated device 100 according to a first embodiment. The semiconductor optical integrated device 100 includes a conductive substrate. The conductive substrate is provided with a laser 10. The laser 10 is a semiconductor laser. Furthermore, the conductive substrate is provided with a modulator 11 and a photodiode 12. The laser 10, the modulator 11, and the photodiode 12 are integrated on the conductive substrate.

The conductive substrate is further provided with waveguides 13a, 13b, and 13c. The waveguide 13a connects an output of the laser 10 and an input of the modulator 11 to each other. The waveguide 13b connects an output of the modulator 11 and an output of the semiconductor optical integrated device 100 to each other. The waveguide 13c is provided between the output of the laser 10 and a light receiving surface of the photodiode 12. The waveguide 13c guides output light of the laser 10 to the photodiode 12.

A directional coupler 14 is provided at an end portion on a laser 10 side of the waveguide 13c. The directional coupler 14 is formed by making the waveguide 13c close to the waveguide 13a so that a part of the output light of the laser 10 can be extracted to the waveguide 13c. The distance between the directional coupler 14 and the waveguide 13a is several μm.

Trenches 15 are provided around the laser 10, the modulator 11, the photodiode 12, and the waveguides 13a, 13b, and 13c. An electrode 87 is provided on the upper surface side of the laser 10, the upper surface side of the modulator 11, and the upper surface side of the photodiode 12. The electrode 87 is a contact electrode. A portion of the electrode 87, which is provided on the upper surface side of the photodiode 12, serves as an anode 87a and a cathode 87b of the photodiode 12.

An insulating film 81 is provided on the upper surface of the semiconductor optical integrated device 100 except for the electrode 87. Note that the shapes of the laser 10, the modulator 11, the photodiode 12, and the waveguides 13a, 13b, and 13c provided under the insulating film 81 are shown for convenience in FIG. 1.

Figure 2:
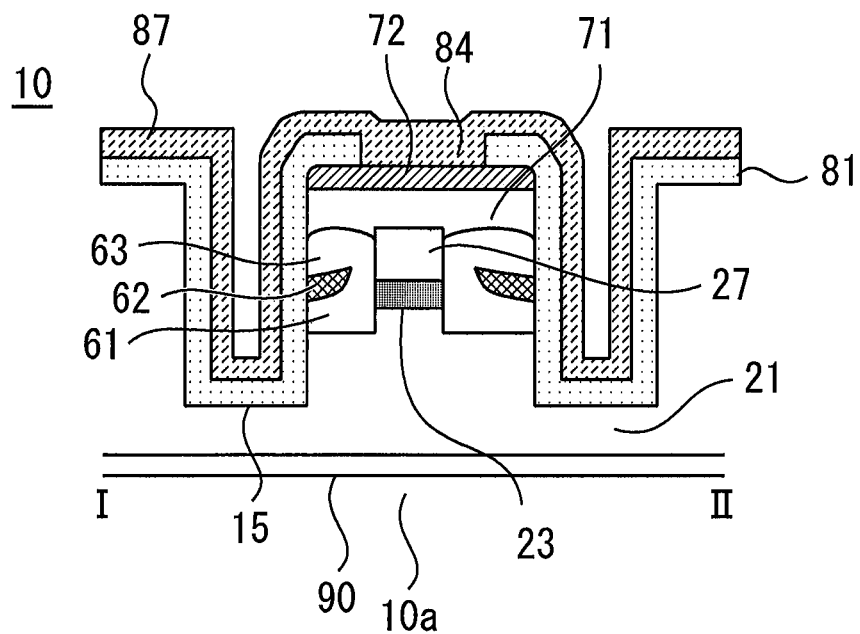
FIG. 2 is a cross-sectional view obtained by cutting the semiconductor optical integrated device of FIG. 1 along a line I-II.

FIG. 2 is a cross-sectional view obtained by cutting the semiconductor optical integrated device 100 of FIG. 1 along a line I-II. FIG. 2 is a cross-sectional view of the laser 10. The conductive substrate 21 is made of, for example, conductive InP. In the present embodiment, the conductive substrate 21 is made of n-InP. An active layer 23 is provided on the conductive substrate 21. A cladding layer 27 is provided on the active layer 23. The cladding layer 27 is made of p-InP. Note that some layers constituting the laser 10 are omitted for convenience in FIG. 1.

Buried growth layers are provided on both sides of the active layer 23 and the cladding layer 27. The buried growth layer includes a p-InP layer 61, an n-InP layer 62 provided on the p-InP layer 61, and a p-InP layer 63 provided on the n-InP layer 62.

A contact layer is provided on the cladding layer 27 and the p-InP layer 63. The contact layer includes a cladding layer 71 and a p-InGaAs layer 72 provided on the cladding layer 71. The cladding layer 71 is made of p-InP.

The trenches 15 are provided on both sides of the laser 10. The trenches 15 are provided from the upper surface side of the laser 10 to the conductive substrate 21. An insulating film 81 is provided on the upper surface of the contact layer. The insulating film 81 extends along the trenches 15. The insulating film 81 is provided with an opening 84 for exposing the p-InGaAs layer 72. An electrode 87 is provided on the insulating film 81. The electrode 87 fills the opening 84 and contacts the p-InGaAs layer 72.

The laser 10 has an electrode 90 on the back surface of the conductive substrate 21. Here, the back surface is a surface on an opposite side of the conductive substrate 21 to a side of the conductive substrate 21 where the photodiode 12 is provided.

Figure 3:
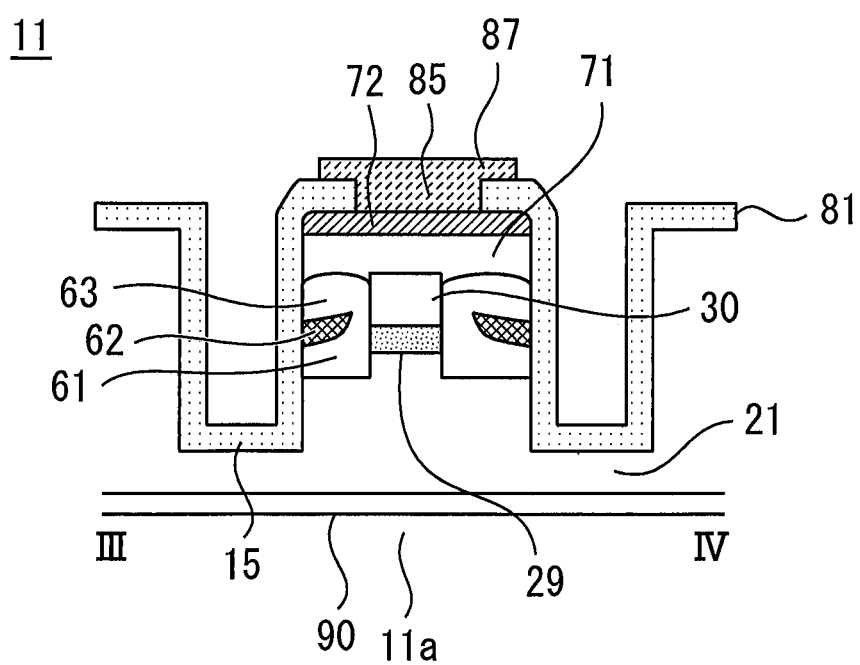
FIG. 3 is a cross-sectional view obtained by cutting the semiconductor optical integrated device of FIG. 1 along a line III-IV.

FIG. 3 is a cross-sectional view obtained by cutting the semiconductor optical integrated device 100 of FIG. 1 along a line III-IV. FIG. 3 is a cross-sectional view of the modulator 11. A modulator absorption layer 29 is provided on the conductive substrate 21. A cladding layer 30 is provided on the modulator absorption layer 29. The cladding layer 30 is made of p-InP. Like the laser 10, buried growth layers are provided on both sides of the modulator absorption layer 29 and the cladding layer 30.

Like the laser 10, a contact layer is provided on the cladding layer 30 and the p-InP layer 63. Trenches 15 are provided on both sides of the modulator 11. The trenches 15 are provided from the upper surface side of the modulator 11 to the conductive substrate 21. An insulating film 81 is provided on the upper surface of the contact layer. The insulating film 81 extends along the trenches 15. The insulating film 81 is provided with an opening 85 for exposing the p-InGaAs layer 72 therethrough. An electrode 87 is provided on the insulating film 81. The electrode 87 fills the opening 85 and contacts the p-InGaAs layer 72.

Figure 4:
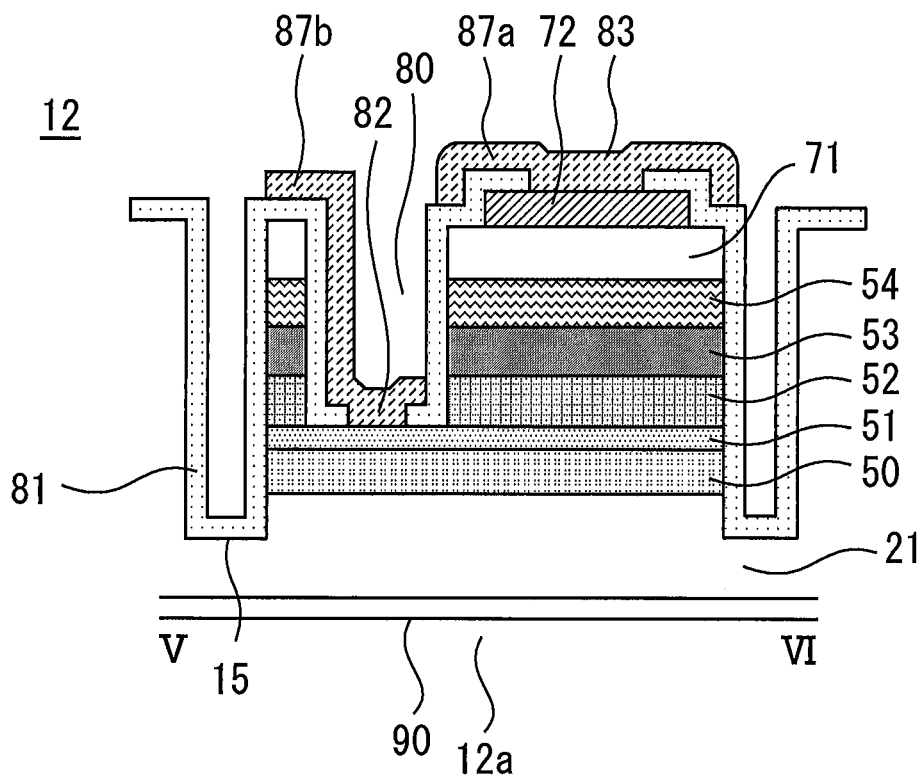
FIG. 4 is a cross-sectional view obtained by cutting the semiconductor optical integrated device of FIG. 1 along a line V-VI.

FIG. 4 is a cross-sectional view obtained by cutting the semiconductor optical integrated device 100 of FIG. 1 along a line V-VI. FIG. 4 is a cross-sectional view of the photodiode 12. A semi-insulating semiconductor layer 50 is provided on the conductive substrate 21. The photodiode 12 is provided on the semi-insulating semiconductor layer 50.

The semi-insulating semiconductor layer 50 is made of, for example, InP doped with Fe. The semi-insulating semiconductor layer 50 has a higher resistance than InP because Fe captures electrons. Not limited to this, the semi-insulating semiconductor layer 50 may be made of InP doped with Ru or Ti. In this case, the semi-insulating semiconductor layer 50 has a high resistance because Ru or Ti captures holes.

A contact layer 51 is provided on the semi-insulating semiconductor layer 50. The contact layer 51 is made of n-InGaAsP. A cladding layer 52 is provided on the contact layer 51.

The cladding layer 52 is made of n-InP. A light absorption layer 53 is provided on the cladding layer 52. The light absorption layer 53 is made of i-InGaAsP. A cladding layer 54 is provided on the light absorption layer 53. The cladding layer 54 is made of p-InP. As described above, the photodiode 12 includes the n-InP cladding layer, the i-InGaAsP light absorption layer, and the p-InP cladding layer in this order from the conductive substrate 21 side.

A contact layer is provided on the cladding layer 54. The contact layer includes a cladding layer 71 and a p-InGaAs layer 72 provided on the cladding layer 71. A contact hole 80 extending from the upper surface of the cladding layer 71 to the contact layer 51 is formed in the photodiode 12. The contact layer 51 is exposed through the contact hole 80.

Trenches 15 are provided on both sides of the photodiode 12. The trenches 15 extend from the upper surface side of the photodiode 12 to the conductive substrate 21. An insulating film 81 is provided on the upper surfaces of the cladding layer 71 and the p-InGaAs layer 72. The insulating film 81 extends along the trenches 15 and the contact hole 80. The insulating film 81 is provided with an opening 83 for exposing the p-InGaAs layer 72. Further, an opening 82 for exposing the contact layer 51 is provided in the insulating film 81 at the bottom surface of the contact hole 80.

An anode 87a and a cathode 87b are provided on the insulating film 81. The anode 87a fills the opening 83 and contacts the p-InGaAs layer 72. The cathode 87b fills the opening 82 and contacts the contact layer 51. The anode 87a of the photodiode 12 and the cathode 87b of the photodiode 12 are drawn from the upper surface side of the photodiode 12. Here, the upper surface of the photodiode 12 is a surface on an opposite side to a side of the photodiode 12 on which the photodiode 12 is in contact with the semi-insulating semiconductor layer 50.

Figure 5:
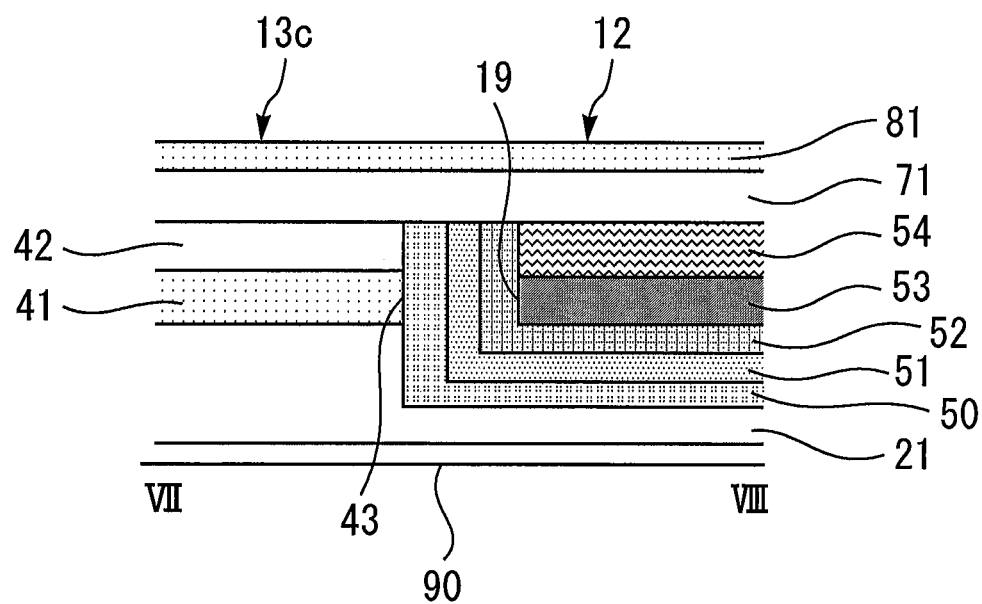
FIG. 5 is a cross-sectional view obtained by cutting the semiconductor optical integrated device of FIG. 1 along a line VII-VIII.

FIG. 5 is a cross-sectional view obtained by cutting the semiconductor optical integrated device 100 of FIG. 1 along a line VII-VIII. FIG. 5 is a cross-sectional view of a connection portion between the photodiode 12 and the waveguide 13c. The waveguide 13c is provided on the conductive substrate 21. In the waveguide 13c, a transparent waveguide layer 41 is provided on the conductive substrate 21. The transparent waveguide layer 41 is made of i-InGaAsP. A cladding layer 42 is provided on the transparent waveguide layer 41. The cladding layer 42 is made of p-InP. The structures of the waveguides 13a and 13b are the same as that of the waveguide 13c.

The semi-insulating semiconductor layer 50, the contact layer 51, and the cladding layer 52 extend along an end face 43 of the waveguide 13c. The end face 43 is an emission end face of the waveguide 13c, and faces the light receiving surface 19 of the photodiode 12. The semi-insulating semiconductor layer 50 is formed continuously from the upper surface of the conductive substrate 21 to an end face 43. The waveguide 13c and the photodiode 12 are separated by the semi-insulating semiconductor layer 50.

Here, the semi-insulating semiconductor layer 50 is semi-insulating, and electrically separates the waveguide 13c and the photodiode 12 from each other. Further, the semi-insulating semiconductor layer 50 transmits therethrough the output light of the laser 10 to the photodiode 12.

The cladding layer 71 is provided on the cladding layer 42 and the cladding layer 54. The insulating film 81 is provided on the cladding layer 71.

Next, an operation of the semiconductor optical integrated device 100 will be described. Output light emitted from the laser 10 is guided to the modulator 11 by the waveguide 13a. A part of the output light of the laser 10 is branched by the directional coupler 14 and guided to the photodiode 12 by the waveguide 13c. By making the waveguide 13c close to the waveguide 13a, light is gradually coupled, and a part of the output light can be extracted to the waveguide 13c. As a result, the output light of the laser 10 is monitored by the photodiode 12. When the photodiode 12 is not integrated, all the output light of the laser 10 is input to the modulator 11.

In the modulator 11, the amount of light absorption changes due to electric field which is applied to MQW (Multi Quantum Well) in a reverse direction. When no electric field is applied to the modulator 11, the output light is transmitted through the modulator 11. When electric field is applied to the modulator 11, the output light does not pass through the modulator 11. As a result, the output light of the laser 10 can be modulated. The output light from the modulator 11 is guided to the output of the semiconductor optical integrated device 100 by the waveguide 13b.

The light guided to the photodiode 12 is absorbed by the light absorption layer 53. As a result, a photocurrent flows through a circuit connected to the photodiode 12. Note that a voltage is applied to the photodiode 12 in a direction opposite to that of the laser 10. The amount of photocurrent is detected as the amount of light received by the photodiode 12. The amount of photocurrent of the photodiode 12 when a target light output is obtained is examined in an initial operation of the semiconductor optical integrated device 100. By adjusting an injection current to the laser 10 so as to obtain the amount of photocurrent described above, the optical output can be maintained so as to coincide with a target value. The semiconductor optical integrated device 100 is used, for example, as a light source in an optical communication system.

Figure 6:
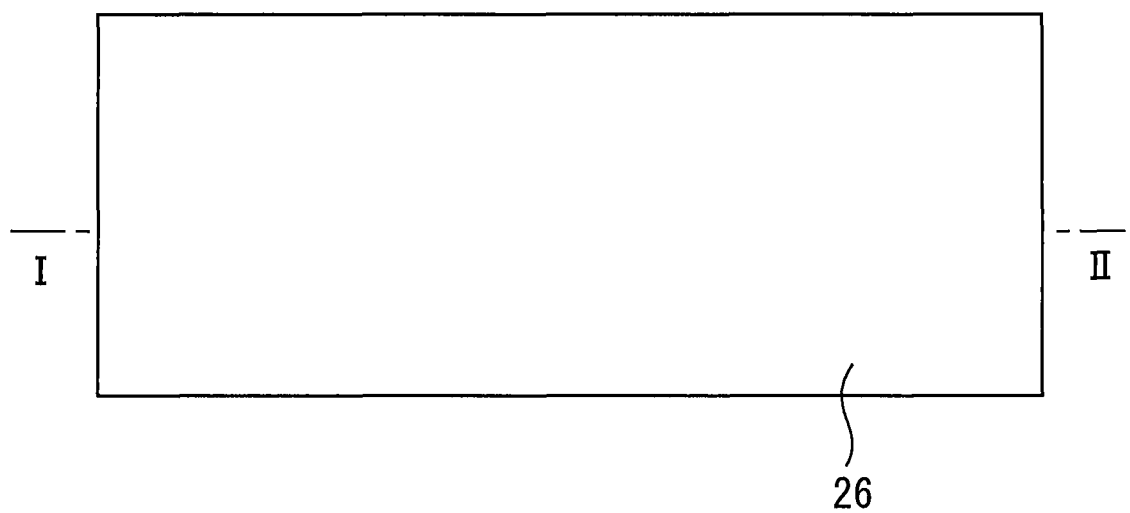
FIG. 6 is a plan view showing the method of manufacturing the semiconductor optical integrated device of the first embodiment.
Figure 7:
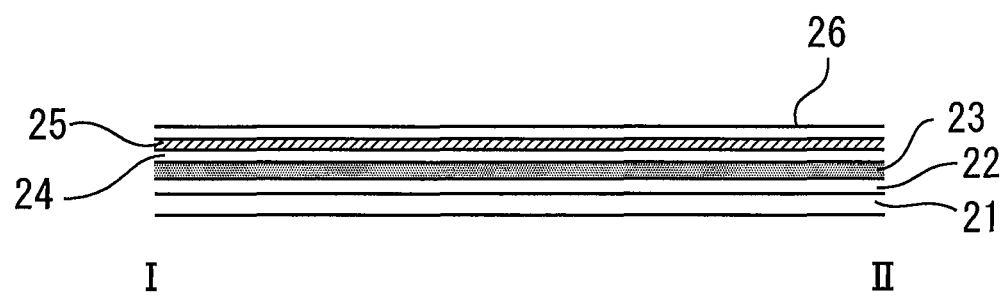
FIG. 7 is a cross-sectional view obtained by cutting FIG. 6 along a line I-II.

Next, a method of manufacturing the semiconductor optical integrated device 100 of the present embodiment will be described. FIG. 6 is a plan view showing the method of manufacturing the semiconductor optical integrated device 100 of the first embodiment. FIG. 7 is a cross-sectional view obtained by cutting FIG. 6 along a line I-II. First, an active layer is formed. Here, a cladding layer 22, an active layer 23, a cladding layer 24, a diffraction grating layer 25, and a cap layer 26 are formed on the conductive substrate 21 in this order from the bottom.

The cladding layer 22 is made of n-InP. The cladding layer 24 is made of p-InP. The cap layer 26 is made of p-InP. The cladding layer 22, the active layer 23, the cladding layer 24, the diffraction grating layer 25, and the cap layer 26 are provided on the entire upper surface of the conductive substrate 21. The cladding layer 22, the active layer 23, the cladding layer 24, the diffraction grating layer 25, and the cap layer 26 are formed by crystal growth.

Figure 8:
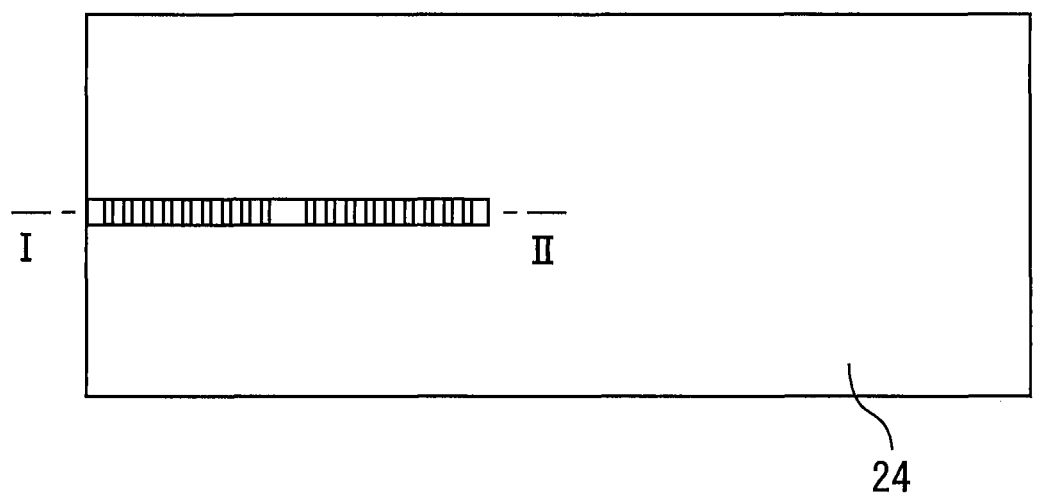
FIG. 8 is a plan view showing a state where the diffraction grating is formed in the first embodiment.
Figure 9:
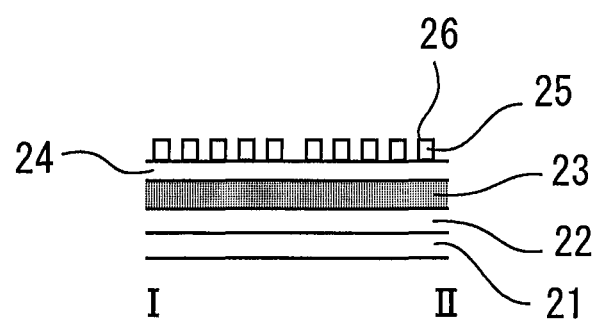
FIG. 9 is a cross-sectional view obtained by cutting FIG. 8 along a line I-II.

Next, a diffraction grating is formed. FIG. 8 is a plan view showing a state where the diffraction grating is formed in the first embodiment. FIG. 9 is a cross-sectional view obtained by cutting FIG. 8 along a line I-II. The diffraction grating is formed by periodically etching the diffraction grating layer 25 and the cap layer 26.

Figure 10:
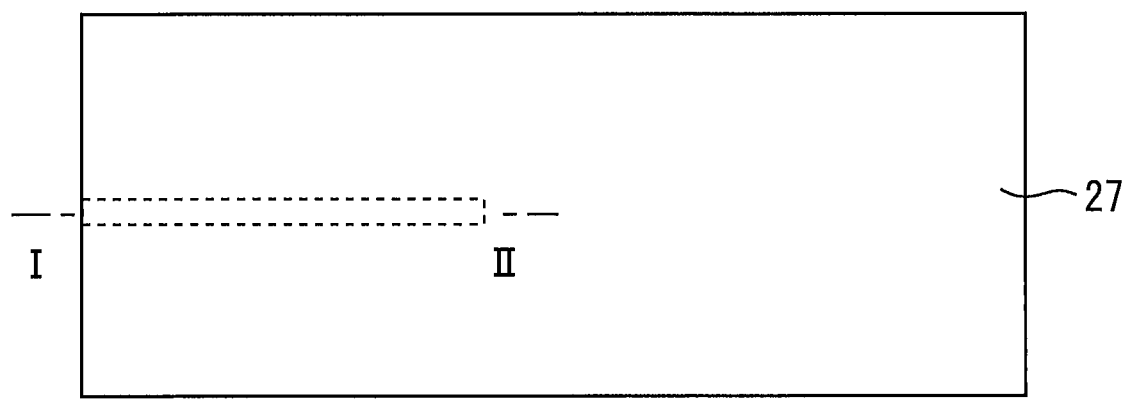
FIG. 10 is a plan view showing a state in which the cladding layer has been formed in the first embodiment.
Figure 11:
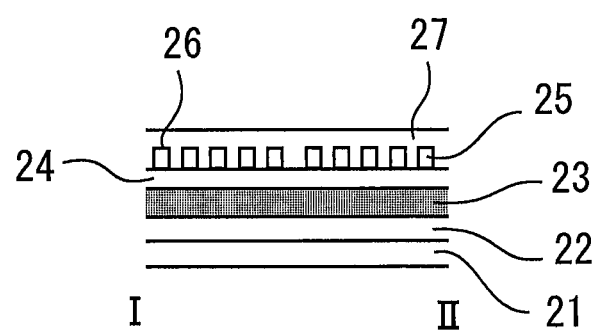
FIG. 11 is a cross-sectional view obtained by cutting FIG. 10 along a line I-II.

Next, the cladding layer 27 is formed. FIG. 10 is a plan view showing a state in which the cladding layer 27 has been formed in the first embodiment. FIG. 11 is a cross-sectional view obtained by cutting FIG. 10 along a line I-II. The cladding layer 27 is provided on the cap layer 26. The cladding layer 27 is formed by crystal growth. The diffraction grating layer 25 is buried with the cladding layer 27. The cladding layer 27 covers the side surface and the upper surface of the cap layer 26. Note that the position of the diffraction grating layer 25 is indicated by a broken line for convenience in FIG. 10.

Figure 12:
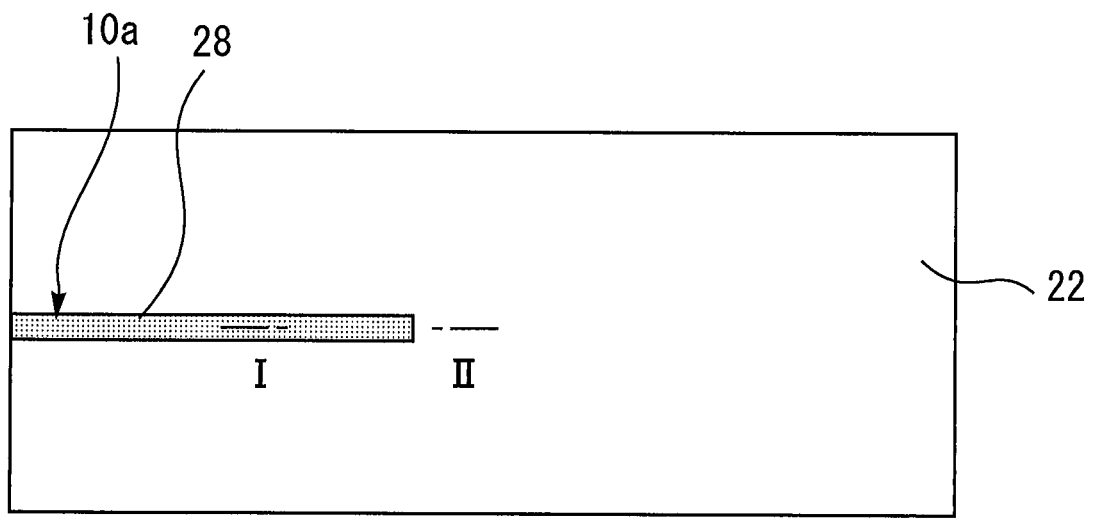
FIG. 12 is a plan view showing a state in which the semiconductor layers constituting the laser in the first embodiment have been etched.
Figure 13:
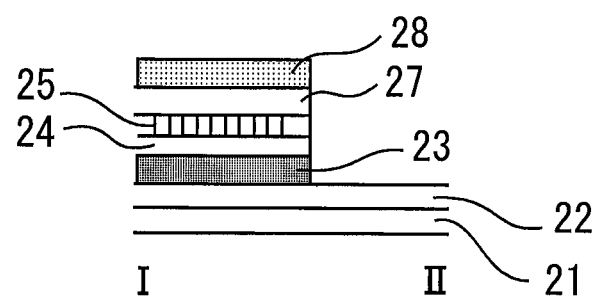
FIG. 13 is a cross-sectional view obtained by cutting FIG. 12 along a line I-II.

Next, semiconductor layers constituting the laser 10 are etched. Here, the semiconductor layers constituting the laser 10 are the cladding layer 22, the active layer 23, the cladding layer 24, the diffraction grating layer 25, and the cap layer 26. FIG. 12 is a plan view showing a state in which the semiconductor layers constituting the laser 10 in the first embodiment have been etched. FIG. 13 is a cross-sectional view obtained by cutting FIG. 12 along a line I-II.

First, an insulating film 28 is formed on the cladding layer 27. The insulating film 28 is provided on a laser forming portion 10a. Here, the laser forming portion 10a indicates a region on the conductive substrate 21 in which the laser 10 is formed. Next, the active layer 23, the cladding layer 24, the diffraction grating layer 25, the cap layer 26, and the cladding layer 27 are etched by using the insulating film 28 as a mask. As a result, the semiconductor layers excluding the laser forming portion 10a are etched. In FIG. 12 and subsequent drawings, the cap layer 26 may be omitted for convenience.

Figure 14:
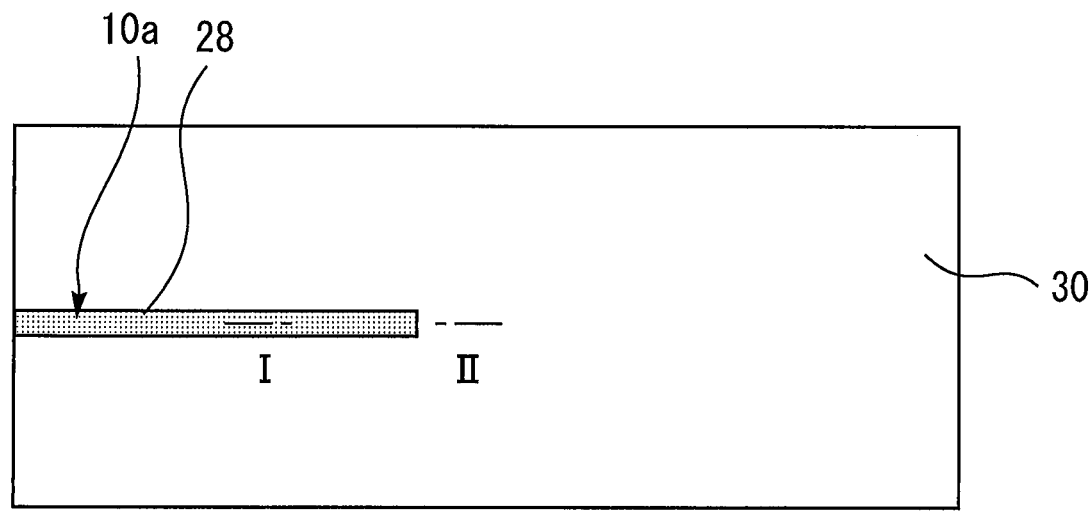
FIG. 14 is a plan view showing a state in which the semiconductor layers constituting the modulator in the first embodiment have been grown.
Figure 15:
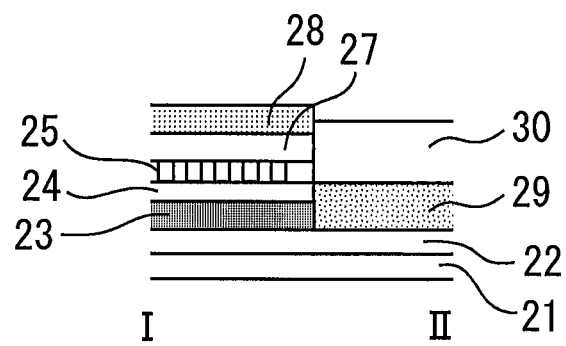
FIG. 15 is a cross-sectional view obtained by cutting FIG. 14 along a line I-II.

Next, semiconductor layers constituting the modulator 11 are grown. The semiconductor layers constituting the modulator 11 are the modulator absorption layer 29 and the cladding layer 30. FIG. 14 is a plan view showing a state in which the semiconductor layers constituting the modulator 11 in the first embodiment have been grown. FIG. 15 is a cross-sectional view obtained by cutting FIG. 14 along a line I-II. Here, the modulator absorption layer 29 and the cladding layer 30 are formed on the cladding layer 22 in this order from the bottom. The modulator absorption layer 29 and the cladding layer 30 are formed by selective growth using the insulating film 28 as a mask. The modulator absorption layer 29 and the cladding layer 30 are formed so as to surround the laser forming portion 10a.

Figure 16:
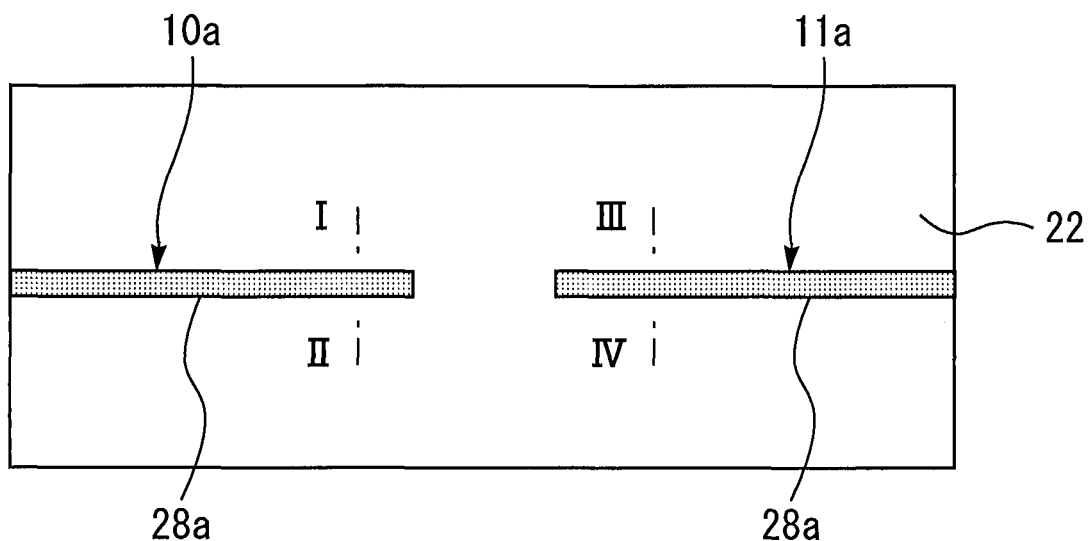
FIG. 16 is a plan view showing a state in which the semiconductor layers constituting the modulator in the first embodiment have been etched.
Figure 17:
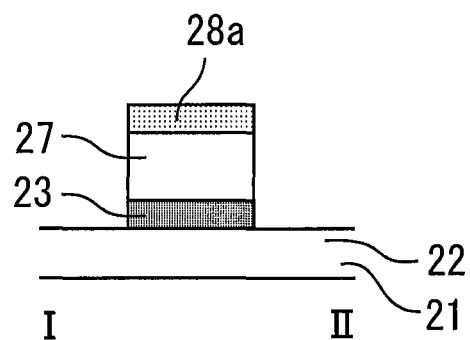
FIG. 17 is a cross-sectional view obtained by cutting FIG. 16 along a line I-II.
Figure 18:
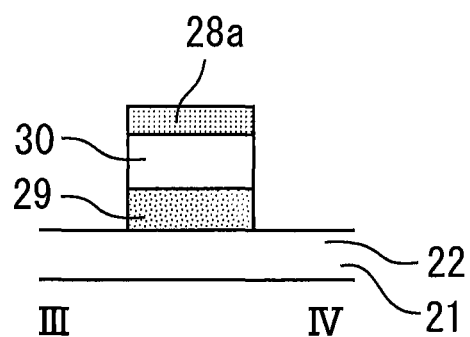
FIG. 18 is a cross-sectional view obtained by cutting FIG. 16 along a line III-IV.

Next, the semiconductor layers constituting the modulator 11 are etched. FIG. 16 is a plan view showing a state in which the semiconductor layers constituting the modulator 11 in the first embodiment have been etched. FIG. 17 is a cross-sectional view obtained by cutting FIG. 16 along a line I-II. FIG. 18 is a cross-sectional view obtained by cutting FIG. 16 along a line III-IV.

Here, first, an insulating film 28a is formed on the cladding layer 27 and the cladding layer 30. The insulating film 28a is provided on the laser forming portion 10a and a modulator forming portion 11a. Here, the modulator forming portion 11a indicates a region on the conductive substrate 21 in which the modulator 11 is formed. Next, the modulator absorption layer 29 and the cladding layer 30 are etched by using the insulating film 28a as a mask. As a result, the semiconductor layers excluding the laser forming portion 10a and the modulator forming portion 11a are etched. Note that in FIG. 17 and subsequent drawings, the diffraction grating layer 25, the cladding layer 24, and the cladding layer 22 may be omitted for convenience.

Figure 19:
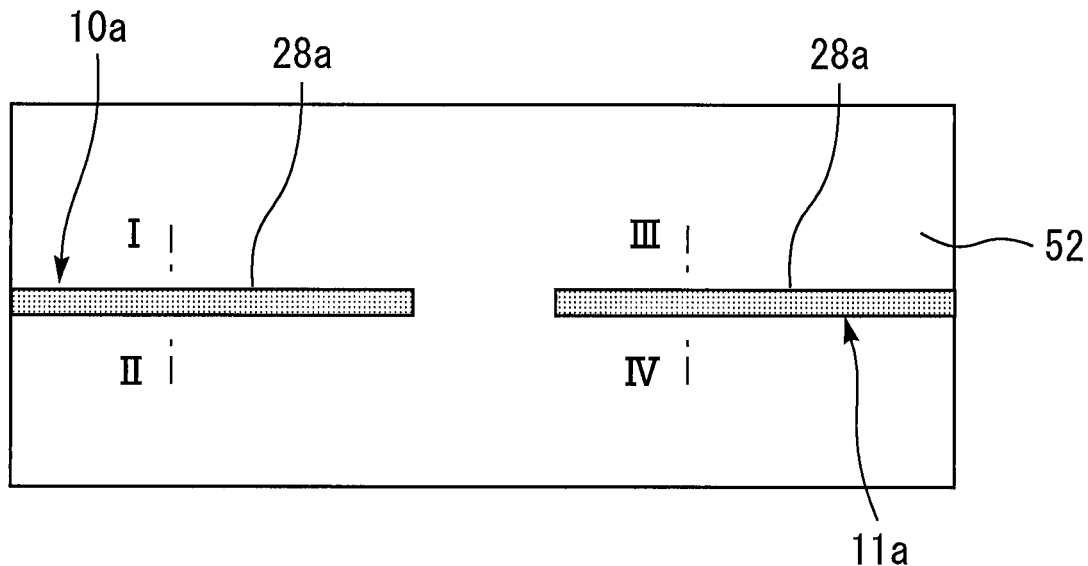
FIG. 19 is a plan view showing a state in which the semiconductor layers constituting the waveguides in the first embodiment have been grown.
Figure 20:
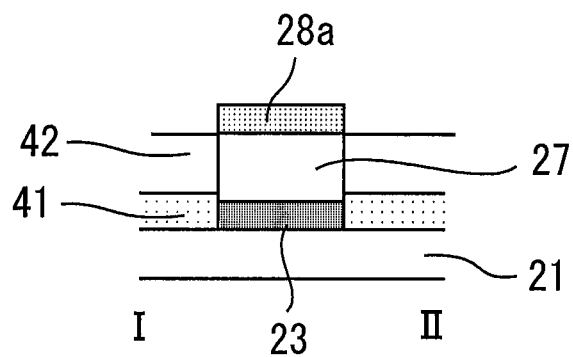
FIG. 20 is a cross-sectional view obtained by cutting FIG. 19 along a line I-II.
Figure 21:
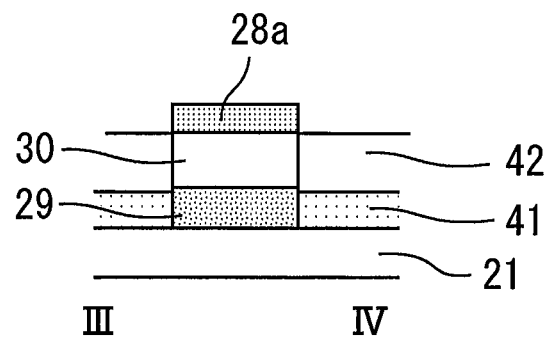
FIG. 21 is a cross-sectional view obtained by cutting FIG. 19 along a line III-IV.

Next, semiconductor layers constituting the waveguides 13a, 13b, and 13c are formed. The semiconductor layers constituting the waveguides 13a, 13b, and 13c are a transparent waveguide layer 41 and a cladding layer 42. FIG. 19 is a plan view showing a state in which the semiconductor layers constituting the waveguides 13a, 13b, and 13c in the first embodiment have been grown. FIG. 20 is a cross-sectional view obtained by cutting FIG. 19 along a line I-II. FIG. 21 is a cross-sectional view obtained by cutting FIG. 19 along a line III-IV.

The transparent waveguide layer 41 and the cladding layer 42 are formed by selective growth using the insulating film 28a as a mask. The transparent waveguide layer 41 and the cladding layer 42 are formed so as to surround the laser forming portion 10a and the modulator forming portion 11a.

Figure 22:
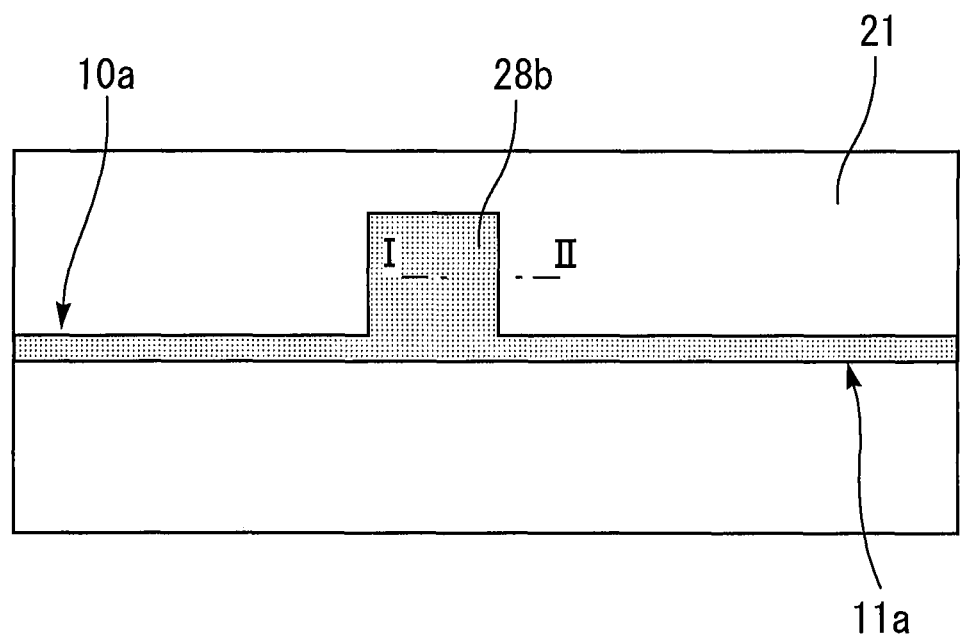
FIG. 22 is a plan view showing a state in which the semiconductor layers constituting the waveguides in the first embodiment have been etched.
Figure 23:
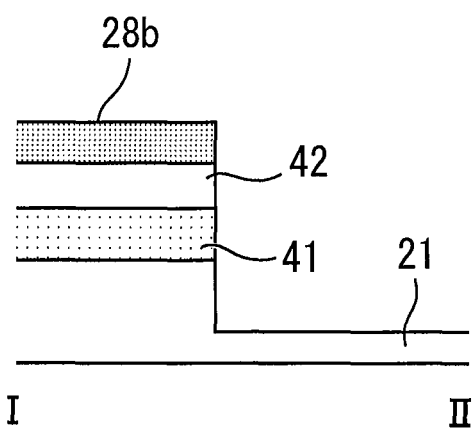
FIG. 23 is a cross-sectional view obtained by cutting FIG. 22 along a line I-II.

The semiconductor layers constituting the waveguides 13a, 13b, and 13c are etched. FIG. 22 is a plan view showing a state in which the semiconductor layers constituting the waveguides 13a, 13b, and 13c in the first embodiment have been etched. FIG. 23 is a cross-sectional view obtained by cutting FIG. 22 along a line I-II. Here, an insulating film 28b is formed on the cladding layers 27, 30 and 42. The insulating film 28b is provided in the laser forming portion 10a, the modulator forming portion 11a and a region where the waveguides 13a, 13b, and 13c are formed. Next, the transparent waveguide layer 41 and the cladding layer 42 are etched by using the insulating film 28b as a mask.

Figure 24:
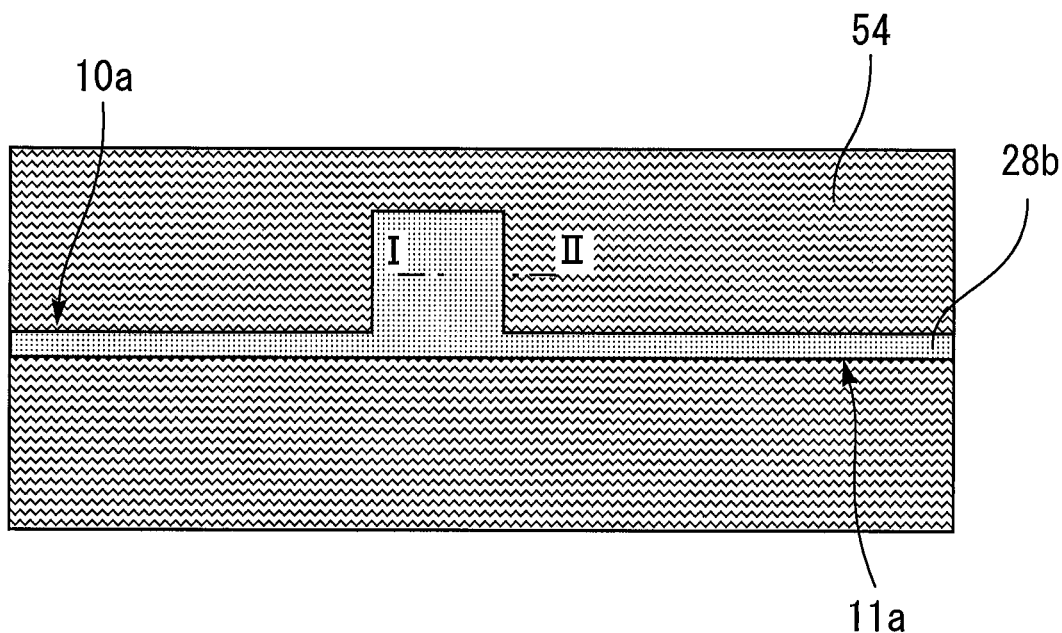
FIG. 24 is a plan view showing a state in which the semiconductor layers constituting the photodiode and the semi-insulating semiconductor layer in the first embodiment have been grown.
Figure 25:
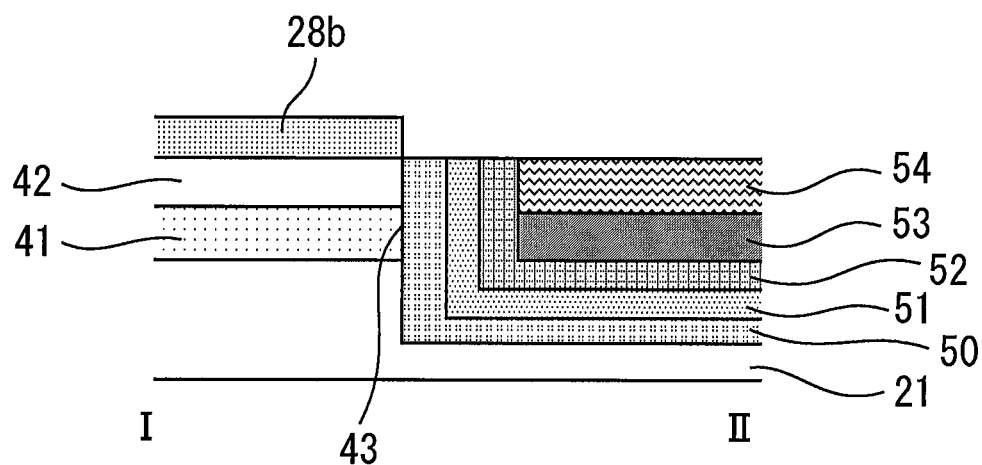
FIG. 25 is a cross-sectional view obtained by cutting FIG. 24 along a line I-II.

Next, semiconductor layers constituting the photodiode 12 and the semi-insulating semiconductor layer 50 are formed. The semiconductor layers constituting the photodiode 12 are a contact layer 51, a cladding layer 52, a light absorption layer 53 and a cladding layer 54. FIG. 24 is a plan view showing a state in which the semiconductor layers constituting the photodiode 12 and the semi-insulating semiconductor layer 50 in the first embodiment have been grown. FIG. 25 is a cross-sectional view obtained by cutting FIG. 24 along a line I-II.

The semi-insulating semiconductor layer 50, the contact layer 51, the cladding layer 52, the light absorption layer 53, and the cladding layer 54 are formed by selective growth using the insulating film 28b as a mask. The semi-insulating semiconductor layer 50, the contact layer 51, the cladding layer 52, the light absorption layer 53, and the cladding layer 54 are formed so as to surround a portion covered with the insulating film 28b.

Note that as shown in FIG. 25, the semi-insulating semiconductor layer 50 is formed not only on the upper surface of the conductive substrate 21, but also on a side surface of the semiconductor layer constituting the waveguide 13c which is formed by etching. The side surface of the semiconductor layer constituting the waveguide 13c formed by etching includes the end face 43. Since the semi-insulating semiconductor layer 50, the contact layer 51, and the cladding layer 52 are also provided on the side surface of the waveguide 13c, they are exposed onto the surface of the semiconductor layers constituting the photodiode 12. In FIG. 24, the portions of the semi-insulating semiconductor layer 50, the contact layer 51, and the cladding layer 52 exposed onto the surface are omitted for convenience.

Figure 26:
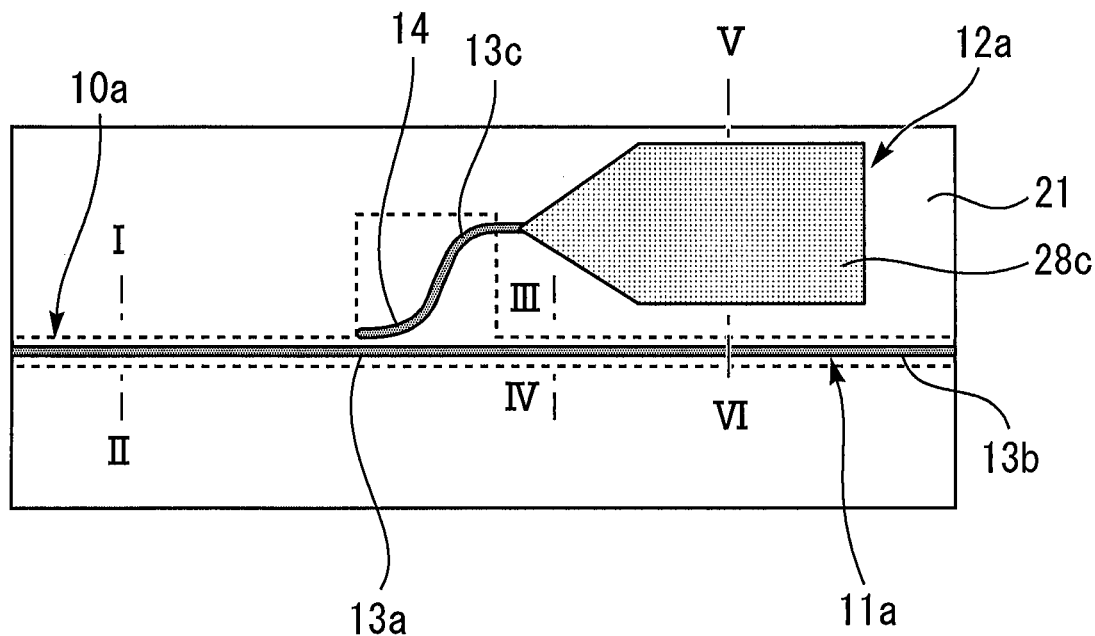
FIG. 26 is a plan view showing a state in which the semiconductor layers constituting the photodiode in the first embodiment have been etched.
Figure 27:
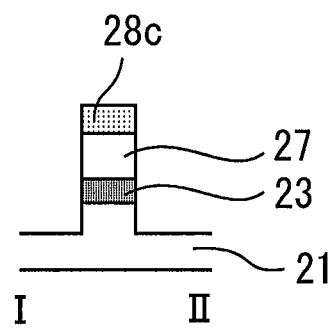
FIG. 27 is a cross-sectional view obtained by cutting FIG. 26 along a line I-II.
Figure 28:
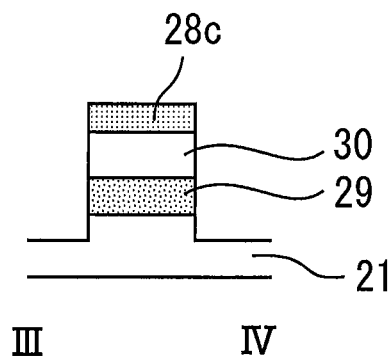
FIG. 28 is a cross-sectional view obtained by cutting FIG. 26 along a line III-IV.
Figure 29:
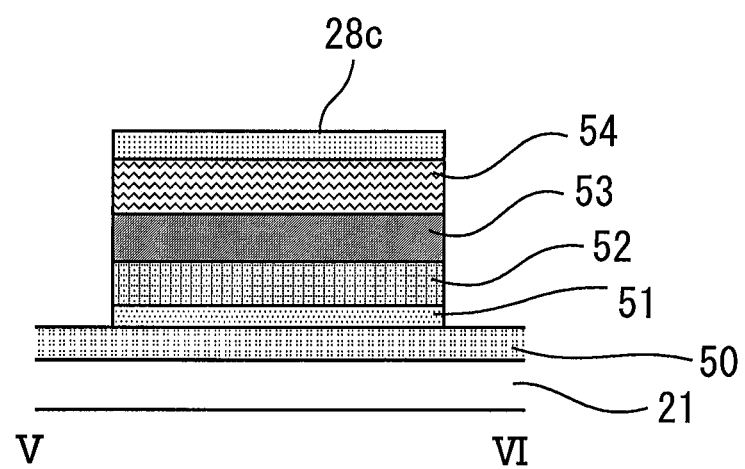
FIG. 29 is a cross-sectional view obtained by cutting FIG. 26 along a line V-VI.

Next, the semiconductor layers constituting the photodiode 12 are etched. FIG. 26 is a plan view showing a state in which the semiconductor layers constituting the photodiode 12 in the first embodiment have been etched. FIG. 27 is a cross-sectional view obtained by cutting FIG. 26 along a line I-II. FIG. 28 is a cross-sectional view obtained by cutting FIG. 26 along a line III-IV. FIG. 29 is a cross-sectional view obtained by cutting FIG. 26 along a line V-VI.

First, an insulating film 28c is formed on the cladding layers 27, 30, 42 and 54. The insulating film 28c is provided in the laser forming portion 10a, the modulator forming portion 11a, a region where the waveguides 13a, 13b, and 13c are formed and a photodiode forming portion 12a. The photodiode forming portion 12a indicates a region on the conductive substrate 21 in which the photodiode 12 is formed. Next, dry etching is performed halfway through the semi-insulating semiconductor layer 50 by using the insulating film 28c as a mask.

As a result, the waveguides 13a, 13b and 13c having a ridge structure are formed. The directional coupler 14 is formed between the laser forming portion 10a and the modulator forming portion 11a. The directional coupler 14 is a part of the waveguide 13c.

Figure 30:
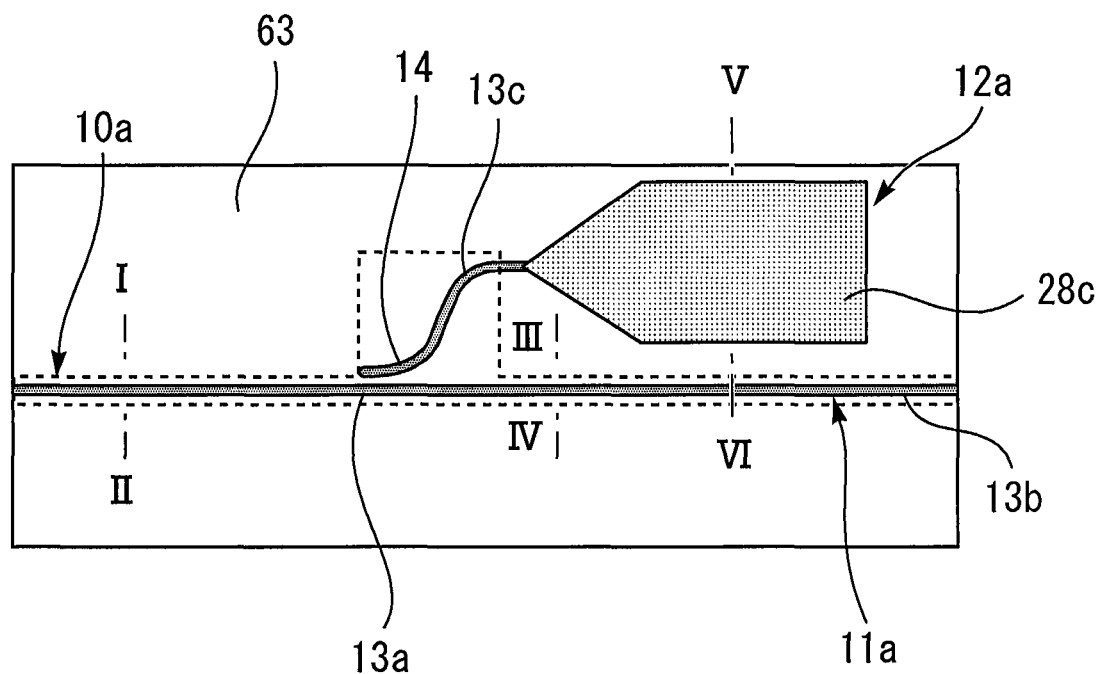
FIG. 30 is a plan view showing a state in which the buried growth has been performed in the first embodiment.
Figure 31:
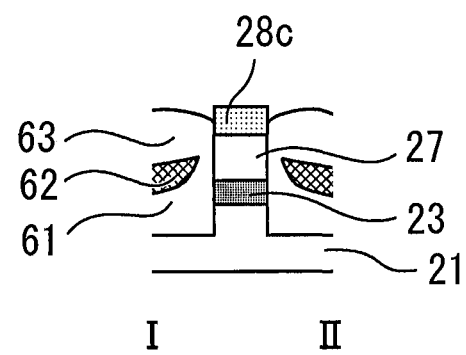
FIG. 31 is a cross-sectional view obtained by cutting FIG. 30 along a line I-II.

Next, buried growth is performed. FIG. 30 is a plan view showing a state in which the buried growth has been performed in the first embodiment. FIG. 31 is a cross-sectional view obtained by cutting FIG. 30 along a line I-II.

Figure 32:
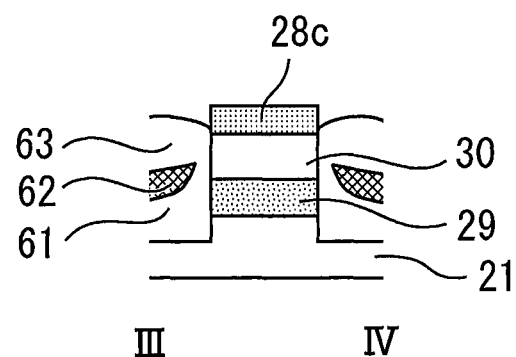
FIG. 32 is a cross-sectional view obtained by cutting FIG. 30 along a line III-IV.
Figure 33:
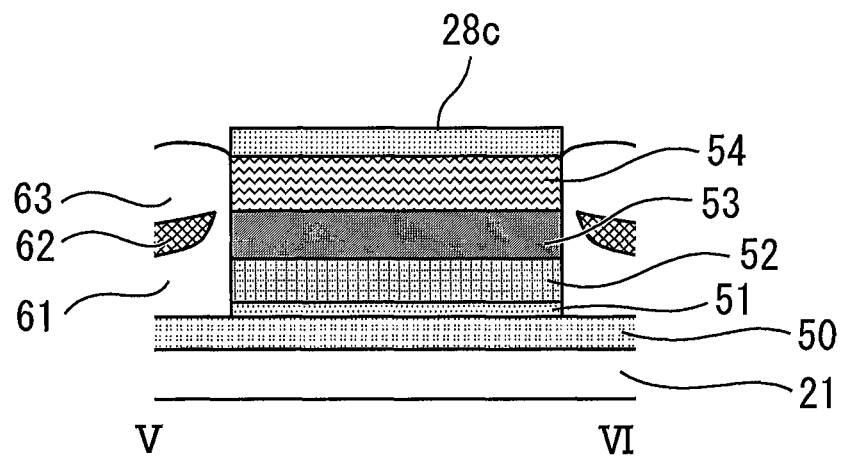
FIG. 33 is a cross-sectional view obtained by cutting FIG. 30 along a line V-VI.

FIG. 32 is a cross-sectional view obtained by cutting FIG. 30 along a line III-IV. FIG. 33 is a cross-sectional view obtained by cutting FIG. 30 along a line V-VI.

Here, a buried growth layer including a p-InP layer 61, an n-InP layer 62, and a p-InP layer 63 is formed. The buried growth layer is provided so as to surround the laser forming portion 10a, the modulator forming portion 11a, the waveguides 13a, 13b, and 13c, and the photodiode forming portion 12a. The side surfaces of the waveguides 13a, 13b, and 13c are covered with the buried growth layer. The side surfaces of the semiconductor layers constituting the laser 10, the semiconductor layers constituting the modulator 11, and the semiconductor layers constituting the photodiode 12 are covered with the buried growth layer. The buried growth layer is formed by buried growth.

Figure 34:
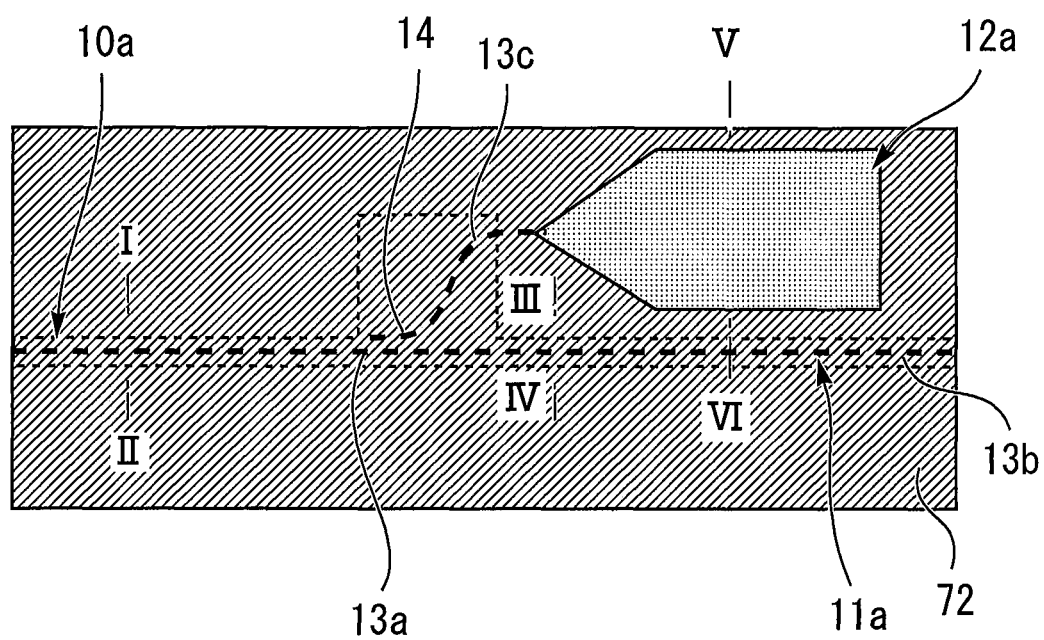
FIG. 34 is a plan view showing a state in which the contact layer has been grown in the first embodiment.
Figure 35:
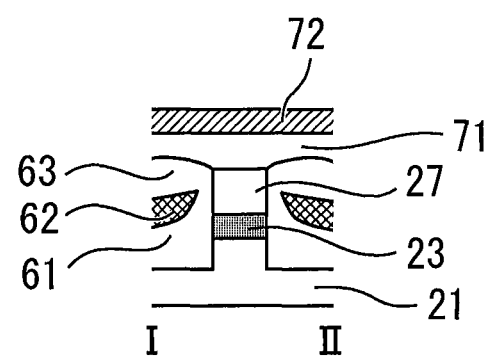
FIG. 35 is a cross-sectional view obtained by cutting FIG. 34 along a line I-II.
Figure 36:
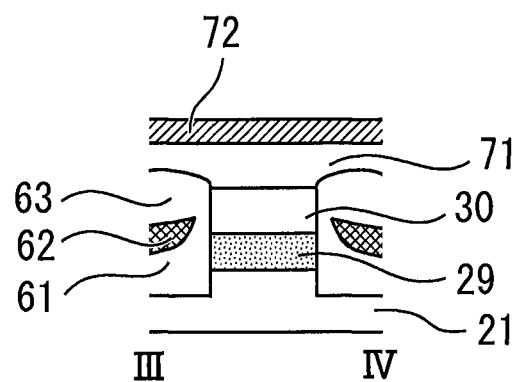
FIG. 36 is a cross-sectional view obtained by cutting FIG. 34 along a line III-IV.
Figure 37:
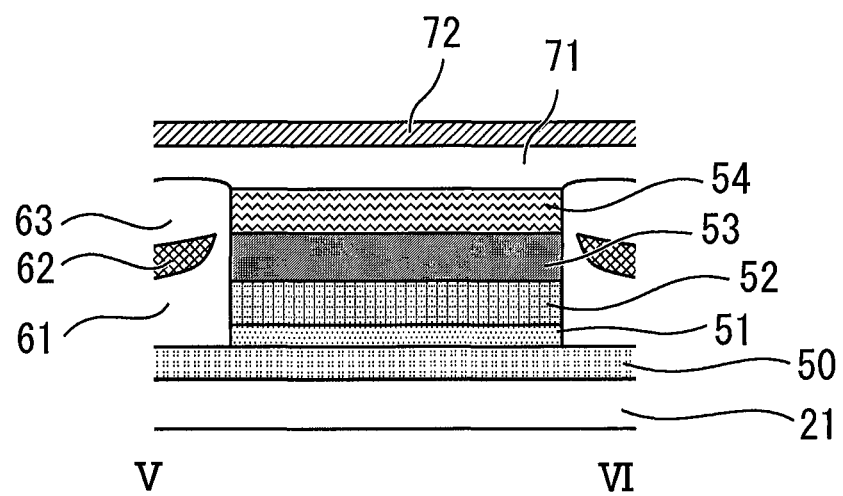
FIG. 37 is a cross-sectional view obtained by cutting FIG. 34 along a line V-VI.

Next, a contact layer is formed. The contact layer includes a cladding layer 71 and a p-InGaAs layer 72. FIG. 34 is a plan view showing a state in which the contact layer has been grown in the first embodiment. FIG. 35 is a cross-sectional view obtained by cutting FIG. 34 along a line I-II. FIG. 36 is a cross-sectional view obtained by cutting FIG. 34 along a line III-IV. FIG. 37 is a cross-sectional view obtained by cutting FIG. 34 along a line V-VI.

First, the insulating film 28c is removed. Next, a contact layer is grown on the entire surface of the conductive substrate 21 by crystal growth. Note that the positions of the laser forming portion 10a, the modulator forming portion 11a, the waveguides 13a, 13b, 13c, and the photodiode forming portion 12a are shown for convenience in FIG. 34.

Figure 38:
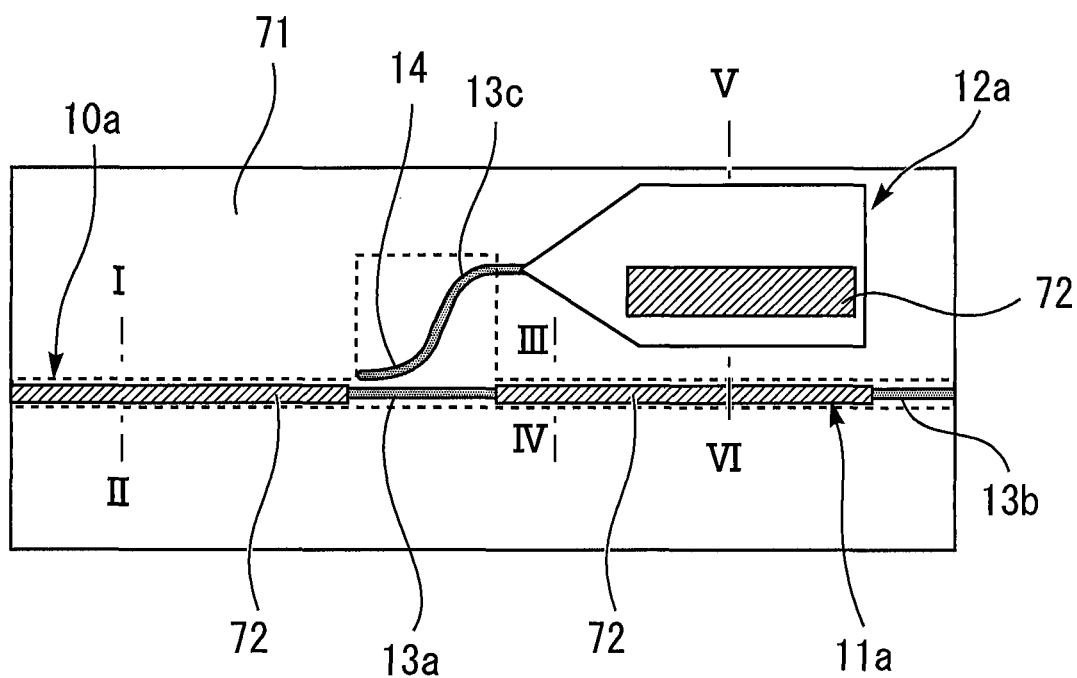
FIG. 38 is a plan view showing a state where the contact layer has been etched in the first embodiment.
Figure 39:
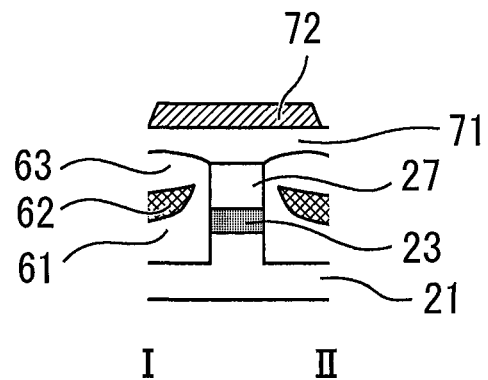
FIG. 39 is a cross-sectional view obtained by cutting FIG. 38 along a line I-II.
Figure 40:
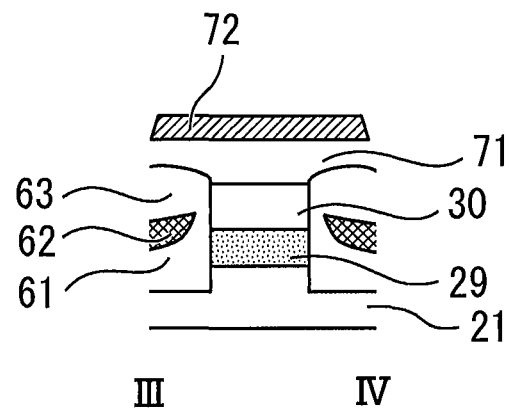
FIG. 40 is a cross-sectional view obtained by cutting FIG. 38 along a line III-IV.
Figure 41:
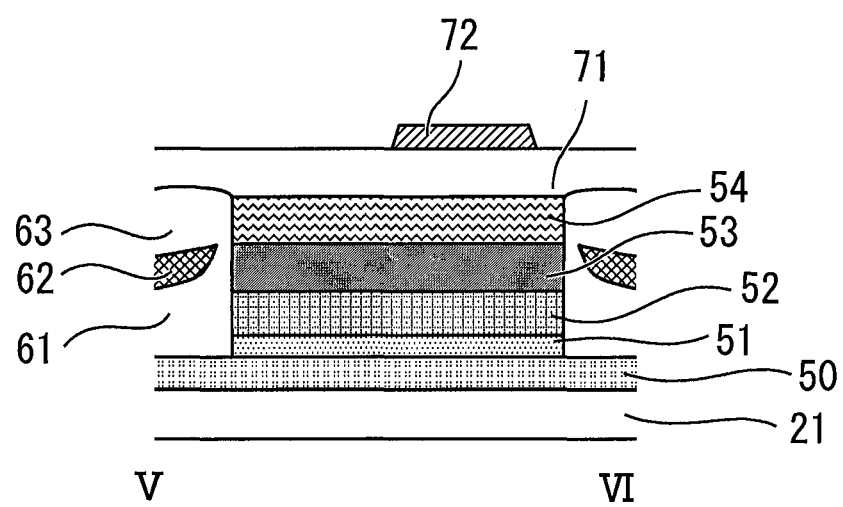
FIG. 41 is a cross-sectional view obtained by cutting FIG. 38 along a line V-VI.

Next, the contact layer is etched. FIG. 38 is a plan view showing a state where the contact layer has been etched in the first embodiment. FIG. 39 is a cross-sectional view obtained by cutting FIG. 38 along a line I-II. FIG. 40 is a cross-sectional view obtained by cutting FIG. 38 along a line III-IV. FIG. 41 is a cross-sectional view obtained by cutting FIG. 38 along a line V-VI.

Here, the p-InGaAs layer 72 is etched so as to leave a portion of the p-InGaAs layer 72 which is positioned just below the electrode. As a result, the p-InGaAs layer 72 is left on the laser forming portion 10a, the modulator forming portion 10b, and the photodiode forming portion 12a. The p-InGaAs layer 72 on the photodiode forming portion 12a is provided at a position corresponding to the anode 87a. Note that the positions of the laser forming portion 10a, the modulator forming portion 11a, the photodiode forming portion 12a, and the waveguides 13a, 13b, and 13c are shown for convenience in FIG. 38.

Figure 42:
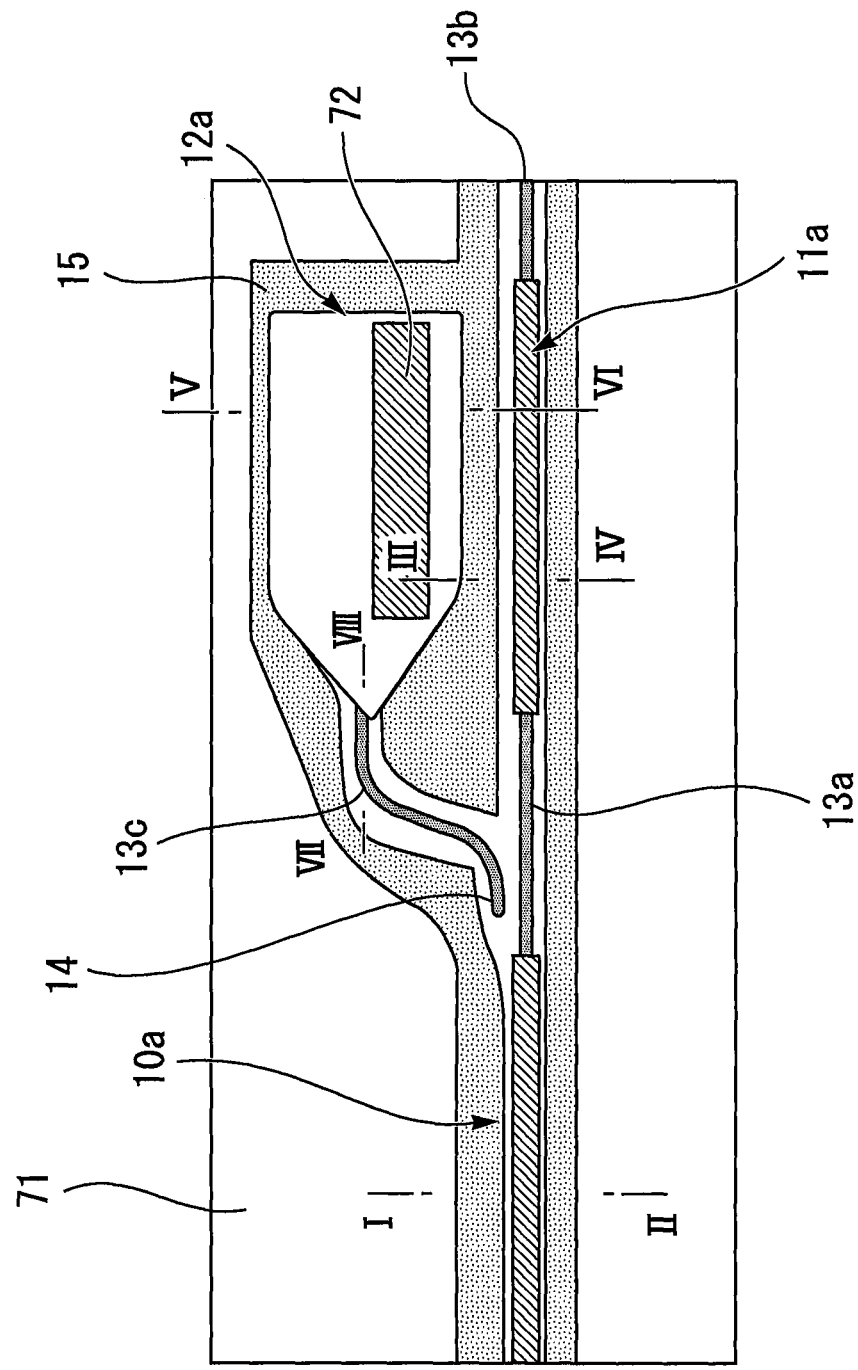
FIG. 42 is a plan view showing a state in which a mesa has been formed in the first embodiment.
Figure 43:
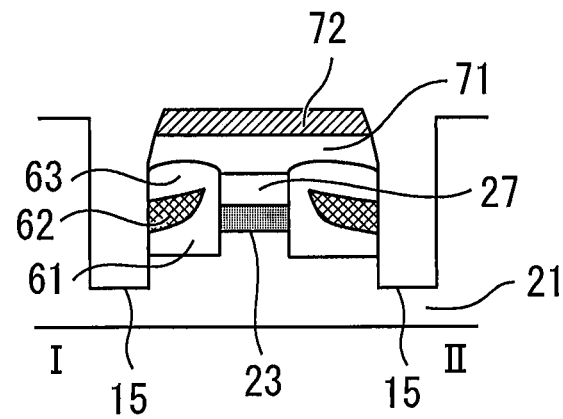
FIG. 43 is a cross-sectional view obtained by cutting FIG. 42 along a line I-II.
Figure 44:
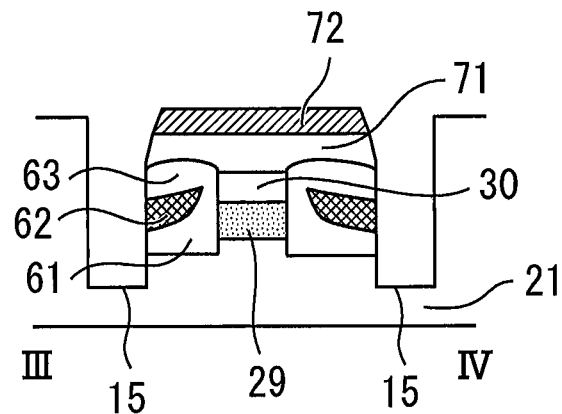
FIG. 44 is a cross-sectional view obtained by cutting FIG. 42 along a line III-IV.
Figure 45:
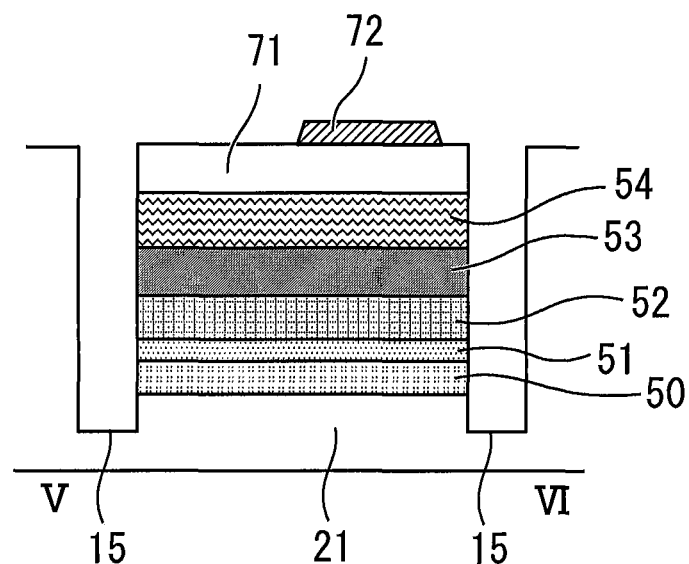
FIG. 45 is a cross-sectional view obtained by cutting FIG. 42 along a line V-VI.
Figure 46:
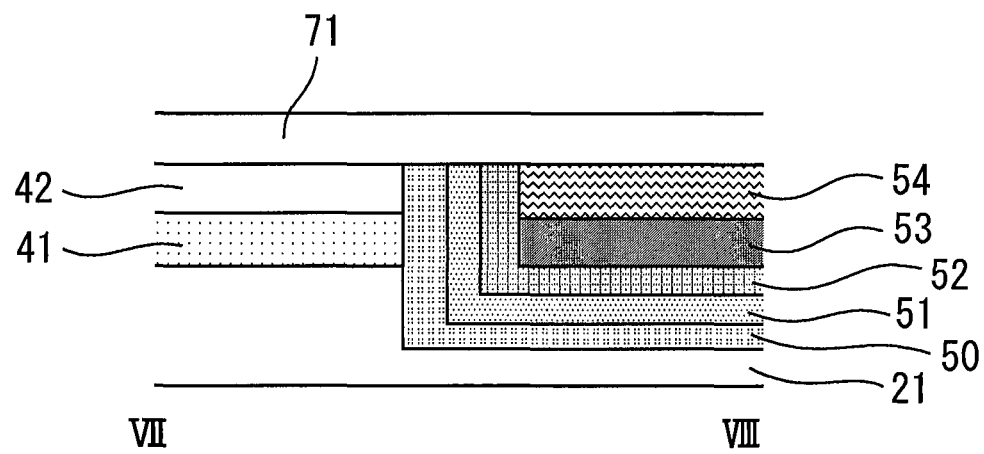
FIG. 46 is a cross-sectional view obtained by cutting FIG. 42 along a line VII-VIII.

Next, a mesa is formed. FIG. 42 is a plan view showing a state in which a mesa has been formed in the first embodiment. FIG. 43 is a cross-sectional view obtained by cutting FIG. 42 along a line I-II. FIG. 44 is a cross-sectional view obtained by cutting FIG. 42 along a line III-IV. FIG. 45 is a cross-sectional view obtained by cutting FIG. 42 along a line V-VI. FIG. 46 is a cross-sectional view obtained by cutting FIG. 42 along a line VII-VIII.

Here, trenches 15 are formed on both sides of the laser forming portion 10a, both sides of the modulator forming portion 11a, and both sides of the waveguides 13a, 13b, and 13c. Further, the trenches 15 are formed so as to surround the photodiode forming portion 12a except for a connection portion with the waveguide 13c. The trenches 15 are formed by etching. The etching is performed until a depth by which the semi-insulating semiconductor layer 50 is removed. As a result, a mesa structure is formed in the laser forming portion 10a, the modulator forming portion 11a, the waveguides 13a, 13b, and 13c, and the photodiode forming portion 12a.

Figure 47:
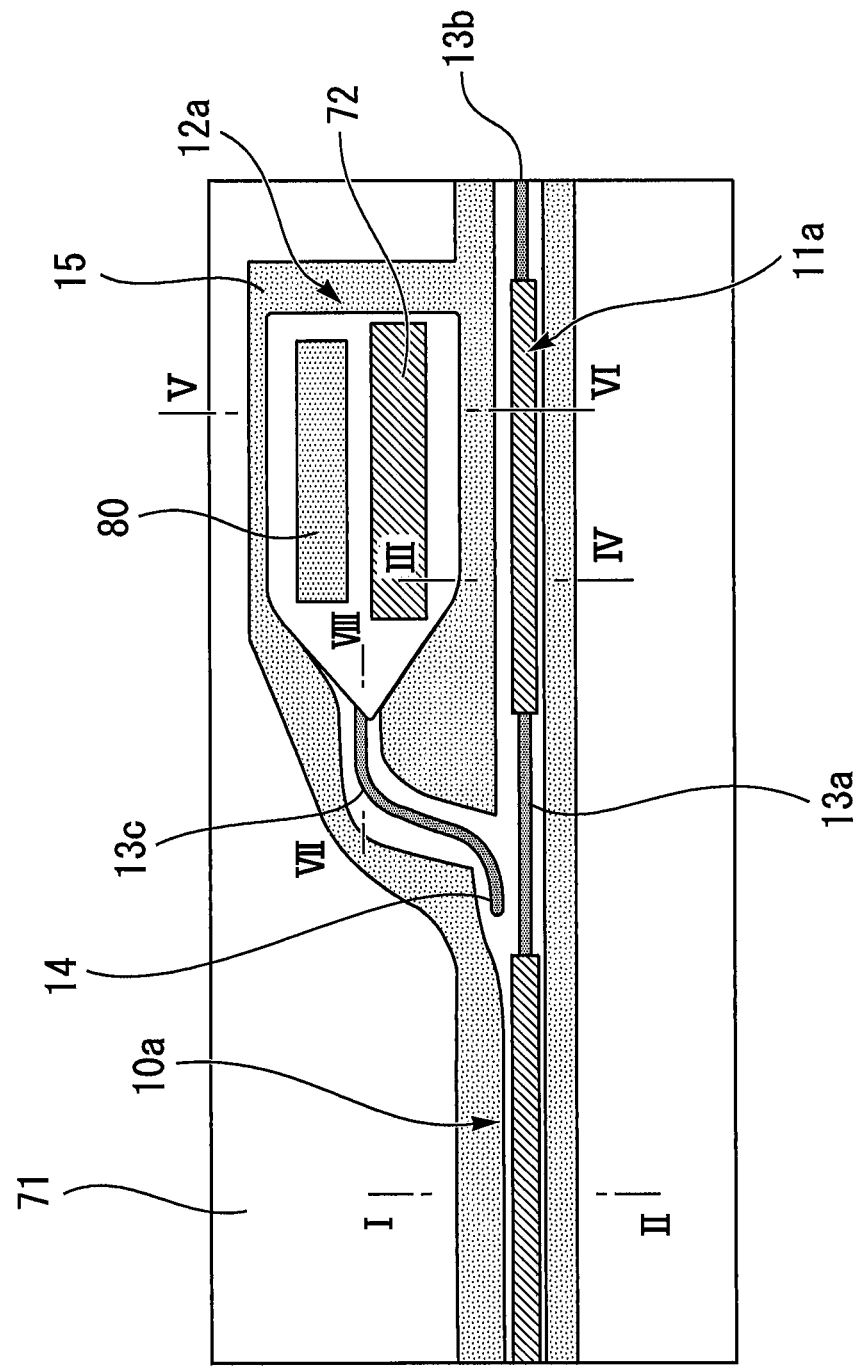
FIG. 47 is a plan view showing a state in which the contact hole has been formed in the photodiode forming portion in the first embodiment.
Figure 48:
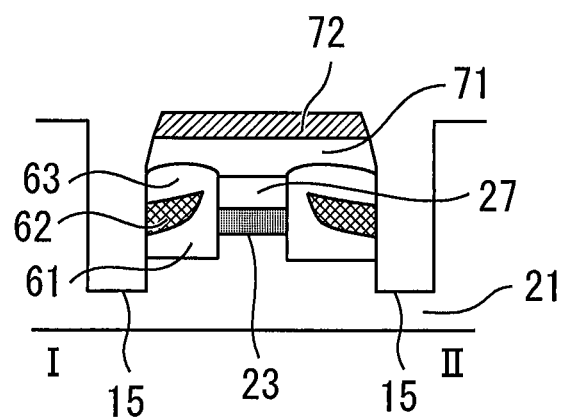
FIG. 48 is a cross-sectional view obtained by cutting FIG. 47 along a line I-II.
Figure 49:
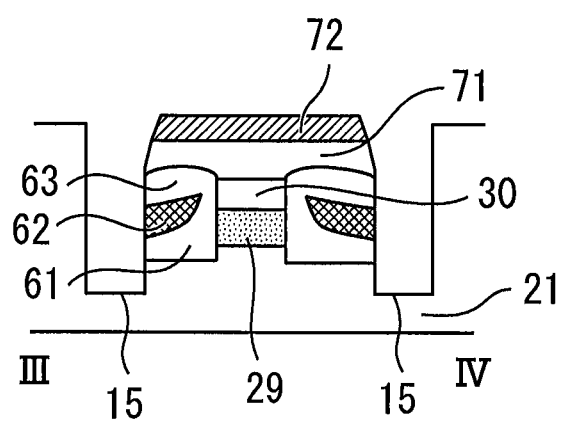
FIG. 49 is a cross-sectional view obtained by cutting FIG. 47 along a line III-IV.
Figure 50:
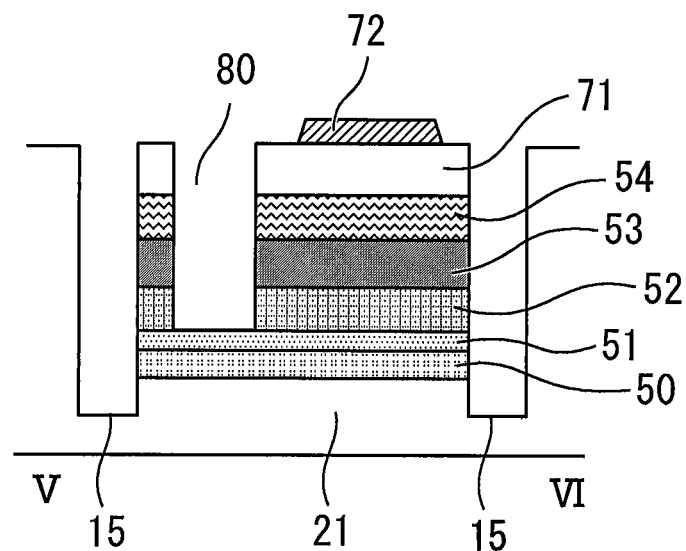
FIG. 50 is a cross-sectional view obtained by cutting FIG. 47 along a line V-VI.
Figure 51:
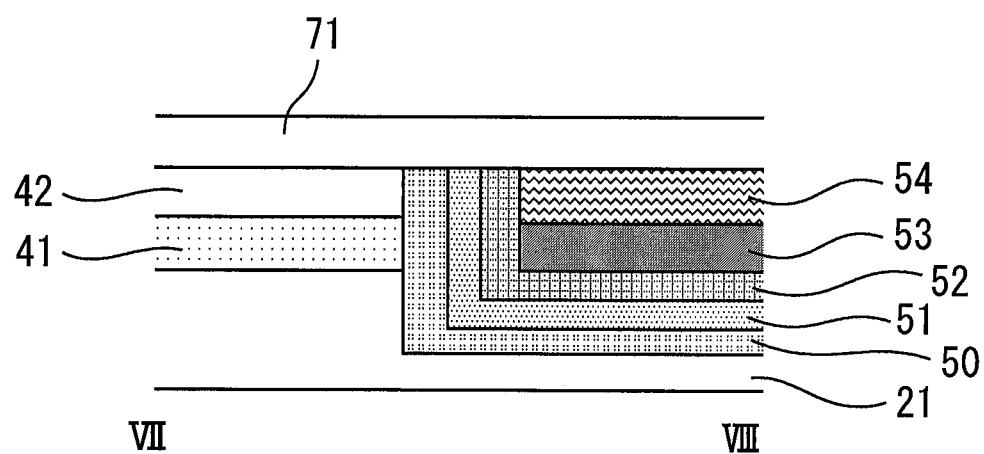
FIG. 51 is a cross-sectional view obtained by cutting FIG. 47 along a line VII-VIII.

Next, a contact hole 80 is formed. FIG. 47 is a plan view showing a state in which the contact hole 80 has been formed in the photodiode forming portion 12a in the first embodiment. FIG. 48 is a cross-sectional view obtained by cutting FIG. 47 along a line I-II. FIG. 49 is a cross-sectional view obtained by cutting FIG. 47 along a line III-IV. FIG. 50 is a cross-sectional view obtained by cutting FIG. 47 along a line V-VI. FIG. 51 is a cross-sectional view obtained by cutting FIG. 47 along a line VII-VIII.

Here, the contact hole 80 is provided next to the p-InGaAs layer 72 of the photodiode forming portion 12a. The contact hole 80 extends in parallel with the p-InGaAs layer 72 in a plan view. The longitudinal directions of the contact hole 80 and the p-InGaAs layer 72 of the photodiode forming portion 12a extend in a light incident direction to the photodiode 12 in a plan view. The contact hole 80 is provided to form an n-type electrode that becomes the cathode 87b of the photodiode 12. The contact hole 80 is formed from the upper surface of the cladding layer 71 until a depth at which the contact hole 80 reaches the contact layer 51.

Next, an insulating film 81 is formed on the entire surface of the conductive substrate 21. The insulating film 81 covers the side surfaces and bottom surfaces of the trenches 15 and the side surface and bottom surface of the contact hole 80.

Figure 52:
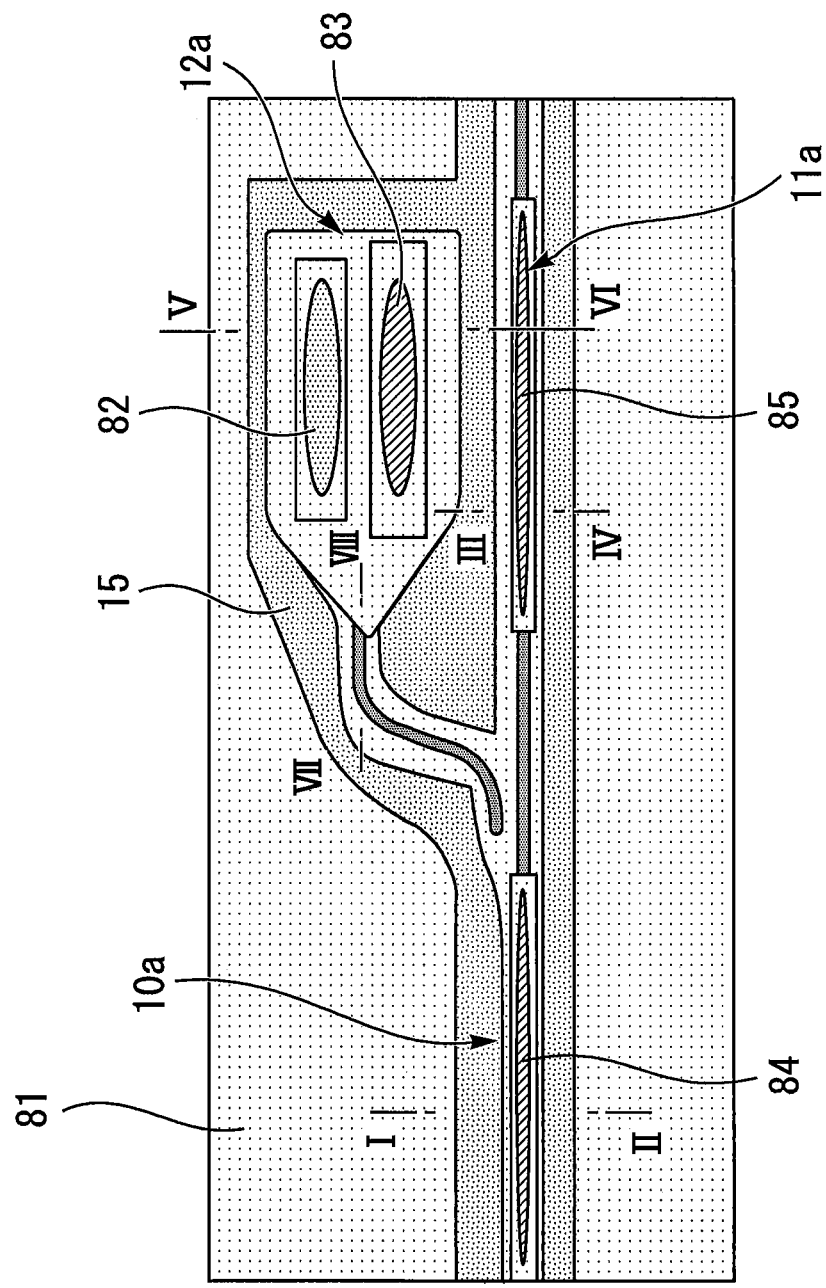
FIG. 52 is a plan view showing a state in which the openings have been formed in the insulating film in the first embodiment.
Figure 53:
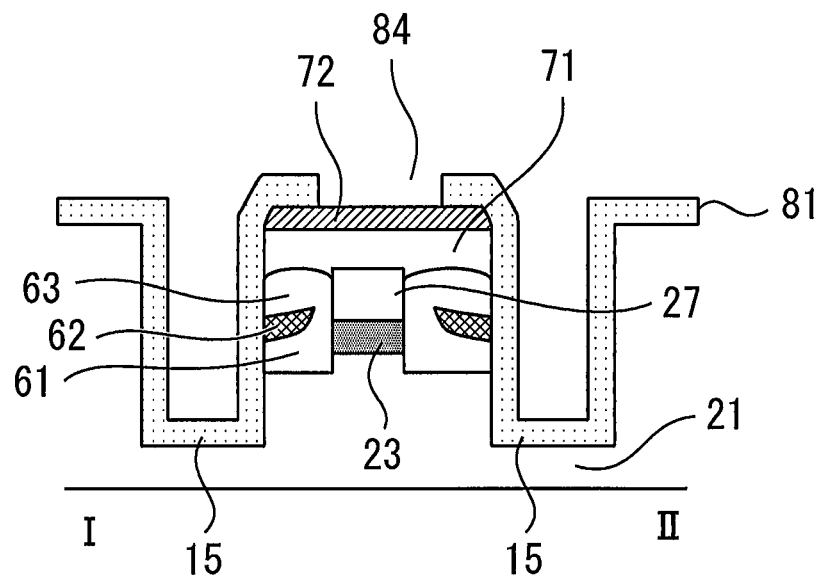
FIG. 53 is a cross-sectional view obtained by cutting FIG. 52 along a line I-II.
Figure 54:
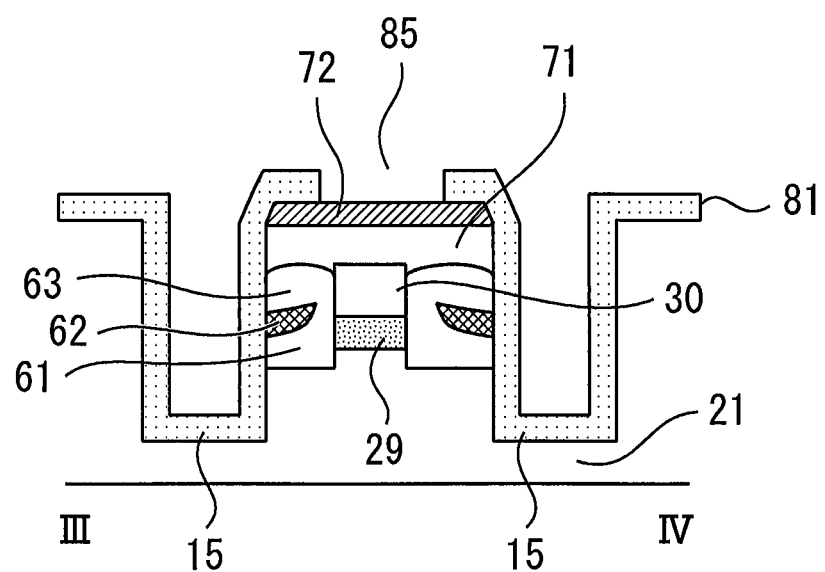
FIG. 54 is a cross-sectional view obtained by cutting FIG. 52 along a line III-IV.
Figure 55:
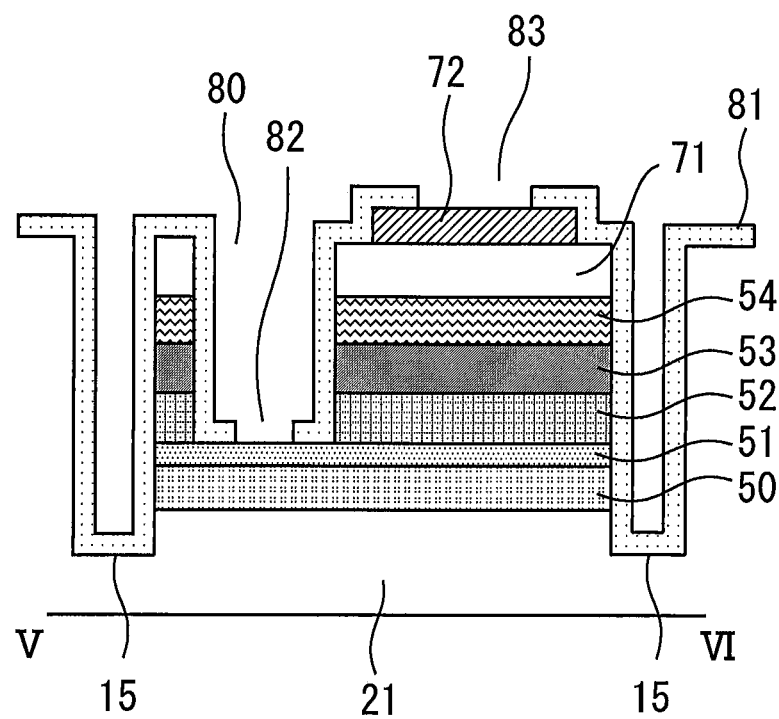
FIG. 55 is a cross-sectional view obtained by cutting FIG. 52 along a line V-VI.
Figure 56:
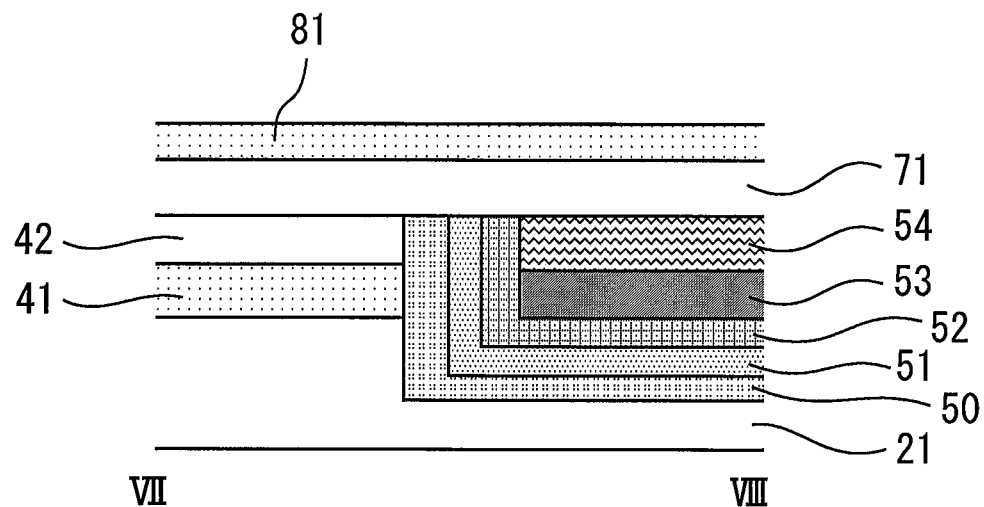
FIG. 56 is a cross-sectional view obtained by cutting FIG. 52 along a line VII-VIII.

Next, openings 82 to 85 are formed in the insulating film 81. FIG. 52 is a plan view showing a state in which the openings 82 to 85 have been formed in the insulating film 81 in the first embodiment. FIG. 53 is a cross-sectional view obtained by cutting FIG. 52 along a line I-II. FIG. 54 is a cross-sectional view obtained by cutting FIG. 52 along a line III-IV. FIG. 55 is a cross-sectional view obtained by cutting FIG. 52 along a line V-VI. FIG. 56 is a cross-sectional view obtained by cutting FIG. 52 along a line VII-VIII.

The openings 82 to 85 are formed at positions just below the electrode 87. The opening 82 is formed on the bottom surface of the contact hole 80 so as to expose the contact layer 51. The opening 83 is formed so as to expose the p-InGaAs layer 72 in the photodiode forming portion 12a. The opening 84 is formed so as to expose the p-InGaAs layer 72 in the laser forming portion 10a. The opening 85 is formed so as to expose the p-InGaAs layer 72 in the modulator forming portion 11a.

Next, an electrode 87 is formed on the insulating film 81. As shown in FIGS. 1 to 5, the electrode 87 is provided so as to fill the opening 84 in the laser forming portion 10a and contact the p-InGaAs layer 72. The electrode 87 on the laser forming portion 10a extends along the trenches 15, and extends to the opposite side of the laser forming portion 10a with respect to the trenches 15. In addition, the electrode 87 is provided so as to fill the opening 85 in the modulator forming portion 11a and contact the p-InGaAs layer 72.

The anode 87a is provided so as to fill the opening 83 in the photodiode forming portion 12a and contact the p-InGaAs layer 72. The cathode 87b is provided so as to fill the opening 82 in the photodiode forming portion 12a and contact the contact layer 51. The cathode 87b extends upward along the side surface of the contact hole 80. The cathode 87b is drawn to the opposite side to the anode 87a with respect to the contact hole 80 on the upper surface side of the photodiode 12. The anode 87a and the cathode 87b are made of the same material.

Next, a back surface step is executed. First, the back surface side of the conductive substrate 21 is polished until the thickness of the conductive substrate 21 is equal to about 100 μm. In this step, the entire back surface of the wafer is polished. Next, as shown in FIG. 2, the electrode 90 is formed on the back surface of the conductive substrate 21. From the foregoing steps, the semiconductor optical integrated device 100 shown in FIGS. 1 to 5 is formed. In FIGS. 1 to 5, the cap layer 26, the diffraction grating layer 25, the cladding layer 24, the cladding layer 22, the buried growth layer, and the like are omitted for convenience.

Figure 57:
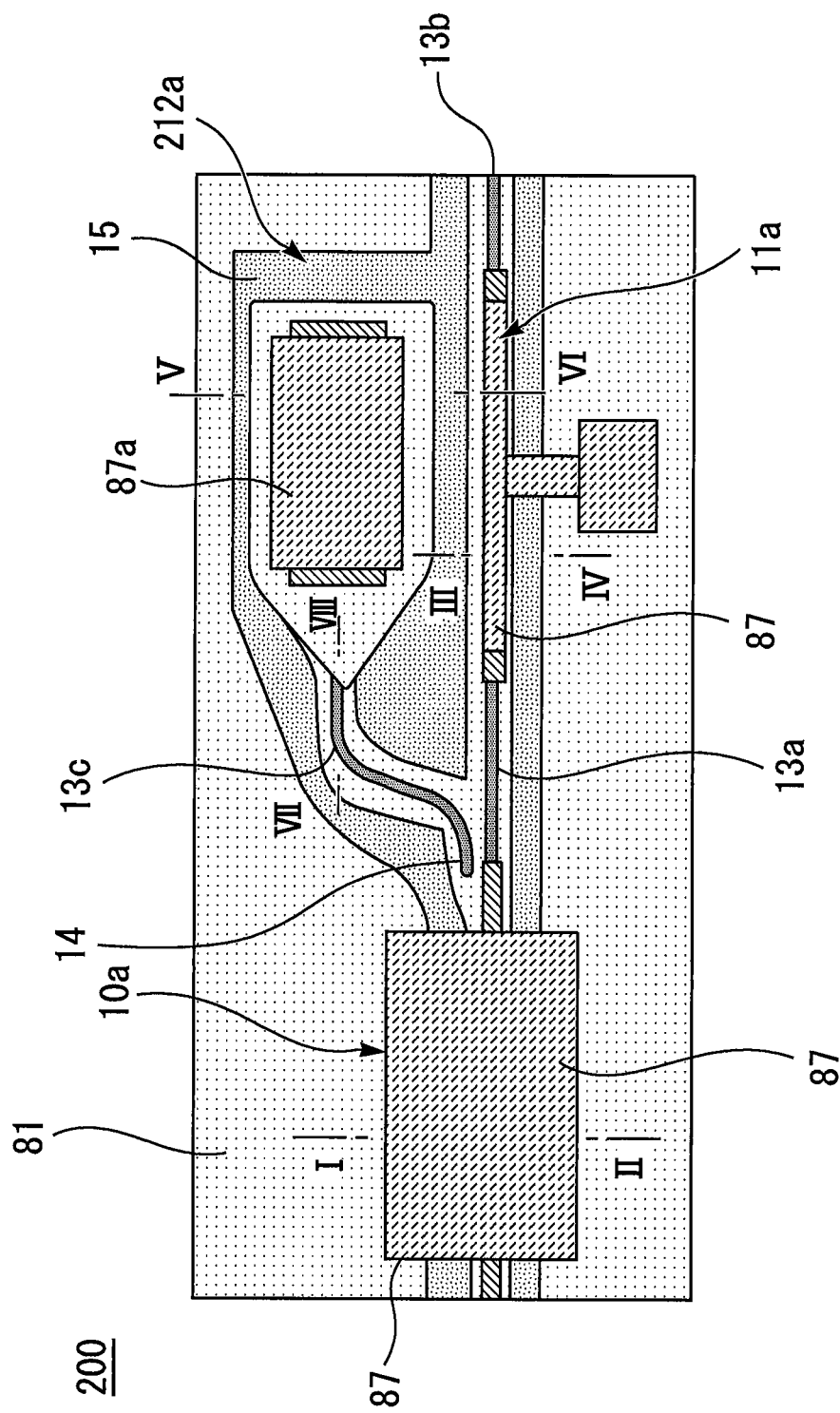
FIG. 57 is a plan view of a semiconductor optical integrated device according to a comparative example.

Next, a comparative example of the present embodiment will be described. FIG. 57 is a plan view of a semiconductor optical integrated device 200 according to a comparative example. In the semiconductor optical integrated device 200 according to the comparative example, the structure of a photodiode 212 is different from that of the photodiode 12 according to the first embodiment. Only the anode 87a is provided on the upper surface side of the photodiode 212.

Figure 58:
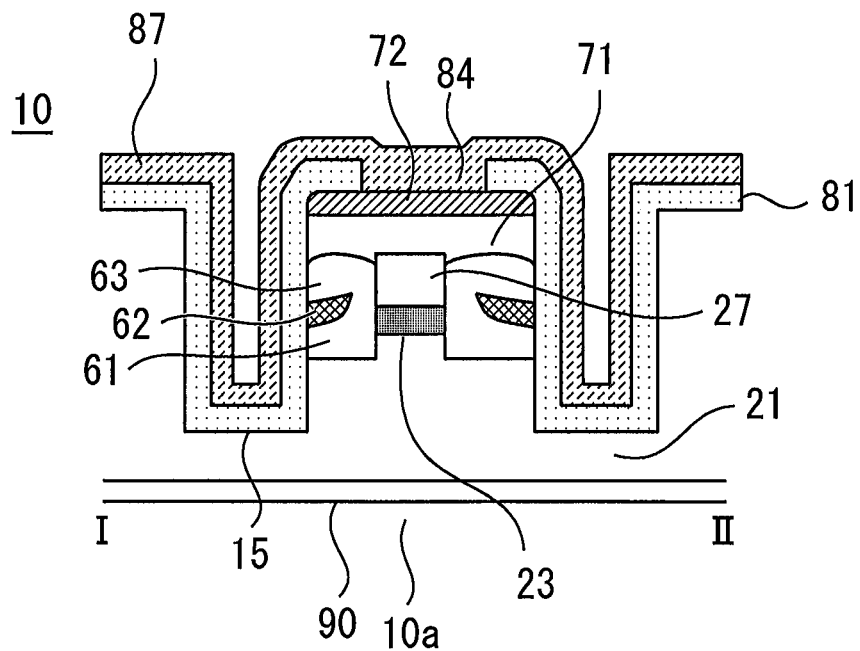
FIG. 58 is a cross-sectional view obtained by cutting the semiconductor optical integrated device of FIG. 57 along a line I-II.
Figure 59:
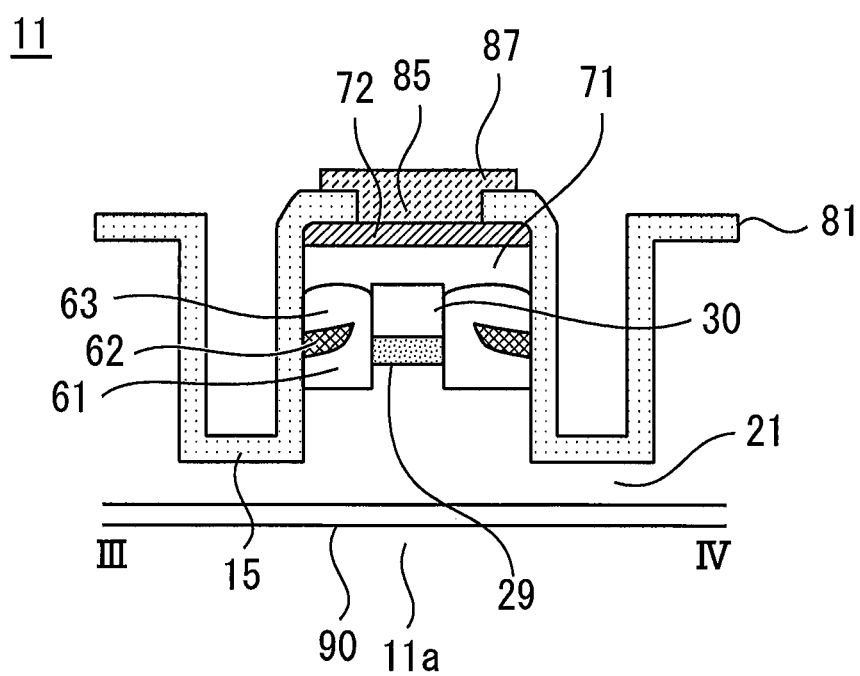
FIG. 59 is a cross-sectional view obtained by cutting the semiconductor optical integrated device of FIG. 57 along a line III-IV.

FIG. 58 is a cross-sectional view obtained by cutting the semiconductor optical integrated device 200 of FIG. 57 along a line I-II. In the semiconductor optical integrated device 200, the structure of the laser 10 is the same as that of the first embodiment. FIG. 59 is a cross-sectional view obtained by cutting the semiconductor optical integrated device 200 of FIG. 57 along a line III-IV. In the semiconductor optical integrated device 200, the structure of the modulator 11 is the same as that of the first embodiment.

Figure 60:
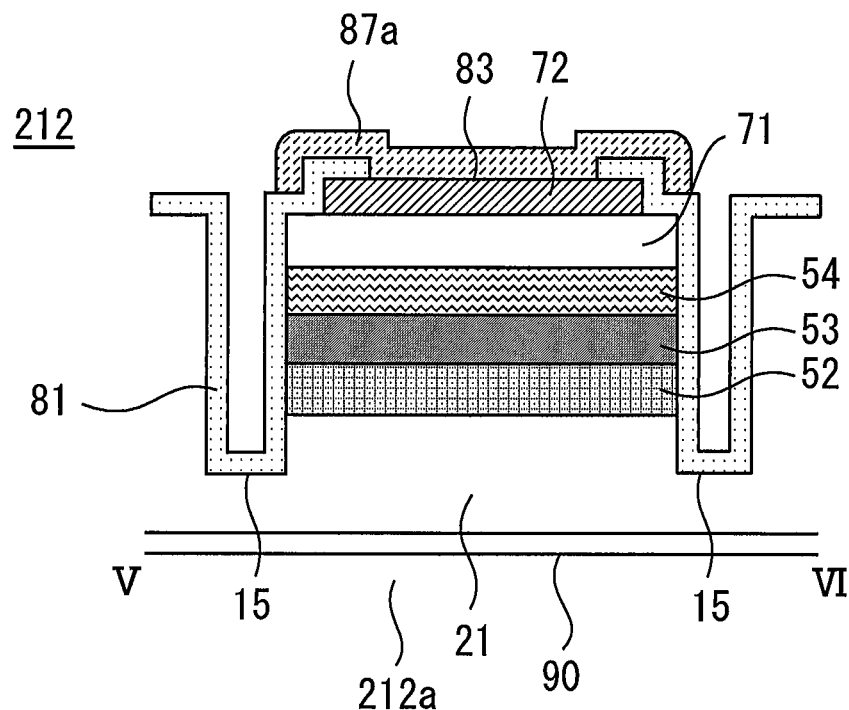
FIG. 60 is a cross-sectional view obtained by cutting the semiconductor optical integrated device of FIG. 57 along a line V-VI.

FIG. 60 is a cross-sectional view obtained by cutting the semiconductor optical integrated device 200 of FIG. 57 along a line V-VI. FIG. 60 is a cross-sectional view of the photodiode 212. The semiconductor optical integrated device 200 according to the comparative example does not include the semi-insulating semiconductor layer 50. The photodiode 212 is directly provided on a conductive substrate 21.

The cladding layer 52, the light absorption layer 53, and the cladding layer 54 are provided in this order from the bottom on the conductive substrate 21. The cladding layer 71 and the p-InGaAs layer 72 are provided in this order from the bottom on the cladding layer 54. The contact hole 80 is not provided in the photodiode 212.

The insulating film 81 is provided on the cladding layer 71 and the p-InGaAs layer 72. The insulating film 81 extends along trenches 15. The insulating film 81 is provided with an opening 83 for exposing the p-InGaAs layer 72. The opening 82 is not provided in the insulating film 81. The anode 87a is provided on the insulating film 81. The anode 87a fills the opening 83 and contacts the p-InGaAs layer 72. The cathode of the photodiode 212 is the electrode 90 provided on the back surface of the conductive substrate 21.

In the semiconductor optical integrated device 200, the cathode of the laser 10 and the cathode of the photodiode 212 are common to each other. The potential of the electrode 90 serving as the cathode is ground, for example.

Figure 61:
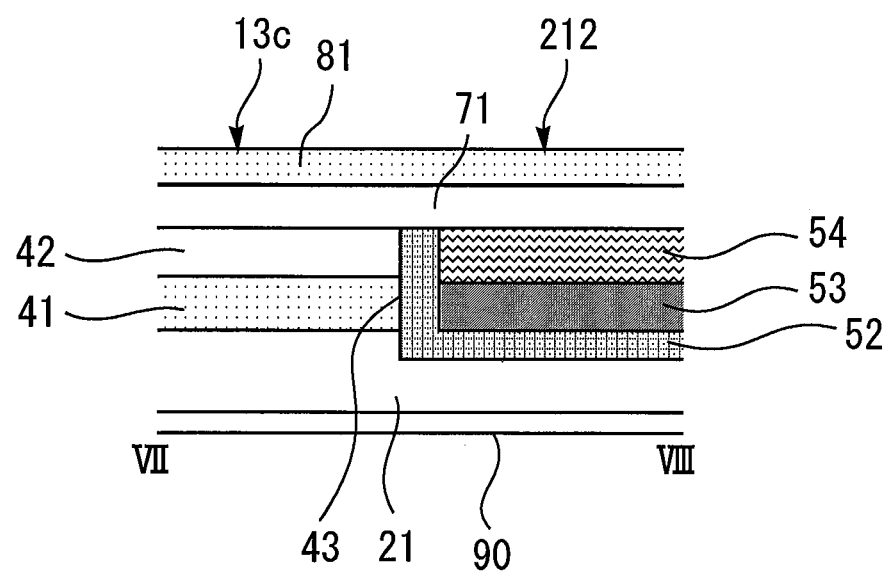
FIG. 61 is a cross-sectional view obtained by cutting the semiconductor optical integrated device of FIG. 57 along a line VII-VIII.

FIG. 61 is a cross-sectional view obtained by cutting the semiconductor optical integrated device 200 of FIG. 57 along a line VII-VIII. FIG. 61 is a cross-sectional view of a connection portion between the photodiode 212 and the waveguide 13c. The structures of the waveguides 13a, 13b, and 13c are the same as those in the first embodiment. In the comparative example, a cladding layer 52 extends along the end face 43 of the waveguide 13c. In the comparative example, the semi-insulating semiconductor layer 50 is not provided. Therefore, the waveguide 13c and the photodiode 212 are not electrically separated from each other.

Next, a method of manufacturing the semiconductor optical integrated device 200 according to the comparative example will be described. The method of manufacturing the semiconductor optical integrated device 200 is the same as that in the first embodiment until the step of etching the semiconductor layers constituting the waveguides 13a, 13b, and 13c shown in FIGS. 22 and 23. Next, semiconductor layers constituting the photodiode 212 are formed. The semiconductor layers constituting the photodiode 212 are the cladding layer 52, the light absorption layer 53, and the cladding layer 54.

Figure 62:
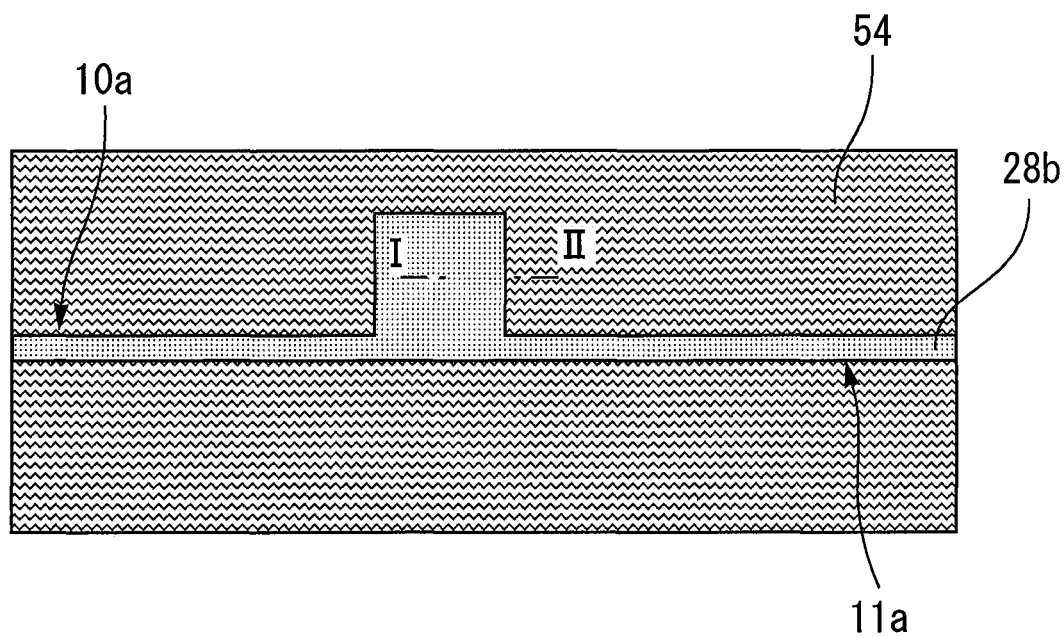
FIG. 62 is a plan view showing a state in which the semiconductor layers constituting the photodiode have been grown in the comparative example.
Figure 63:
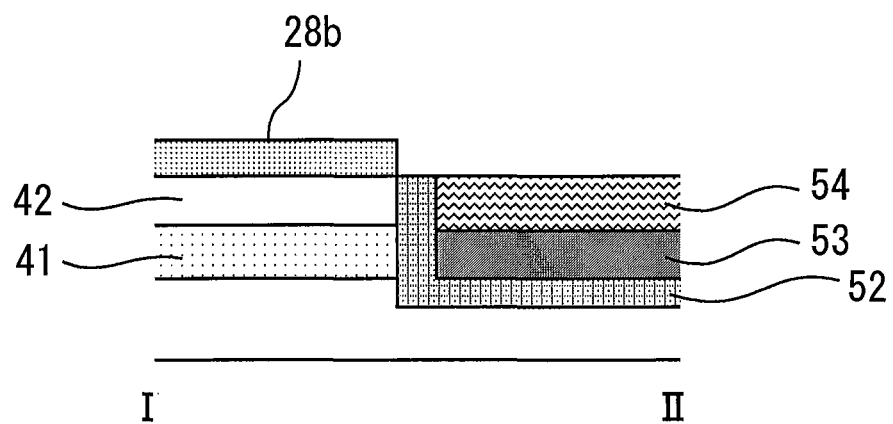
FIG. 63 is a cross-sectional view obtained by cutting FIG. 62 along a line I-II.

FIG. 62 is a plan view showing a state in which the semiconductor layers constituting the photodiode 212 have been grown in the comparative example. FIG. 63 is a cross-sectional view obtained by cutting FIG. 62 along a line I-II. The cladding layer 52, the light absorption layer 53, and the cladding layer 54 are formed by selective growth using the insulating film 28b as a mask.

Figure 64:
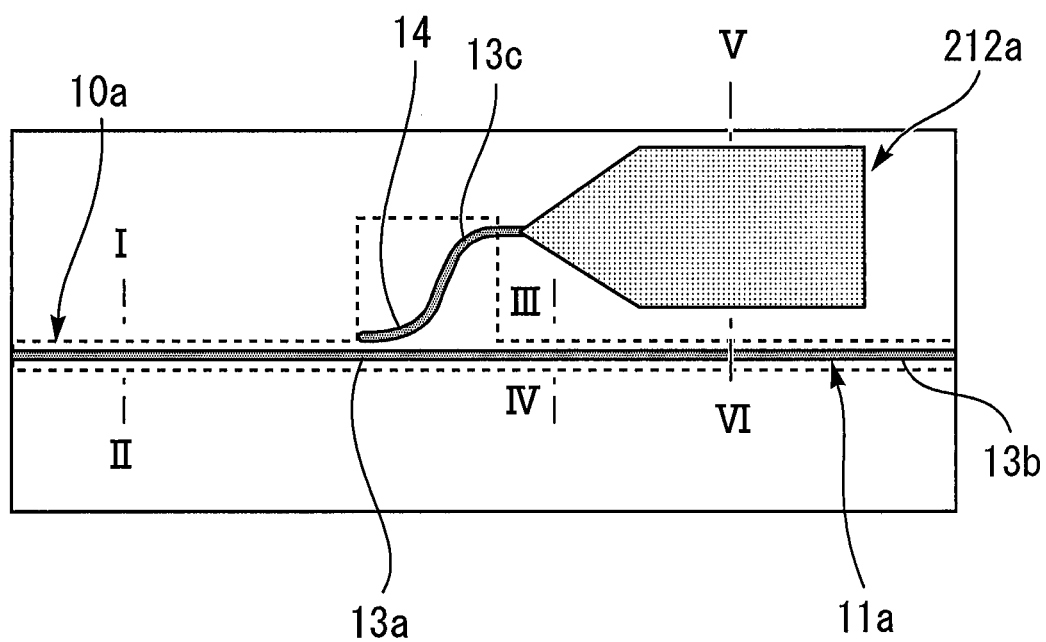
FIG. 64 is a plan view showing a state in which the semiconductor layers constituting the photodiode have been etched in the comparative example.
Figure 65:
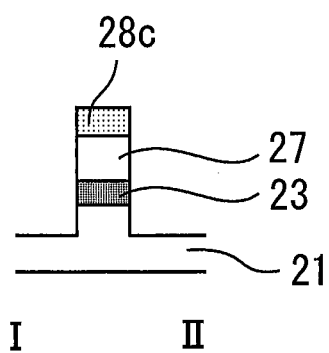
FIG. 65 is a cross-sectional view obtained by cutting FIG. 64 along a line I-II.
Figure 66:
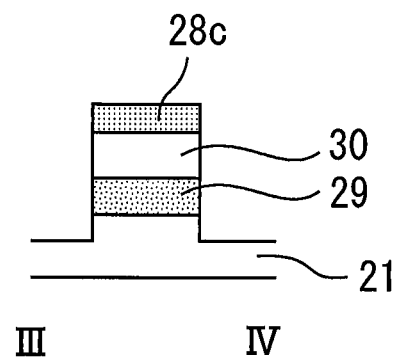
FIG. 66 is a cross-sectional view obtained by cutting FIG. 64 along a line III-IV.
Figure 67:
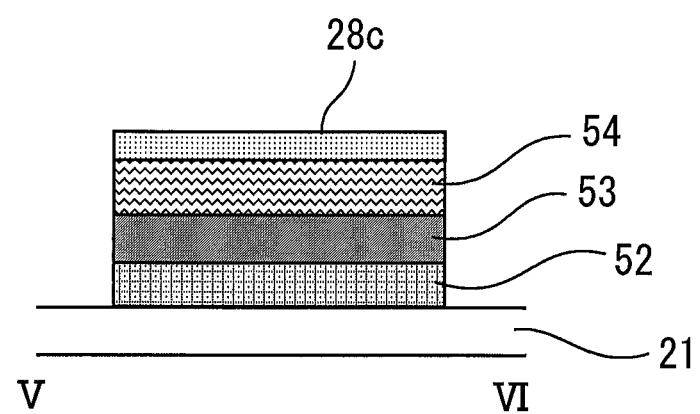
FIG. 67 is a cross-sectional view obtained by cutting FIG. 64 along a line V-VI.

Next, the semiconductor layers constituting the photodiode 212 are etched. FIG. 64 is a plan view showing a state in which the semiconductor layers constituting the photodiode 212 have been etched in the comparative example. FIG. 65 is a cross-sectional view obtained by cutting FIG. 64 along a line I-II. FIG. 66 is a cross-sectional view obtained by cutting FIG. 64 along a line III-IV. FIG. 67 is a cross-sectional view obtained by cutting FIG. 64 along a line V-VI.

First, the insulating film 28c is provided in the laser forming portion 10a, the modulator forming portion 11a, a region where the waveguides 13a, 13b, and 13c are formed and the photodiode forming portion 212a. The photodiode forming portion 212a indicates a region on the conductive substrate 21 where the photodiode 212 is formed. Next, dry etching is performed by using the insulating film 28c as a mask until the conductive substrate 21 is exposed. As a result, the waveguides 13a, 13b, and 13c are formed.

Figure 68:
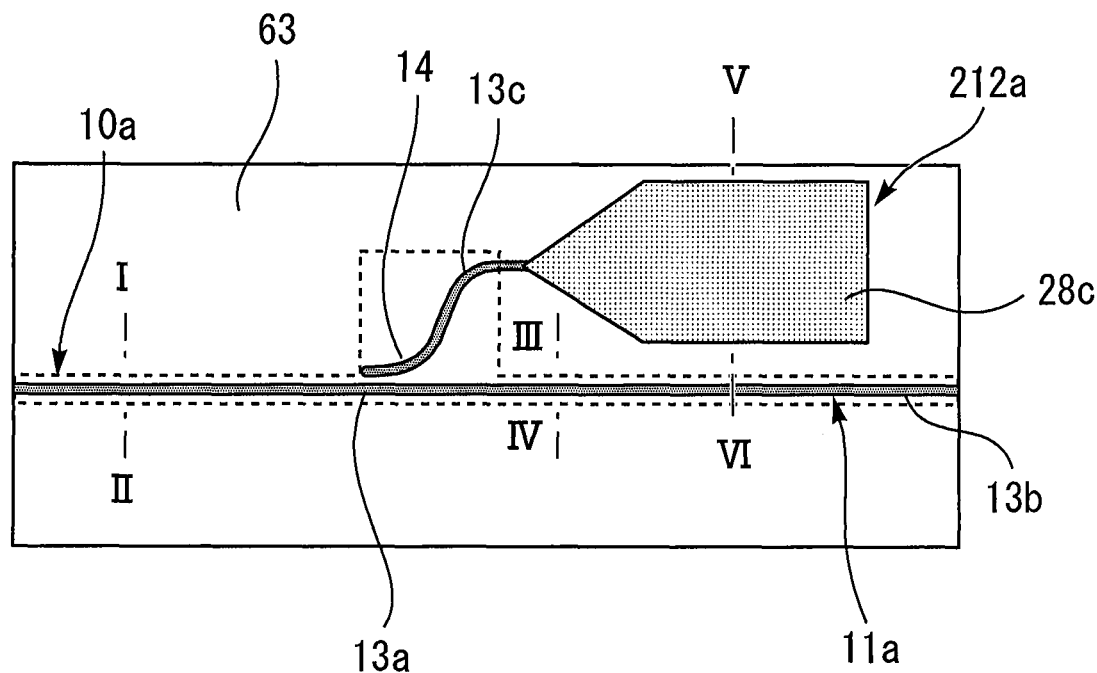
FIG. 68 is a plan view showing a state in which the buried growth has been performed in the comparative example.
Figure 69:
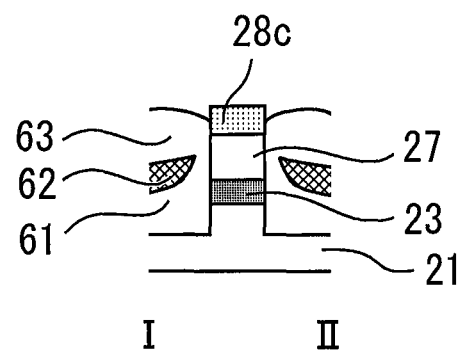
FIG. 69 is a cross-sectional view obtained by cutting FIG. 68 along a line I-II.
Figure 70:
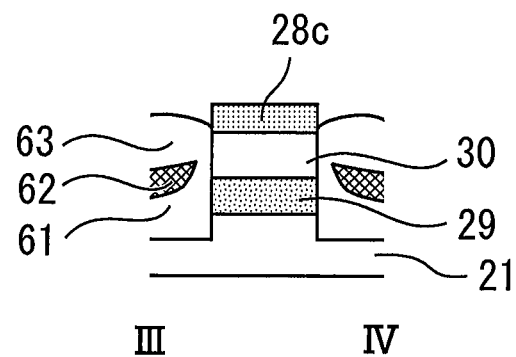
FIG. 70 is a cross-sectional view obtained by cutting FIG. 68 along a line III-IV.
Figure 71:
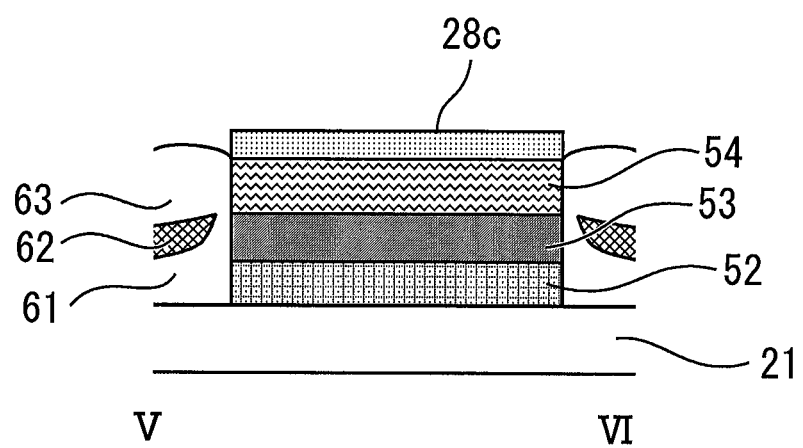
FIG. 71 is a cross-sectional view obtained by cutting FIG. 68 along a line V-VI.

Next, buried growth is performed. FIG. 68 is a plan view showing a state in which the buried growth has been performed in the comparative example. FIG. 69 is a cross-sectional view obtained by cutting FIG. 68 along a line I-II. FIG. 70 is a cross-sectional view obtained by cutting FIG. 68 along a line III-IV. FIG. 71 is a cross-sectional view obtained by cutting FIG. 68 along a line V-VI. In this step, as in the case of the first embodiment, the buried growth layer including the p-InP layer 61, the n-InP layer 62, and the p-InP layer 63 is formed.

Figure 72:
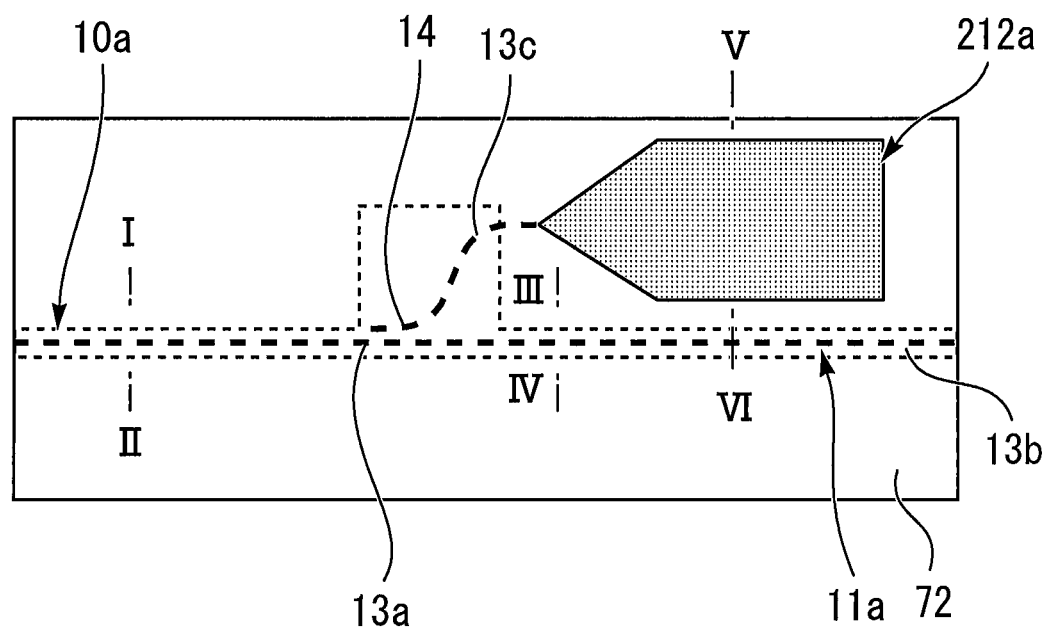
FIG. 72 is a plan view showing a state where the contact layer has been grown in the comparative example.
Figure 73:
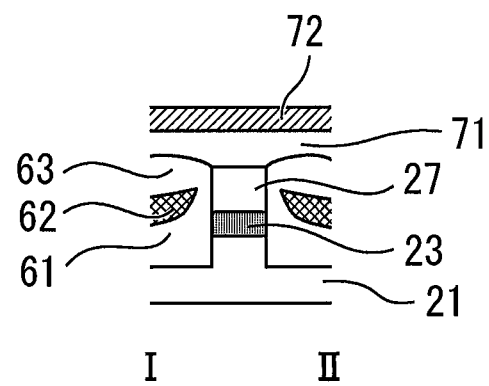
FIG. 73 is a cross-sectional view obtained by cutting FIG. 72 along a line I-II.
Figure 74:
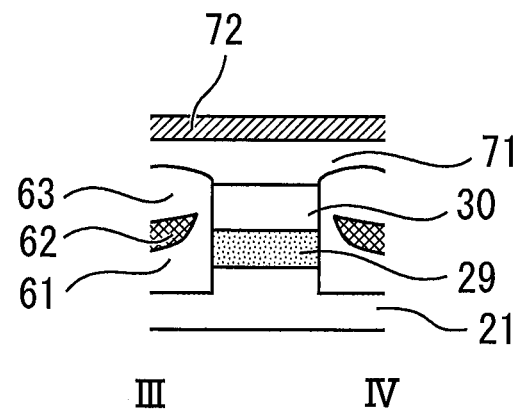
FIG. 74 is a cross-sectional view obtained by cutting FIG. 72 along a line III-IV.
Figure 75:
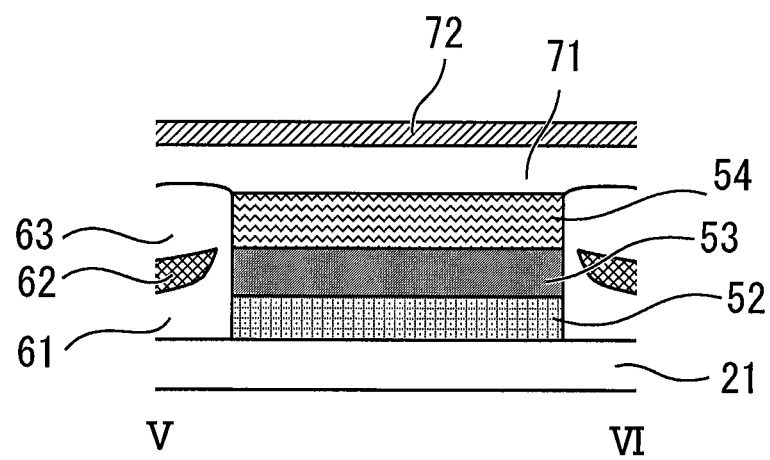
FIG. 75 is a cross-sectional view obtained by cutting FIG. 72 along a line V-VI.

Next, a contact layer is formed. The contact layer includes the cladding layer 71 and the p-InGaAs layer 72. FIG. 72 is a plan view showing a state where the contact layer has been grown in the comparative example. FIG. 73 is a cross-sectional view obtained by cutting FIG. 72 along a line I-II. FIG. 74 is a cross-sectional view obtained by cutting FIG. 72 along a line III-IV. FIG. 75 is a cross-sectional view obtained by cutting FIG. 72 along a line V-VI. In this step, as in the case of the first embodiment, the contact layer is grown on the entire surface of the conductive substrate 21 by crystal growth.

Figure 76:
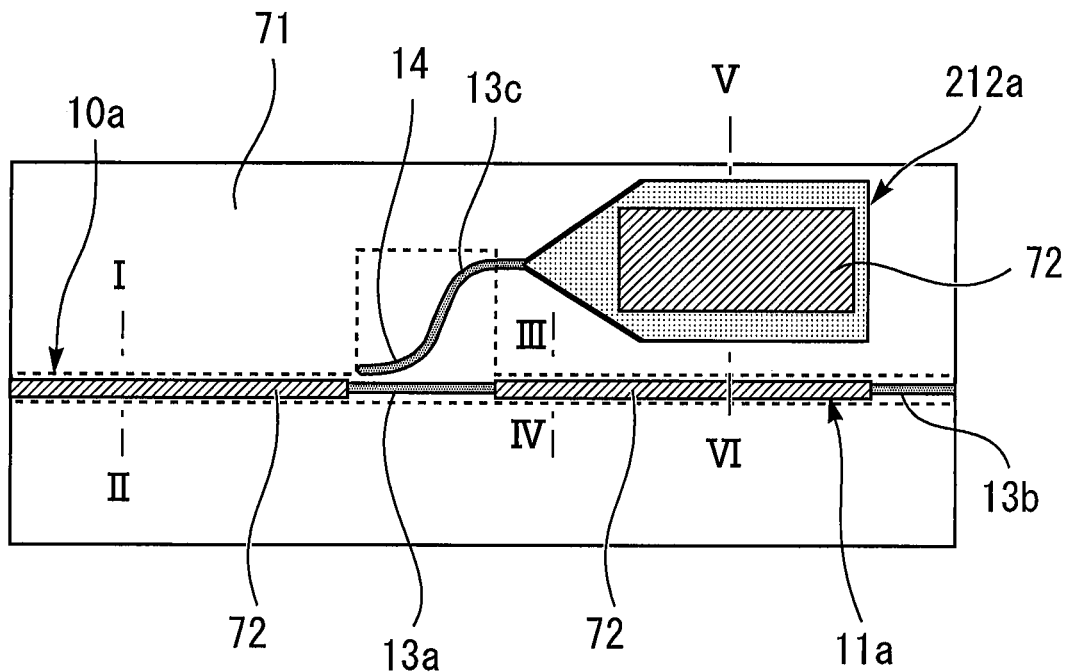
FIG. 76 is a plan view showing a state in which the contact layer has been etched in the comparative example.
Figure 77:
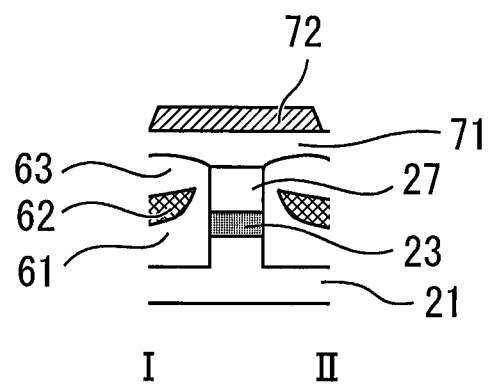
FIG. 77 is a cross-sectional view obtained by cutting FIG. 76 along a line I-II.
Figure 78:
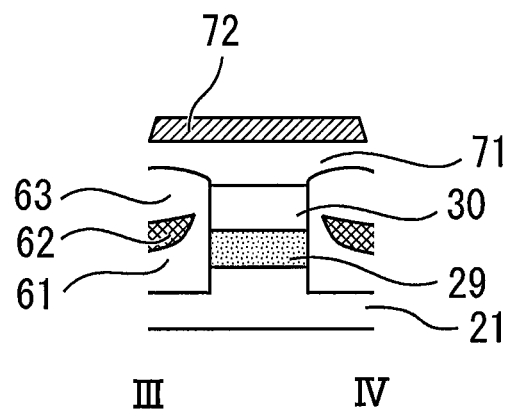
FIG. 78 is a cross-sectional view obtained by cutting FIG. 76 along a line III-IV.
Figure 79:
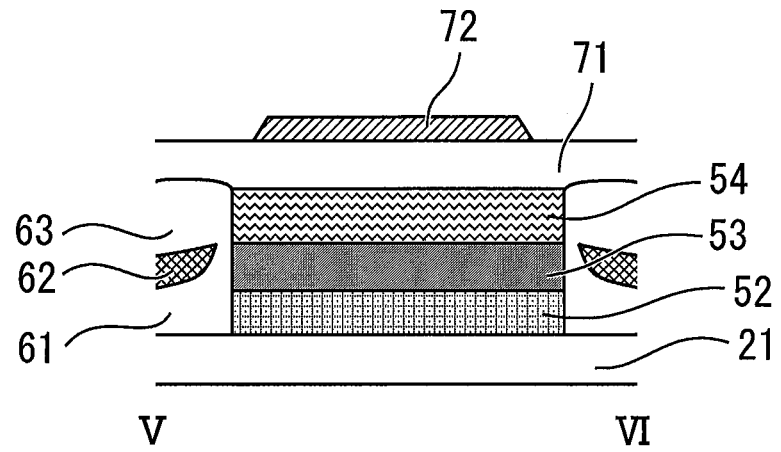
FIG. 79 is a cross-sectional view obtained by cutting FIG. 76 along a line V-VI.

Next, the contact layer is etched. FIG. 76 is a plan view showing a state in which the contact layer has been etched in the comparative example. FIG. 77 is a cross-sectional view obtained by cutting FIG. 76 along a line I-II. FIG. 78 is a cross-sectional view obtained by cutting FIG. 76 along a line III-IV. FIG. 79 is a cross-sectional view obtained by cutting FIG. 76 along a line V-VI. In this step, the p-InGaAs layer 72 is etched so that the p-InGaAs layer 72 remains on the laser forming portion 10a, the modulator forming portion 10b, and the photodiode forming portion 212a.

Figure 80:
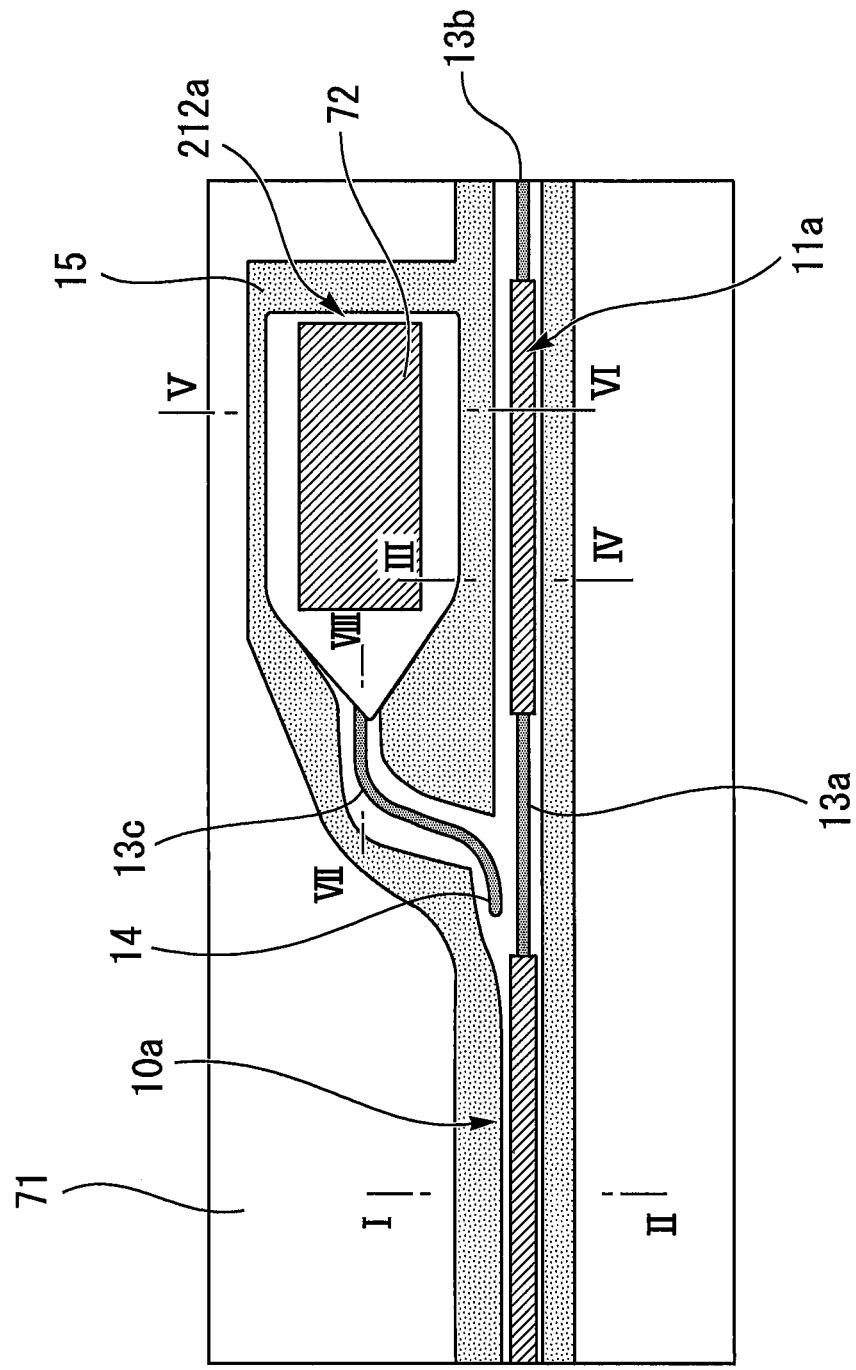
FIG. 80 is a plan view showing a state in which the mesa has been formed in the comparative example.
Figure 81:
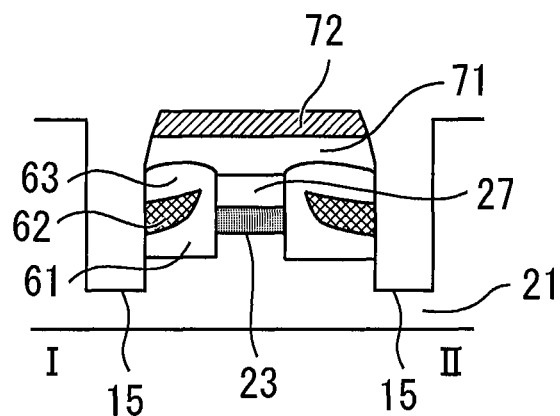
FIG. 81 is a cross-sectional view obtained by cutting FIG. 80 along a line I-II.
Figure 82:
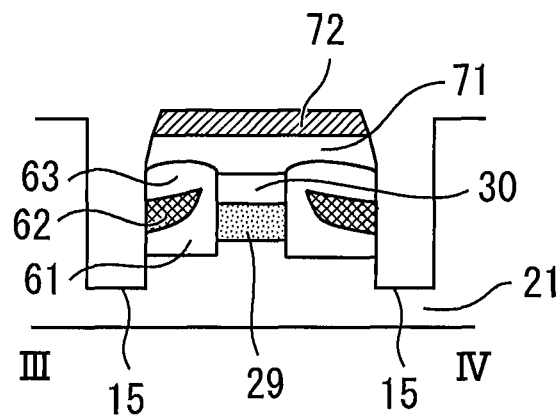
FIG. 82 is a cross-sectional view obtained by cutting FIG. 80 along a line III-IV.
Figure 83:
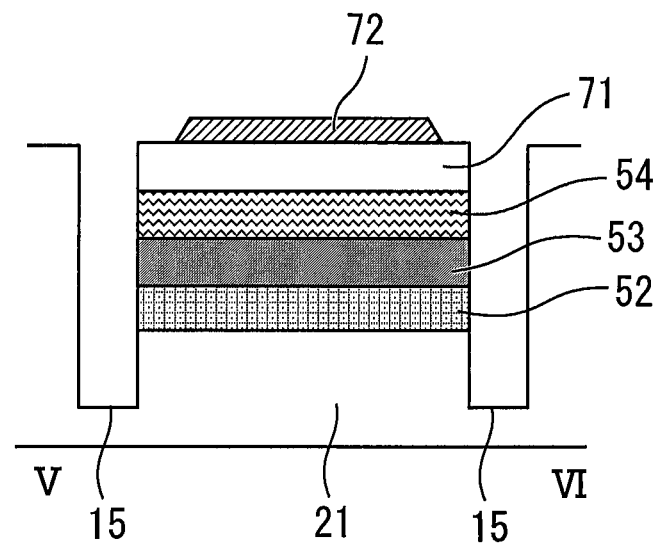
FIG. 83 is a cross-sectional view obtained by cutting FIG. 80 along a line V-VI.
Figure 84:
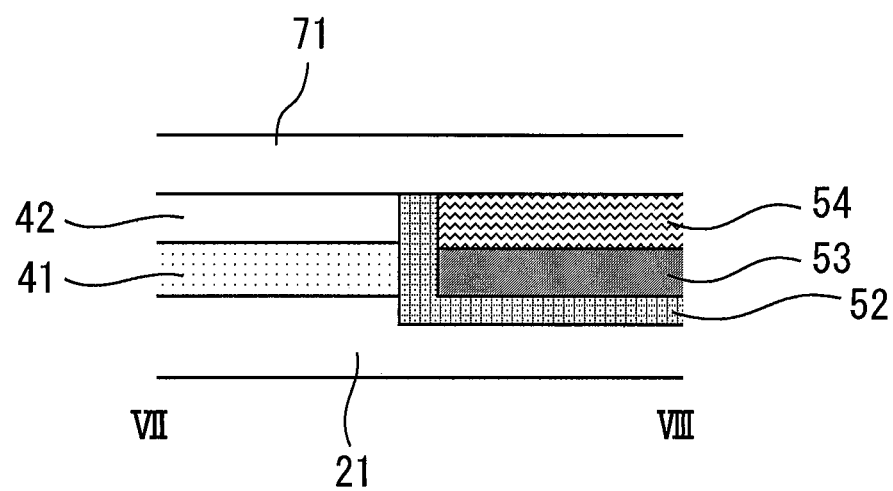
FIG. 84 is a cross-sectional view obtained by cutting FIG. 80 along a line VII-VIII.

Next, a mesa is formed. FIG. 80 is a plan view showing a state in which the mesa has been formed in the comparative example. FIG. 81 is a cross-sectional view obtained by cutting FIG. 80 along a line I-II. FIG. 82 is a cross-sectional view obtained by cutting FIG. 80 along a line III-IV. FIG. 83 is a cross-sectional view obtained by cutting FIG. 80 along a line V-VI. FIG. 84 is a cross-sectional view obtained by cutting FIG. 80 along a line VII-VIII.

Here, the trenches 15 are formed on both sides of the laser forming portion 10a, both sides of the modulator forming portion 11a, and both sides of the waveguides 13a, 13b, and 13c. Further, the trenches 15 are formed so as to surround the photodiode forming portion 212a except for the connection portion with the waveguide 13c. The trenches 15 are formed by etching until a depth at which the conductive substrate 21 is exposed.

Figure 85:
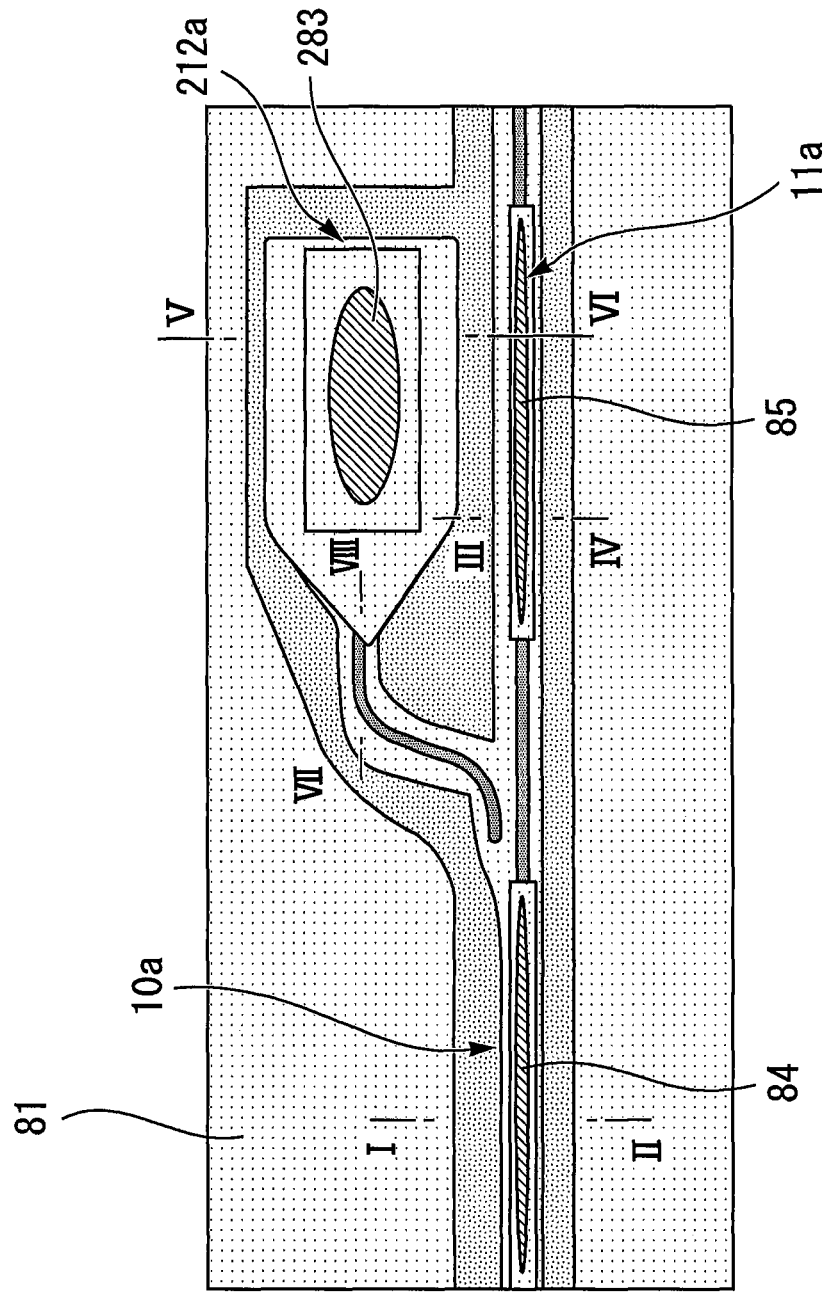
FIG. 85 is a plan view showing a state in which the openings have been formed in the insulating film in the comparative example.
Figure 86:
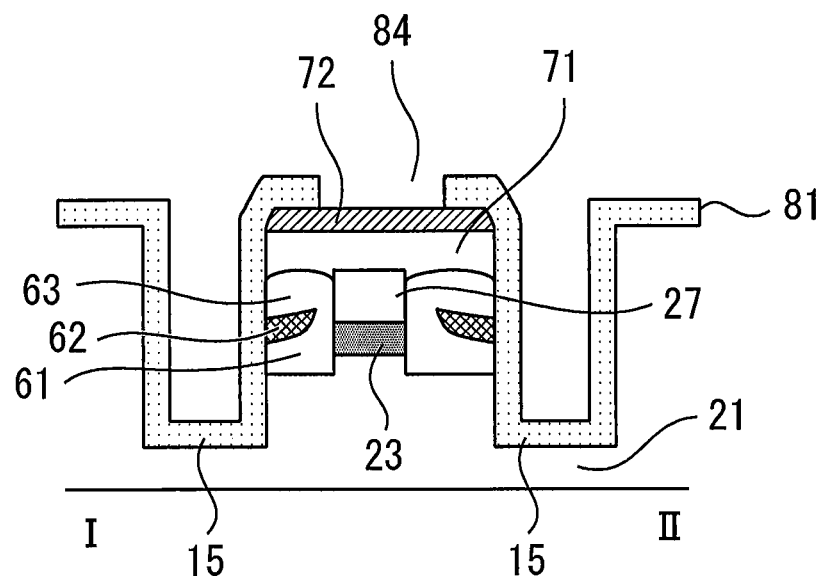
FIG. 86 is a cross-sectional view obtained by cutting FIG. 85 along a line I-II.
Figure 87:
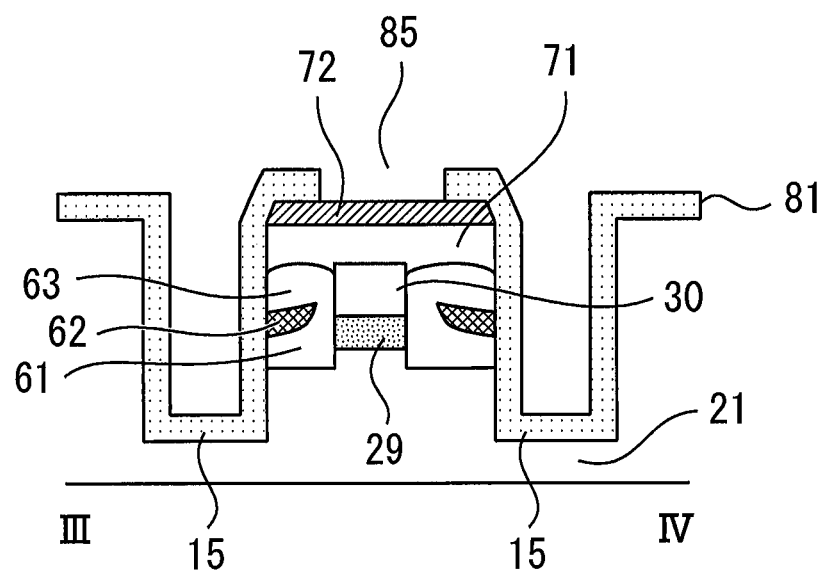
FIG. 87 is a cross-sectional view obtained by cutting FIG. 85 along a line III-IV.
Figure 88:
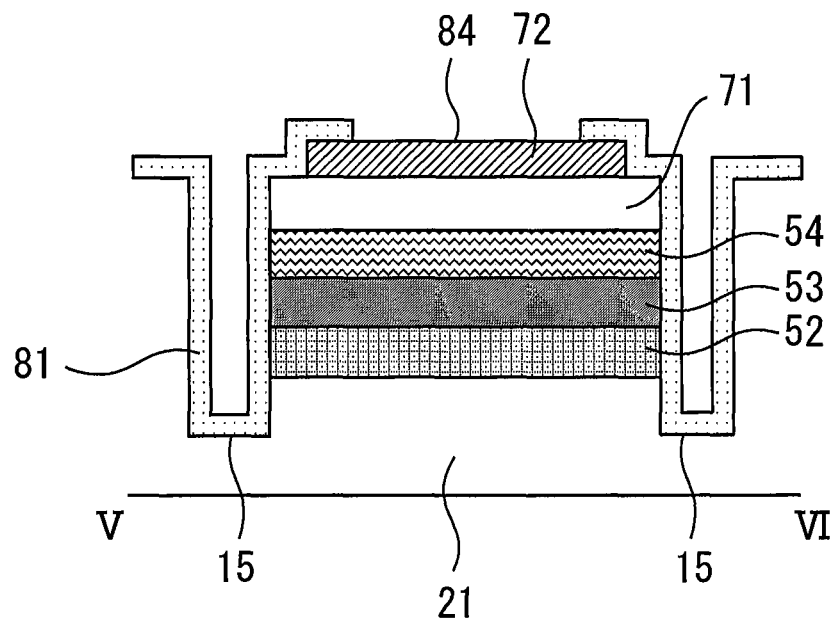
FIG. 88 is a cross-sectional view obtained by cutting FIG. 85 along a line V-VI.
Figure 89:
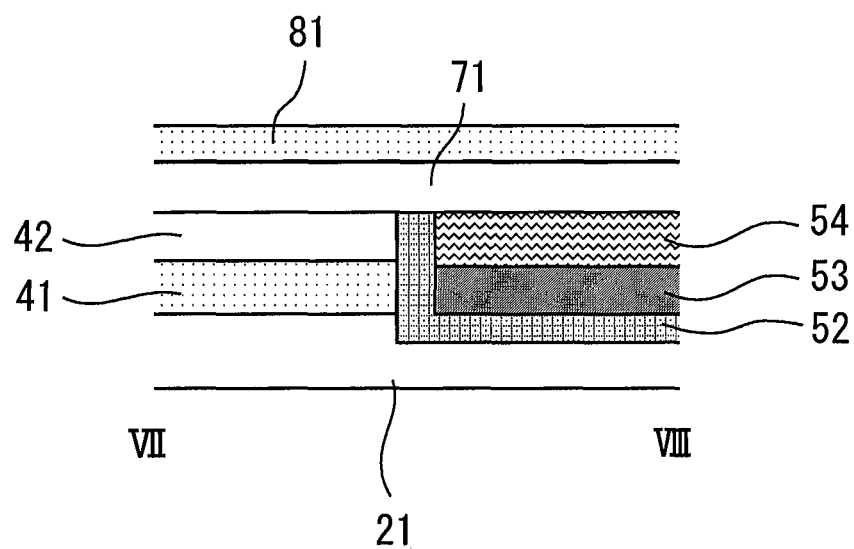
FIG. 89 is a cross-sectional view obtained by cutting FIG. 85 along a line VII-VIII.

Next, the insulating film 81 is formed on the entire surface of the conductive substrate 21. Next, openings 84, 85, and 283 are formed in the insulating film 81. FIG. 85 is a plan view showing a state in which the openings 84, 85, and 283 have been formed in the insulating film 81 in the comparative example. FIG. 86 is a cross-sectional view obtained by cutting FIG. 85 along a line I-II. FIG. 87 is a cross-sectional view obtained by cutting FIG. 85 along a line III-IV. FIG. 88 is a cross-sectional view obtained by cutting FIG. 85 along a line V-VI. FIG. 89 is a cross-sectional view obtained by cutting FIG. 85 along a line VII-VIII.

The opening 283 is formed so as to expose the p-InGaAs layer 72 in the photodiode forming portion 212a. The openings 84 and 85 are formed in the laser forming portion 10a and the modulator forming portion 11a respectively as in the case of the first embodiment.

Next, an electrode 87 is formed on the insulating film 81. The structure of the electrode 87 provided in the laser forming portion 10a and the modulator forming portion 11a is the same as that in the first embodiment. In the photodiode forming portion 212a, the anode 87a is provided so as to fill the opening 283 and contact the p-InGaAs layer 72.

Next, a back surface step is executed. The back surface step is the same as that in the first embodiment. From the foregoing steps, the semiconductor optical integrated device 200 shown in FIGS. 57 to 61 is formed.

In the semiconductor optical integrated device 200 according to the comparative example, the electrode 90 on the back surface of the conductive substrate 21 serves as a common cathode for the laser 10 and the photodiode 212. At this time, for example, when the electrode 90 is at the ground potential, the electrode on the upper surface side of the photodiode 212 has a negative potential. Therefore, a user cannot select the polarity of the power source of the photodiode 212.

In the comparative example, the laser 10 and the photodiode 212 are not electrically separated from each other. Therefore, reactive current flows between the laser 10 and the photodiode 212, and the characteristics of the semiconductor optical integrated device 200 may deteriorate.

In contrast, in the semiconductor optical integrated device 100 according to the present embodiment, the conductive substrate 21 and the photodiode 12 are electrically separated from each other by the semi-insulating semiconductor layer 50. Therefore, both the anode 87a and the cathode 87b can be drawn out from the upper surface side of the photodiode 12. Therefore, the degree of freedom of the polarity of the power source connected to the photodiode 12 is enhanced.

Further, the waveguide 13c and the photodiode 12 are electrically separated from each other by the semi-insulating semiconductor layer 50. The photodiode 12 is electrically separated from the conductive substrate 21 by the semi-insulating semiconductor layer 50. In other words, the photodiode 12 is electrically separated from the laser 10 and the modulator 11 because the semi-insulating semiconductor layer 50 serves as a separation resistor. In the present embodiment, since the anode 87a and the cathode 87b are sufficiently insulated from the laser 10 and the modulator 11, it is possible to suppress reactive current from flowing between the laser 10 or the modulator 11 and the photodiode 12. Therefore, the characteristics of the semiconductor optical integrated device 100 can be improved.

The light receiving surface 19 of the photodiode 12 and the end face 43 of the waveguide 13c are connected to each other by a semiconductor layer. Here, the semiconductor layers are the semi-insulating semiconductor layer 50, the contact layer 51, and the cladding layer 52. As a result, it is possible to secure monitor light enough to make the photodiode 12 function.

Since the conductive substrate 21 is used in the present embodiment, the electrode 90 on the back surface can be used as the cathodes of the laser 10 and the modulator 11. Accordingly, as compared with a case where the semi-insulating substrate is used, the number of electrode terminals to be drawn from the upper surface side of the substrate can be reduced. As for the laser 10 and the modulator 11, a driving method using the electrode 90 on the back surface can be adopted as in the case of the conventional semiconductor optical integrated device using the conductive substrate 21.

In the present embodiment, the directional coupler 14 can be provided so as to be adjacent to any position of the waveguide equipped to the semiconductor optical integrated device 100. Therefore, the freedom degree of the position of the photodiode 12 can be enhanced.

In the present embodiment, the photodiode 12 is provided in front of the laser 10. As a modification, the photodiode 12 may be provided at a different position on the conductive substrate 21 as long as it can receive the output light of the laser 10. For example, the photodiode 12 may be provided behind the laser 10. In this case, the photodiode 12 may receive light emitted to the rear side of the laser 10. Further, the photodiode 12 may receive all the light emitted to the rear side of the laser 10. The photodiode 12 may be provided between the laser 10 and the modulator 11. In other words, the photodiode 12 may be an in-line photodiode.

The structures of the laser 10, the modulator 11, the photodiode 12, and the waveguides 13a, 13b, and 13c are not limited to those shown in the present embodiment. Any laser and any modulator provided on the conductive substrate 21 can be adopted as the laser 10 and the modulator 11. Further, any photodiode that is electrically separated from the conductive substrate 21 by the semi-insulating semiconductor layer 50 can be used as the photodiode 12. For example, the contact layer 51 and the cladding layer 52 may not extend along the end face 43 of the waveguide 13c. Further, the modulator 11 may not be provided. The present embodiment can be applied to any semiconductor optical integrated device in which a laser and a photodiode are provided on the conductive substrate 21.

These modifications can be applied, as appropriate, to a semiconductor optical integrated device according to the following embodiments. Note that the semiconductor optical integrated device according to the following embodiments are similar to those of the first embodiment in many respects, and thus differences between the semiconductor optical integrated device according to the following embodiments and those of the first embodiment will be mainly described below.

Second Embodiment

Figure 90:
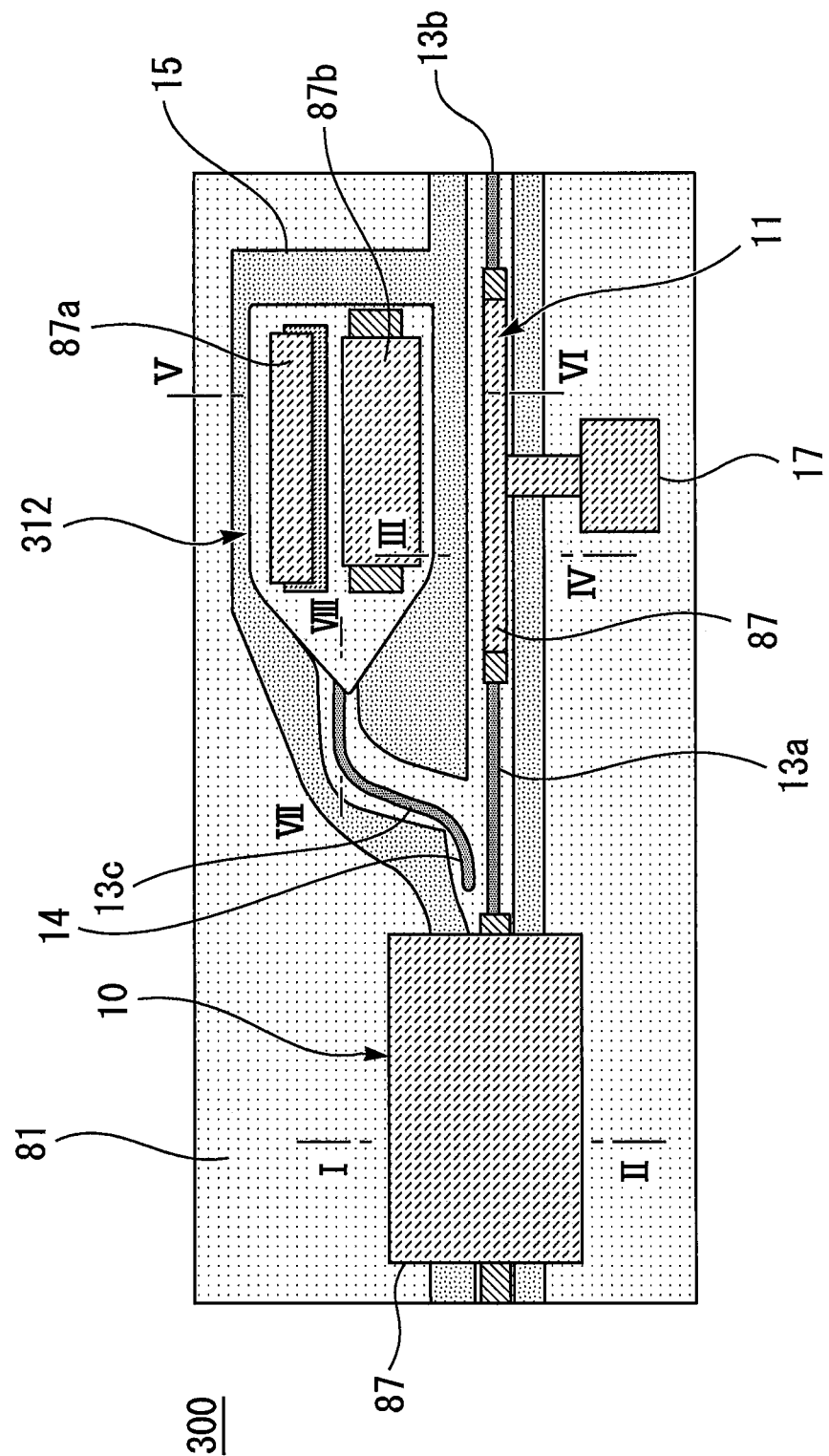
FIG. 90 is a plan view of a semiconductor optical integrated device according to a second embodiment.

FIG. 90 is a plan view of a semiconductor optical integrated device 300 according to a second embodiment. The semiconductor optical integrated device 300 is different from the first embodiment in the structure of a photodiode 312. The other structures are the same as those in the first embodiment.

Figure 91:
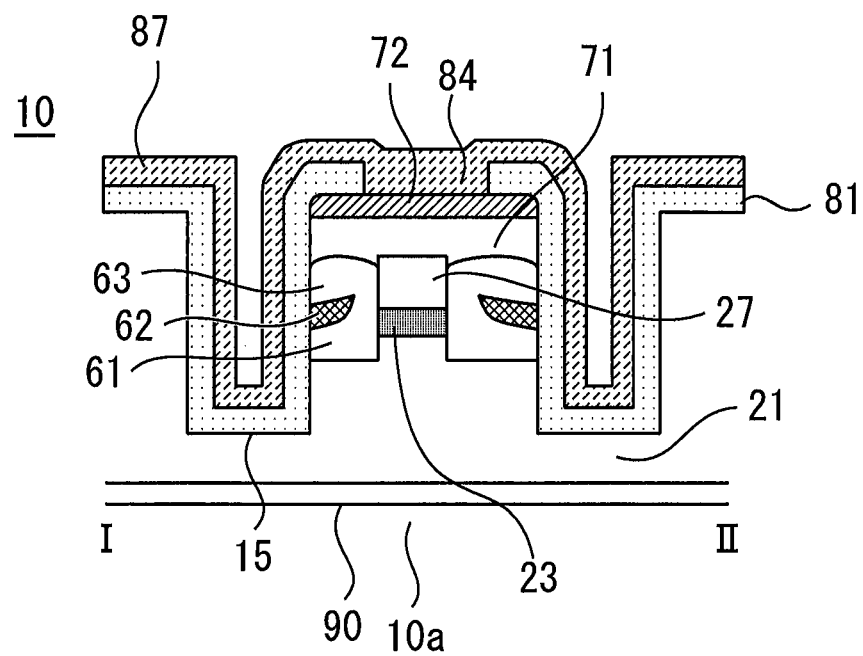
FIG. 91 is a cross-sectional view obtained by cutting the semiconductor optical integrated device of FIG. 90 along a line I-II.
Figure 92:
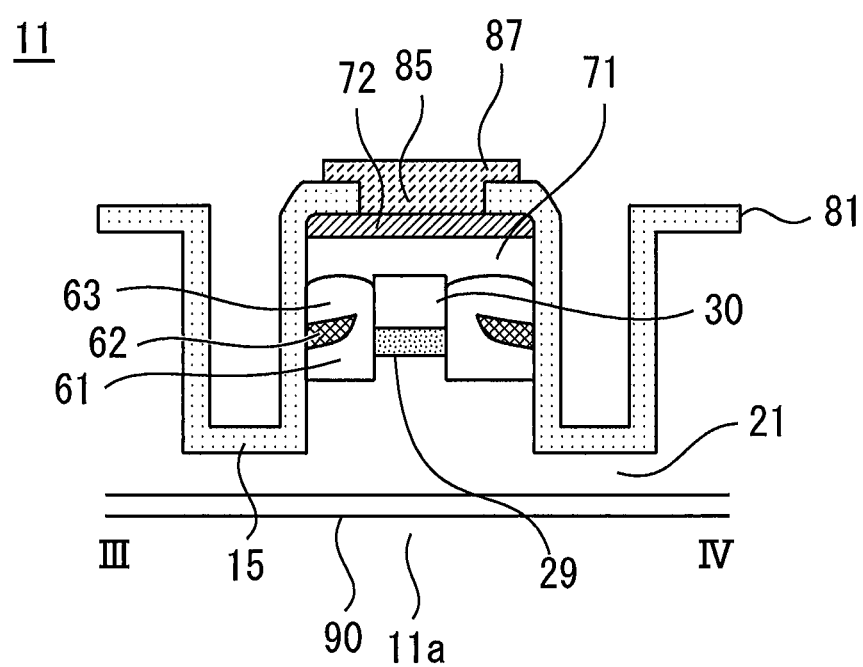
FIG. 92 is a cross-sectional view obtained by cutting the semiconductor optical integrated device of FIG. 90 along a line III-IV.

FIG. 91 is a cross-sectional view obtained by cutting the semiconductor optical integrated device 300 of FIG. 90 along a line I-II. FIG. 92 is a cross-sectional view obtained by cutting the semiconductor optical integrated device 300 of FIG. 90 along a line III-IV. The structures of the laser 10 and the modulator 11 are the same as those in the first embodiment.

Figure 93:
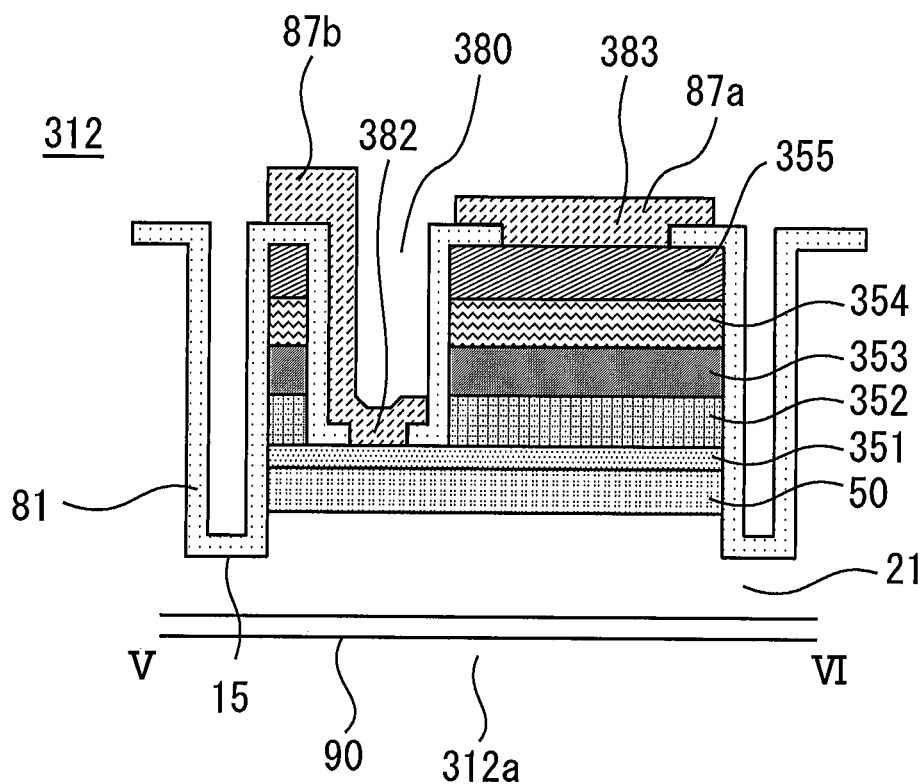
FIG. 93 is a cross-sectional view obtained by cutting the semiconductor optical integrated device of FIG. 90 along a line V-VI.

FIG. 93 is a cross-sectional view obtained by cutting the semiconductor optical integrated device of FIG. 90 along a line V-VI. FIG. 93 is a cross-sectional view of the photodiode 312. As in the case of the first embodiment, a semi-insulating semiconductor layer 50 is provided on a conductive substrate 21. The photodiode 312 is provided on the semi-insulating semiconductor layer 50.

A contact layer 351 is provided on the semi-insulating semiconductor layer 50. The contact layer 351 is made of p-InGaAsP. A cladding layer 352 is provided on the contact layer 351. The cladding layer 352 is made of p-InP. A light absorption layer 353 is provided on the cladding layer 352. The light absorption layer 353 is made of i-InGaAsP. A cladding layer 354 is provided on the light absorption layer 353. The cladding layer 354 is made of n-InP. A contact layer 355 is provided on the cladding layer 354. The contact layer 355 is made of n-InGaAsP. The photodiode 312 includes a p-InP cladding layer, an i-InGaAsP light absorption layer, and an n-InP cladding layer in this order from the conductive substrate 21 side.

A contact hole 380 extending from the upper surface of the contact layer 355 to the contact layer 351 is formed in the photodiode 12. The contact layer 351 is exposed through the contact hole 380.

Trenches 15 are provided on both sides of the photodiode 312. The trenches 15 extend from the upper surface side of the photodiode 312 to the conductive substrate 21. An insulating film 81 is provided on the upper surface of the contact layer 355. The insulating film 81 extends along the trenches 15 and the contact hole 380. The insulating film 81 is provided with an opening 383 for exposing the contact layer 355 therethrough. An opening 382 for exposing the contact layer 351 therethrough is provided in the insulating film 81 at the bottom surface of the contact hole 380.

An anode 87a and a cathode 87b are provided on the insulating film 81. The anode 87a fills the opening 383 and contacts the contact layer 355. The cathode 87b fills the opening 382 and contacts the contact layer 351. The anode 87a of the photodiode 312 and the cathode 87b of the photodiode 312 are drawn from the upper surface side of the photodiode 312.

Figure 94:
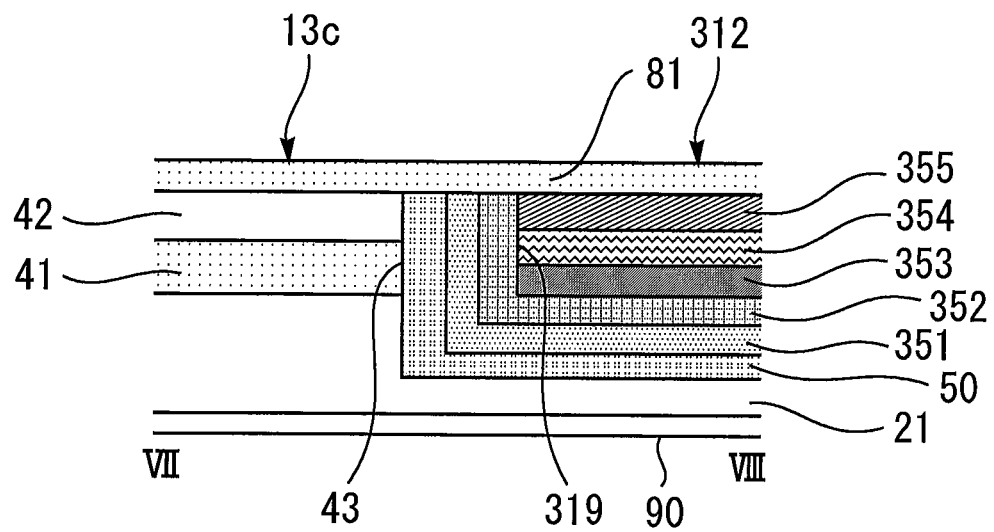
FIG. 94 is a cross-sectional view obtained by cutting the semiconductor optical integrated device of FIG. 90 along a line VII-VIII.

FIG. 94 is a cross-sectional view obtained by cutting the semiconductor optical integrated device 300 of FIG. 90 along a line VII-VIII. FIG. 94 is a cross-sectional view of a connection portion between the photodiode 312 and the waveguide 13c. The structures of the waveguides 13a, 13b, and 13c are the same as those in the first embodiment.

The semi-insulating semiconductor layer 50, the contact layer 351, and the cladding layer 352 extend along an end face 43 of the waveguide 13c. The end face 43 faces a light receiving surface 319 of the photodiode 312. As in the case of the first embodiment, the waveguide 13c and the photodiode 312 are separated from each other by the semi-insulating semiconductor layer 50. An insulating film 81 is provided on the cladding layer 42 and the contact layer 355.

Next, a method of manufacturing the semiconductor optical integrated device 300 will be described. The method of manufacturing the semiconductor optical integrated device 300 is the same as that in the first embodiment until the step of etching the semiconductor layers constituting the waveguides 13a, 13b, and 13c shown in FIGS. 22 and 23.

Figure 95:
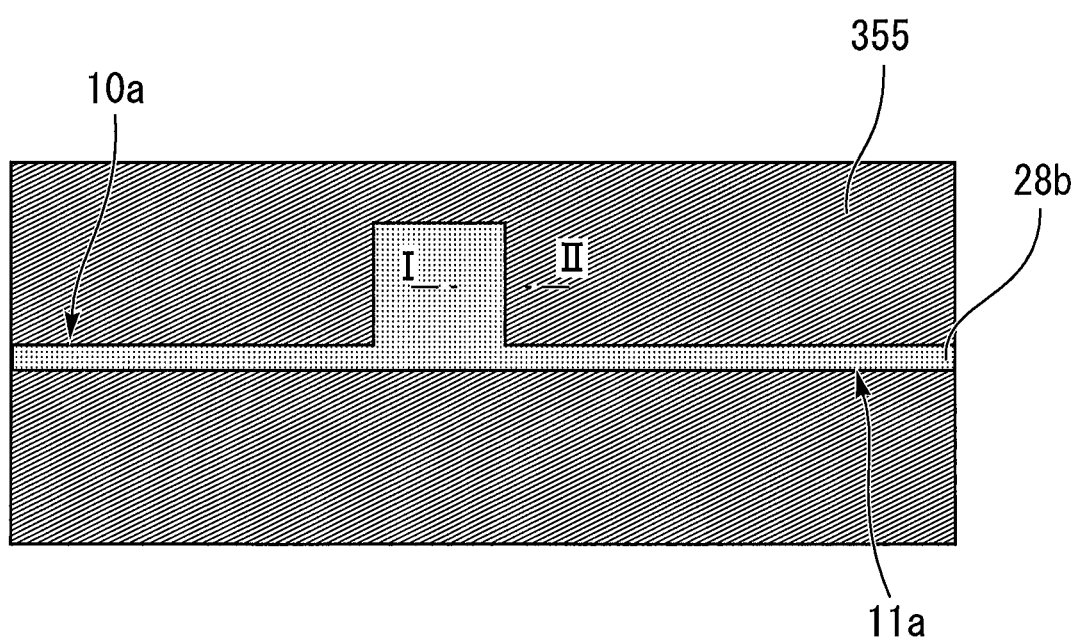
FIG. 95 is a plan view showing a state in which the semiconductor layers constituting the photodiode and the semi-insulating semiconductor layer have been grown in the second embodiment.
Figure 96:
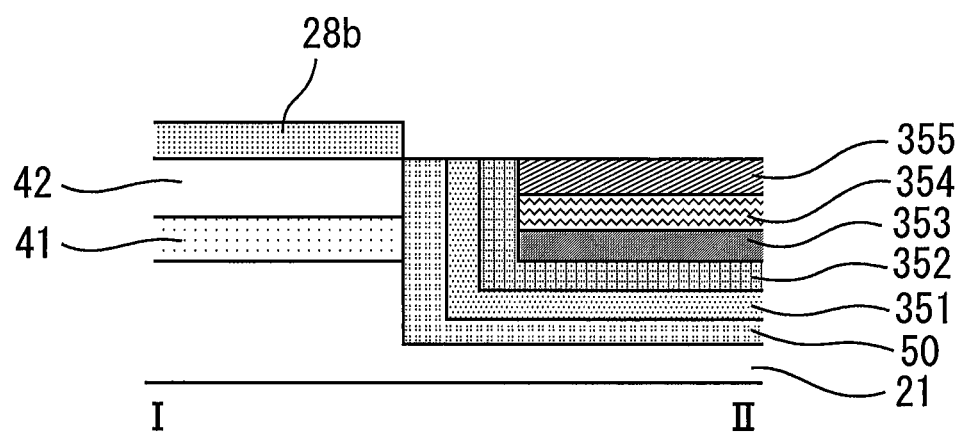
FIG. 96 is a cross-sectional view obtained by cutting FIG. 95 along a line I-II.

Next, semiconductor layers constituting the photodiode 312 and the semi-insulating semiconductor layer 50 are formed. The semiconductor layers constituting the photodiode 312 are the contact layer 351, the cladding layer 352, the light absorption layer 353, the cladding layer 354, and the contact layer 355. FIG. 95 is a plan view showing a state in which the semiconductor layers constituting the photodiode 312 and the semi-insulating semiconductor layer have been grown in the second embodiment. FIG. 96 is a cross-sectional view obtained by cutting FIG. 95 along a line I-II.

The semi-insulating semiconductor layer 50, the contact layer 351, the cladding layer 352, the light absorption layer 353, the cladding layer 354, and the contact layer 355 are formed by selective growth using the insulating film 28b as a mask. These semiconductor layers are formed so as to surround a portion covered with the insulating film 28b.

As in the case of the first embodiment, the semi-insulating semiconductor layer 50 is formed not only on the upper surface of the conductive substrate 21, but also on a side surface of the semiconductor layer constituting the waveguide 13c formed by etching. The side surface of the semiconductor layer constituting the waveguide 13c formed by etching includes the end face 43.

Figure 97:
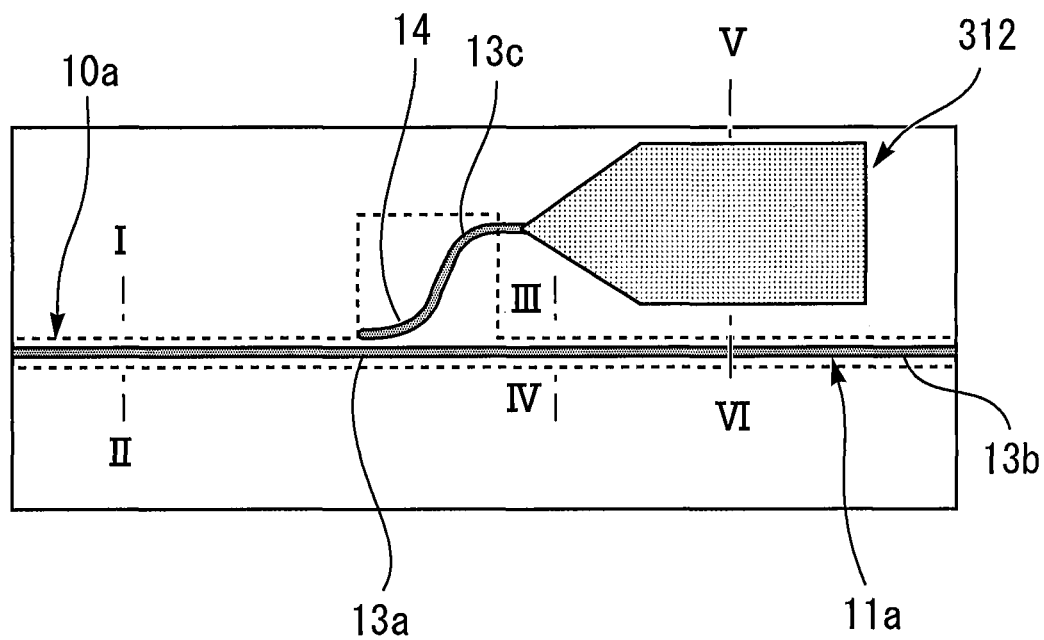
FIG. 97 is a plan view showing a state in which the semiconductor layers constituting the photodiode in the second embodiment have been etched.
Figure 98:
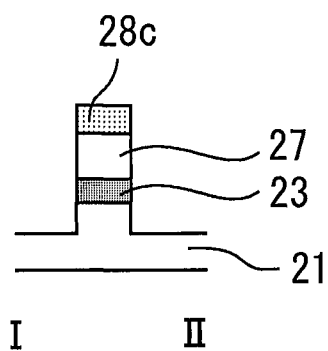
FIG. 98 is a cross-sectional view obtained by cutting FIG. 97 along a line I-II.
Figure 99:
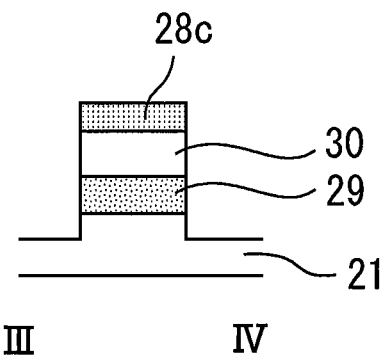
FIG. 99 is a cross-sectional view obtained by cutting FIG. 97 along a line III-IV.
Figure 100:
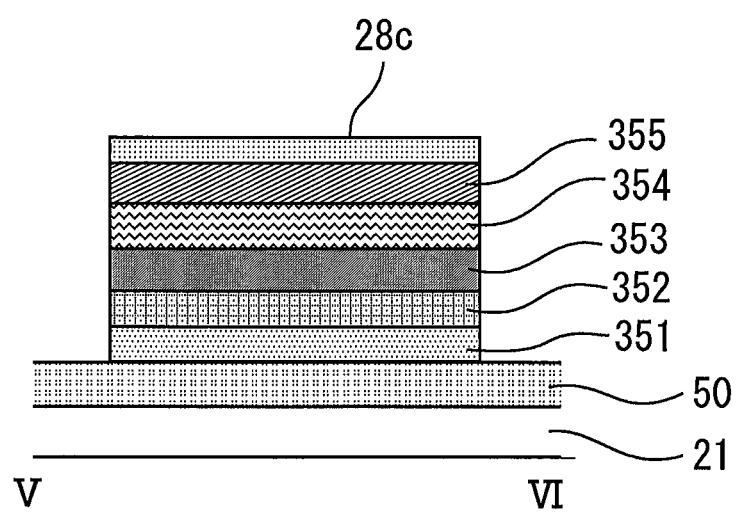
FIG. 100 is a cross-sectional view obtained by cutting FIG. 97 along a line V-VI.

Next, the semiconductor layers constituting the photodiode 312 are etched. FIG. 97 is a plan view showing a state in which the semiconductor layers constituting the photodiode 312 in the second embodiment have been etched. FIG. 98 is a cross-sectional view obtained by cutting FIG. 97 along a line I-II. FIG. 99 is a cross-sectional view obtained by cutting FIG. 97 along a line III-IV. FIG. 100 is a cross-sectional view obtained by cutting FIG. 97 along a line V-VI.

First, an insulating film 28c is formed on the cladding layers 27, 30, and 42 and the contact layer 355. The insulating film 28b is provided in the laser forming portion 10a, the modulator forming portion 11a, a region where the waveguides 13a, 13b, and 13c are formed, and the photodiode forming portion 312a. The photodiode forming portion 312a indicates a region on the conductive substrate 21 in which the photodiode 312 is formed. Next, dry etching is performed halfway through the semi-insulating semiconductor layer 50 by using the insulating film 28c as a mask. As a result, the waveguides 13a, 13b, and 13c are formed. A directional coupler 14 is also formed.

Figure 101:
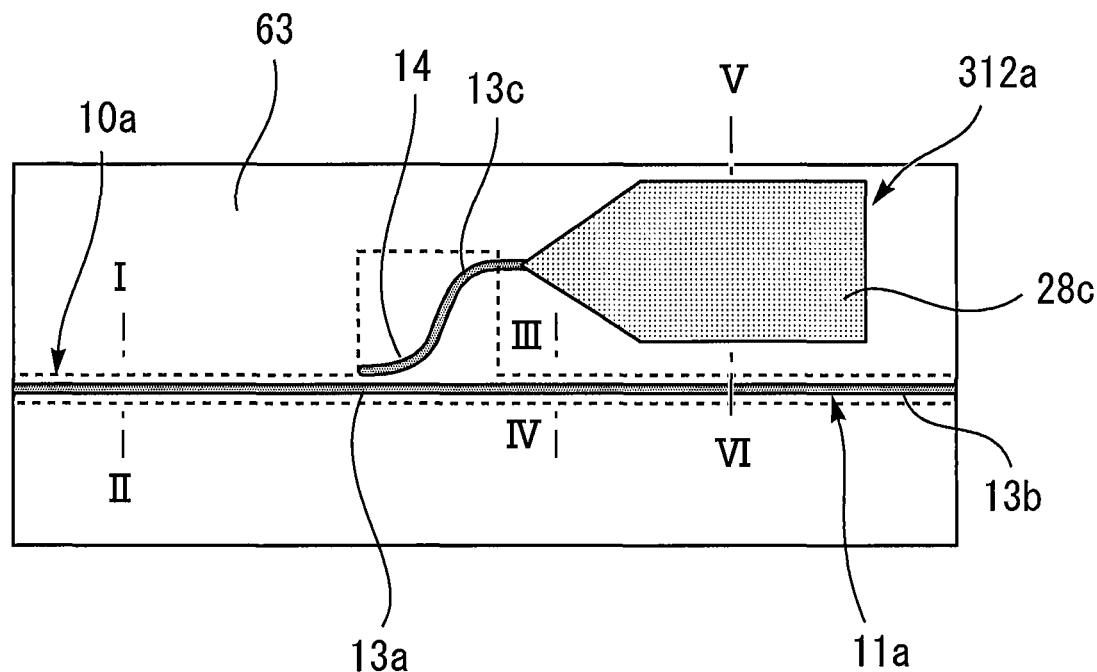
FIG. 101 is a plan view showing a state in which the buried growth has been performed in the second embodiment.
Figure 102:
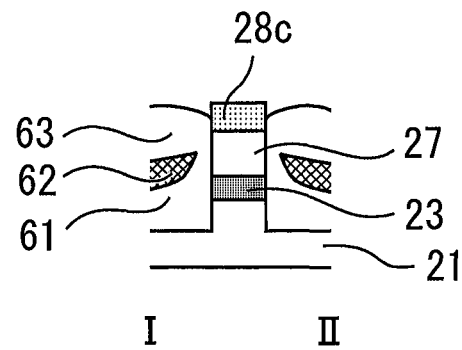
FIG. 102 is a cross-sectional view obtained by cutting FIG. 101 along a line I-II.
Figure 103:
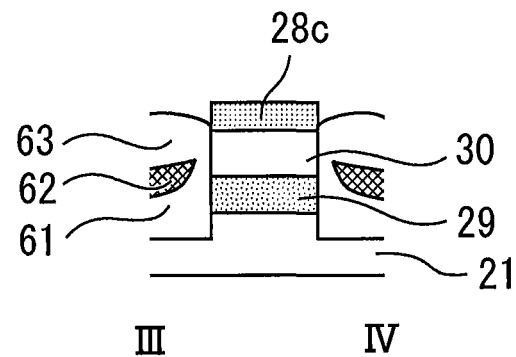
FIG. 103 is a cross-sectional view obtained by cutting FIG. 101 along a line III-IV.
Figure 104:
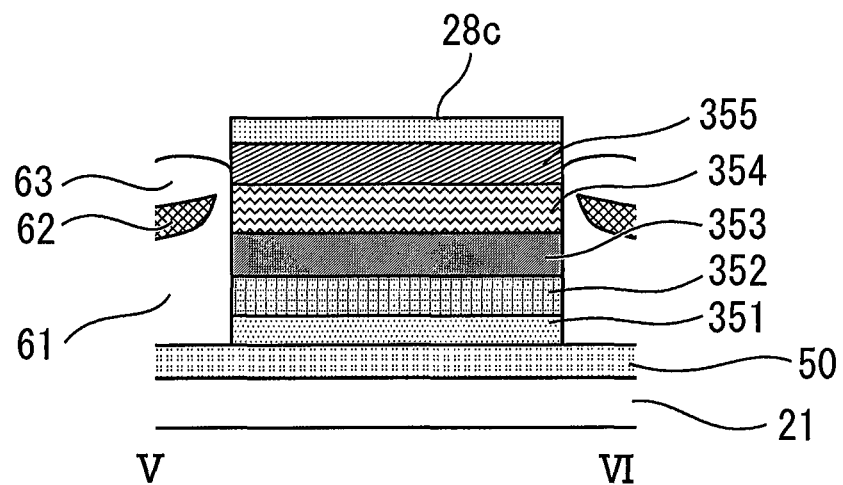
FIG. 104 is a cross-sectional view obtained by cutting FIG. 101 along a line V-VI.

Next, buried growth is performed. FIG. 101 is a plan view showing a state in which the buried growth has been performed in the second embodiment. FIG. 102 is a cross-sectional view obtained by cutting FIG. 101 along a line I-II. FIG. 103 is a cross-sectional view obtained by cutting FIG. 101 along a line III-IV. FIG. 104 is a cross-sectional view obtained by cutting FIG. 101 along a line V-VI. The structure of a buried growth layer is the same as that of the first embodiment. The side surfaces of the waveguides 13a, 13b, and 13c are covered with the buried growth layer. The side surfaces of the semiconductor layers constituting the laser 10, the semiconductor layers constituting the modulator 11, and the semiconductor layers constituting the photodiode 312 are covered with the buried growth layer.

Figure 105:
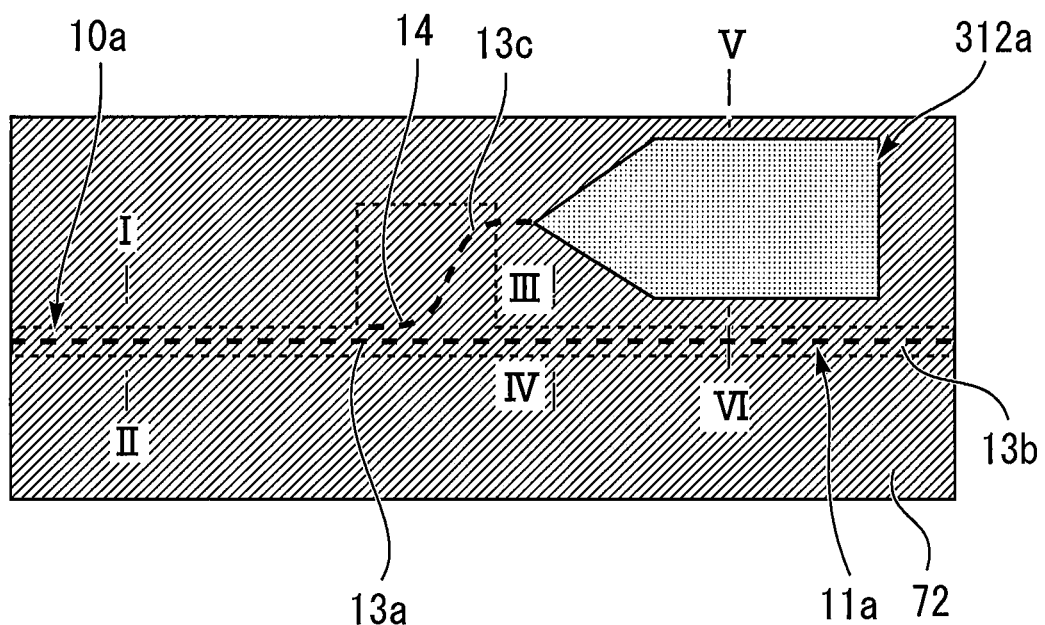
FIG. 105 is a plan view showing a state where the contact layer has been grown in the second embodiment.
Figure 106:
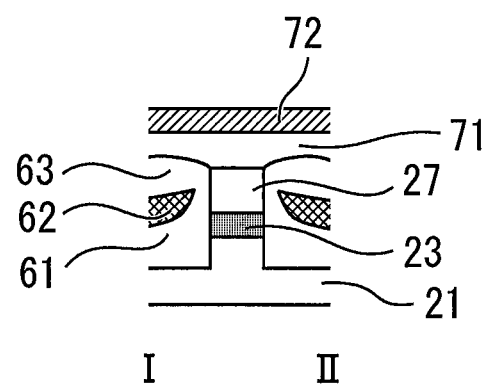
FIG. 106 is a cross-sectional view obtained by cutting FIG. 105 along a line I-II.
Figure 107:
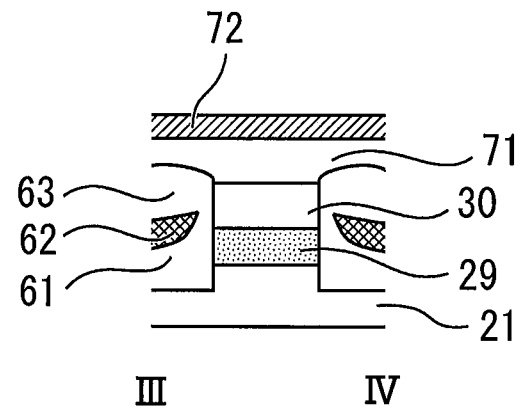
FIG. 107 is a cross-sectional view obtained by cutting FIG. 105 along a line III-IV.
Figure 108:
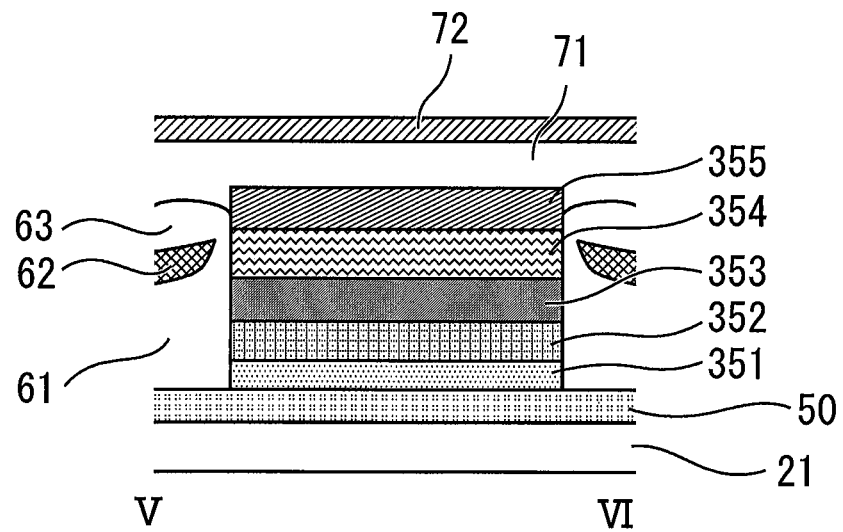
FIG. 108 is a cross-sectional view obtained by cutting FIG. 105 along a line V-VI.

Next, a contact layer is formed. The contact layer includes the cladding layer 71 and the p-InGaAs layer 72. FIG. 105 is a plan view showing a state where the contact layer has been grown in the second embodiment. FIG. 106 is a cross-sectional view obtained by cutting FIG. 105 along a line I-II. FIG. 107 is a cross-sectional view obtained by cutting FIG. 105 along a line III-IV. FIG. 108 is a cross-sectional view obtained by cutting FIG. 105 along a line V-VI. First, the insulating film 28c is removed. Next, the contact layer is grown on the entire surface of the conductive substrate 21 by crystal growth.

Figure 109:
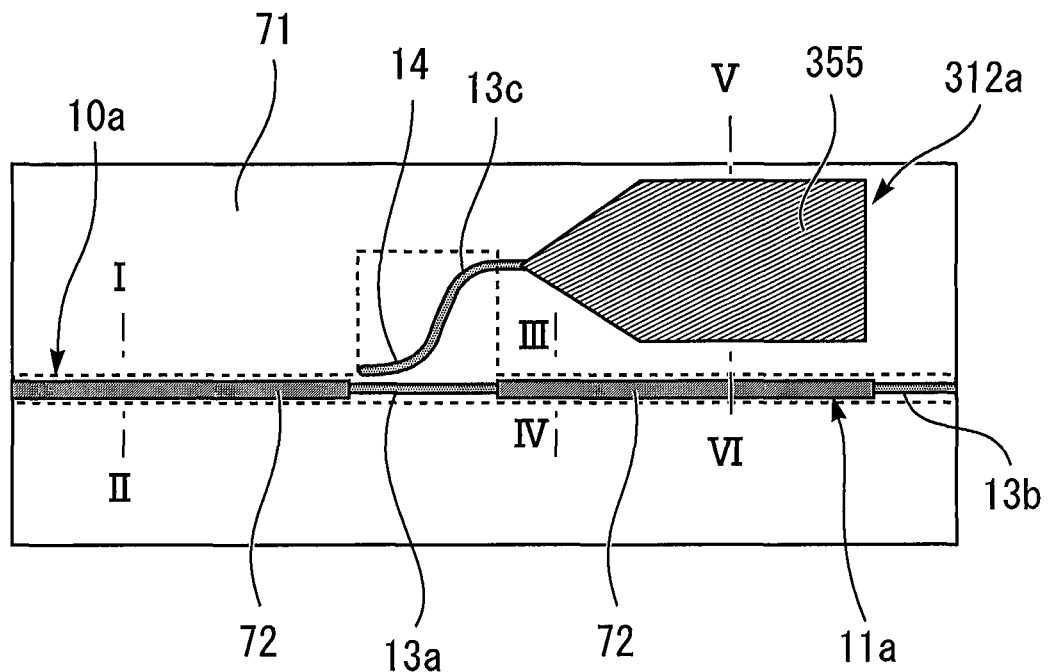
FIG. 109 is a plan view showing a state where the contact layer has been etched in the second embodiment.
Figure 110:
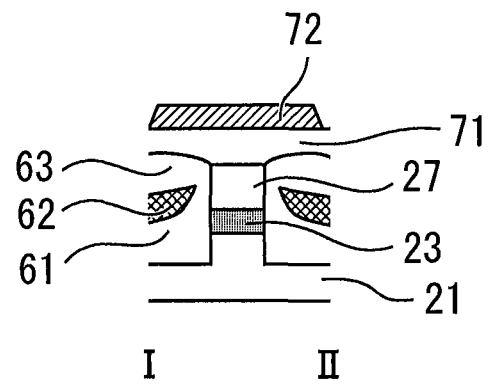
FIG. 110 is a cross-sectional view obtained by cutting FIG. 109 along a line I-II.
Figure 111:
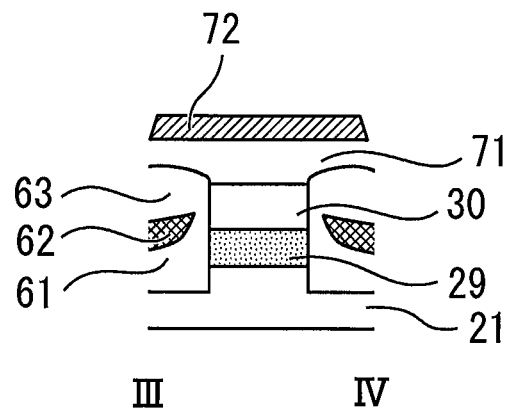
FIG. 111 is a cross-sectional view obtained by cutting FIG. 109 along a line III-IV.
Figure 112:
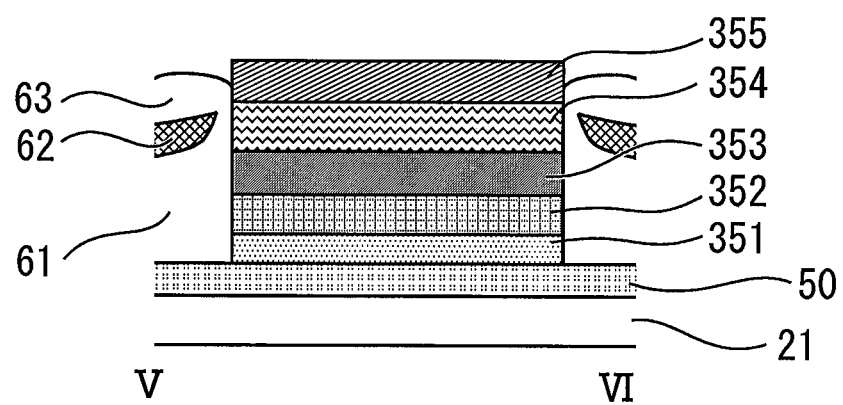
FIG. 112 is a cross-sectional view obtained by cutting FIG. 109 along a line V-VI.

Next, the contact layer is etched. FIG. 109 is a plan view showing a state where the contact layer has been etched in the second embodiment. FIG. 110 is a cross-sectional view obtained by cutting FIG. 109 along a line I-II. FIG. 111 is a cross-sectional view obtained by cutting FIG. 109 along a line III-IV. FIG. 112 is a cross-sectional view obtained by cutting FIG. 109 along a line V-VI.

Here, the p-InGaAs layer 72 is etched so as to leave a portion of the p-InGaAs layer 72 which is positioned just below the electrode. In the photodiode forming portion 312a, the cladding layer 71 and the p-InGaAs layer 72 are all removed. As a result, the p-InGaAs layer 72 is left on the laser forming portion 10a and the modulator forming portion 10b.

Figure 113:
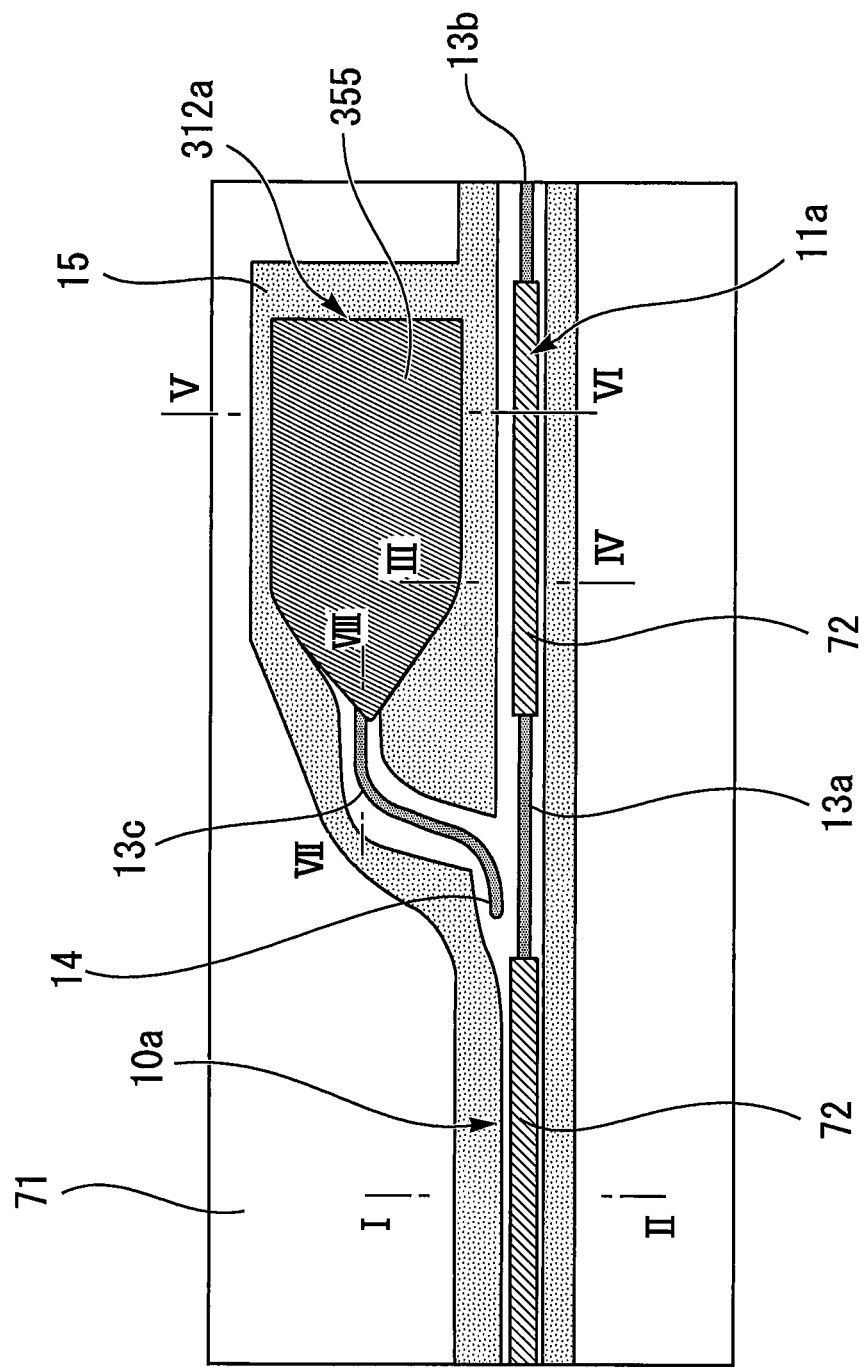
FIG. 113 is a plan view showing a state in which the mesa has been formed in the second embodiment.
Figure 114:
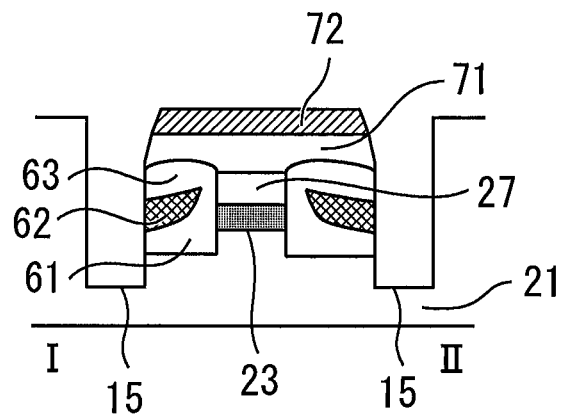
FIG. 114 is a cross-sectional view obtained by cutting FIG. 113 along a line I-II.
Figure 115:
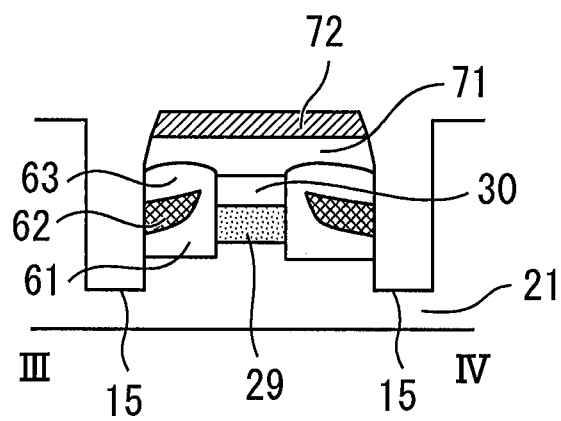
FIG. 115 is a cross-sectional view obtained by cutting FIG. 113 along a line III-IV.
Figure 116:
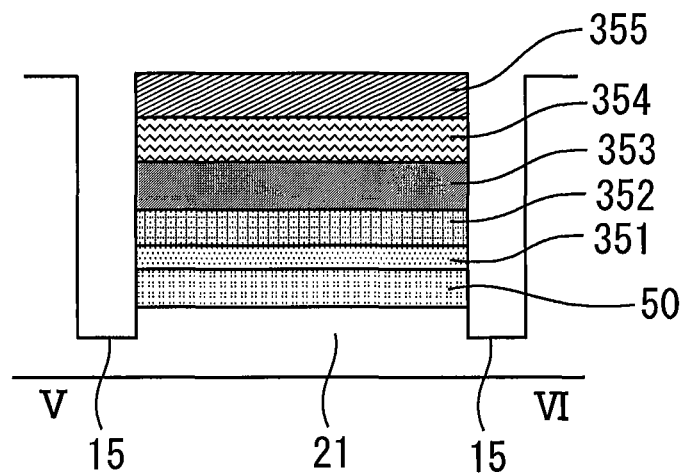
FIG. 116 is a cross-sectional view obtained by cutting FIG. 113 along a line V-VI.
Figure 117:
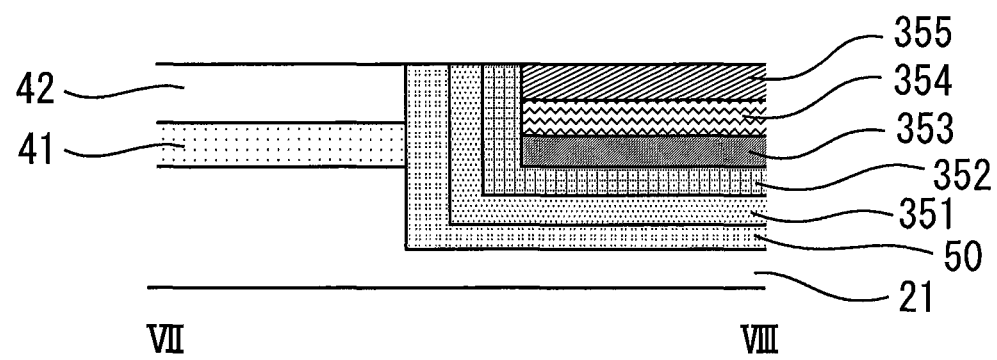
FIG. 117 is a cross-sectional view obtained by cutting FIG. 113 along a line VII-VIII.

Next, a mesa is formed. FIG. 113 is a plan view showing a state in which the mesa has been formed in the second embodiment. FIG. 114 is a cross-sectional view obtained by cutting FIG. 113 along a line I-II. FIG. 115 is a cross-sectional view obtained by cutting FIG. 113 along a line III-IV. FIG. 116 is a cross-sectional view obtained by cutting FIG. 113 along a line V-VI. FIG. 117 is a cross-sectional view obtained by cutting FIG. 113 along a line VII-VIII.

As in the case of the first embodiment, the trenches 15 are formed on both sides of the laser forming portion 10a, both sides of the modulator forming portion 11a, and both sides of the waveguides 13a, 13b, and 13c. Further, the trenches 15 are formed so as to surround the photodiode forming portion 312a except for the connecting portion with the waveguide 13c.

Figure 118:
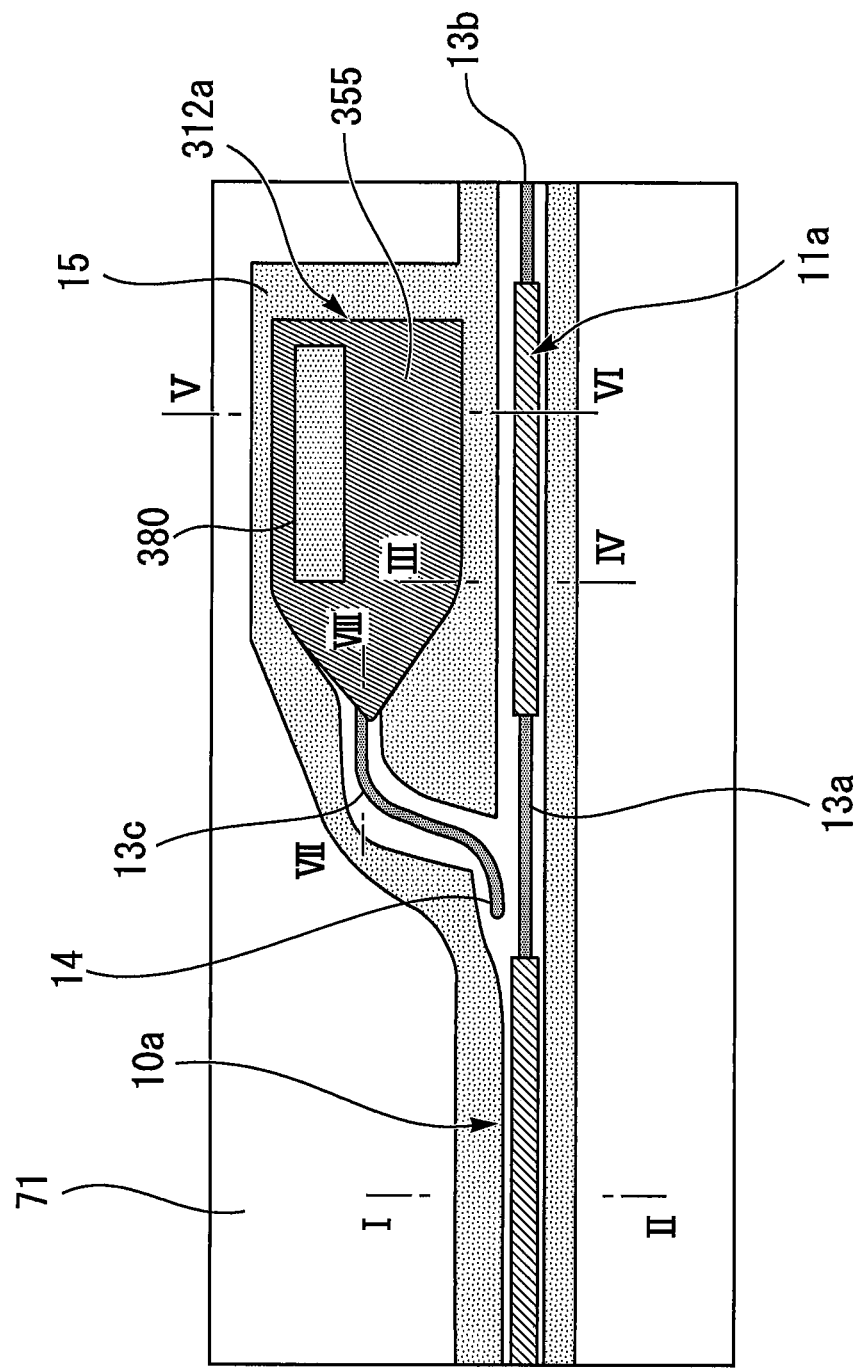
FIG. 118 is a plan view showing a state where the contact hole has been formed in the photodiode forming portion in the second embodiment.
Figure 119:
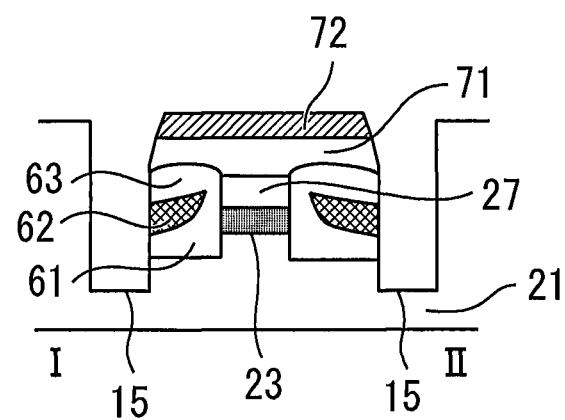
FIG. 119 is a cross-sectional view obtained by cutting FIG. 118 along a line I-II.
Figure 120:
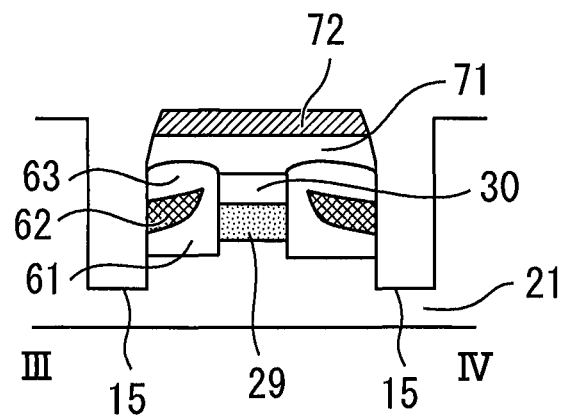
Figure 121:
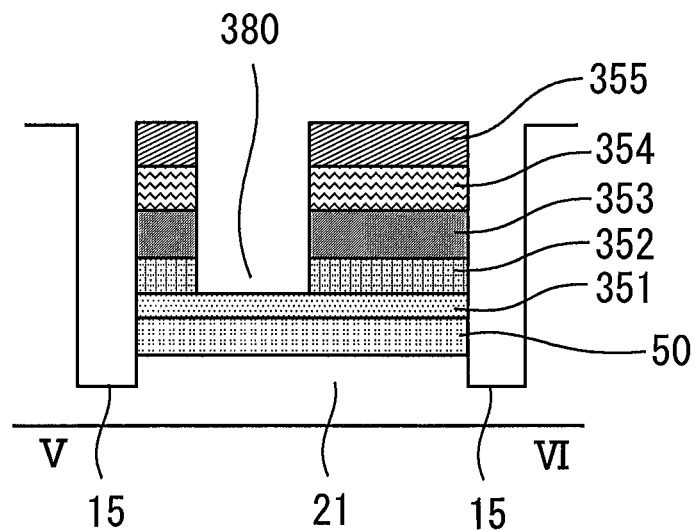
Figure 122:
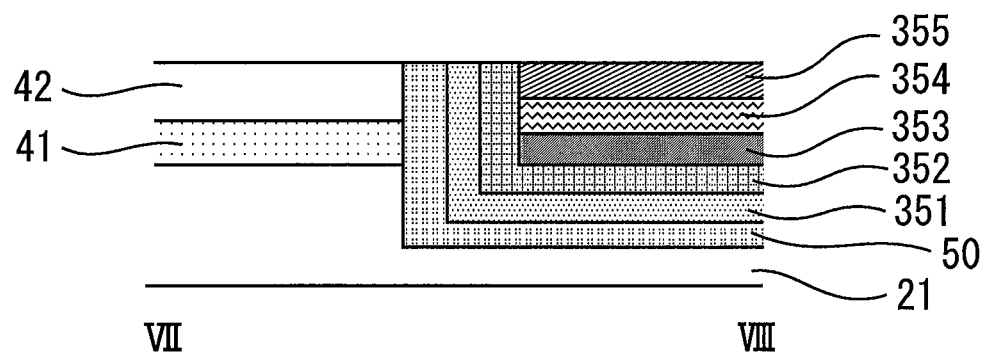

Next, the contact hole 380 is formed. FIG. 118 is a plan view showing a state where the contact hole 380 has been formed in the photodiode forming portion 312a in the second embodiment. FIG. 119 is a cross-sectional view obtained by cutting FIG. 118 along a line I-II. FIG. 120 is a cross-sectional view obtained by cutting FIG. 118 along a line III-IV. FIG. 121 is a cross-sectional view obtained by cutting FIG. 118 along a line V-VI. FIG. 122 is a cross-sectional view obtained by cutting FIG. 118 along a line VII-VIII.

The contact hole 380 is configured so that the longitudinal direction thereof extends in a light incident direction to the photodiode 312 in a plan view. The contact hole 380 is formed from the upper surface of the contact layer 355 until a depth at which the contact hole 380 reaches the contact layer 351.

Next, the insulating film 81 is formed on the entire surface of the conductive substrate 21. The insulating film 81 covers the side and bottom surfaces of the trenches 15 and the side and bottom surfaces of the contact hole 380.

Figure 123:
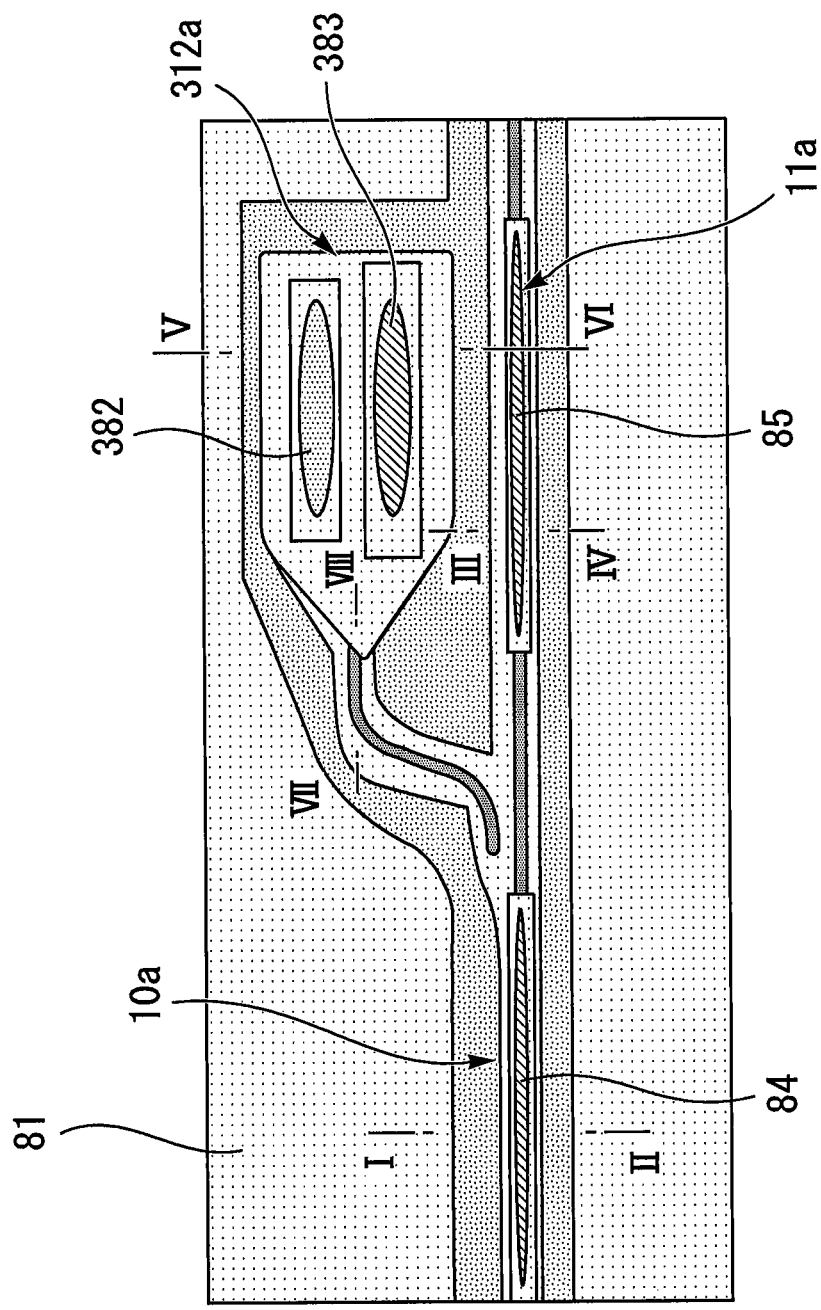
Figure 124:
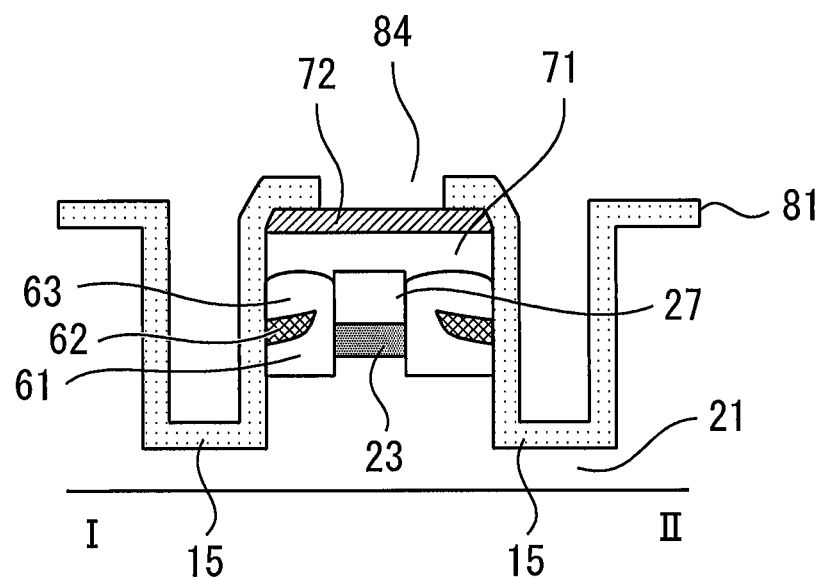
Figure 125:
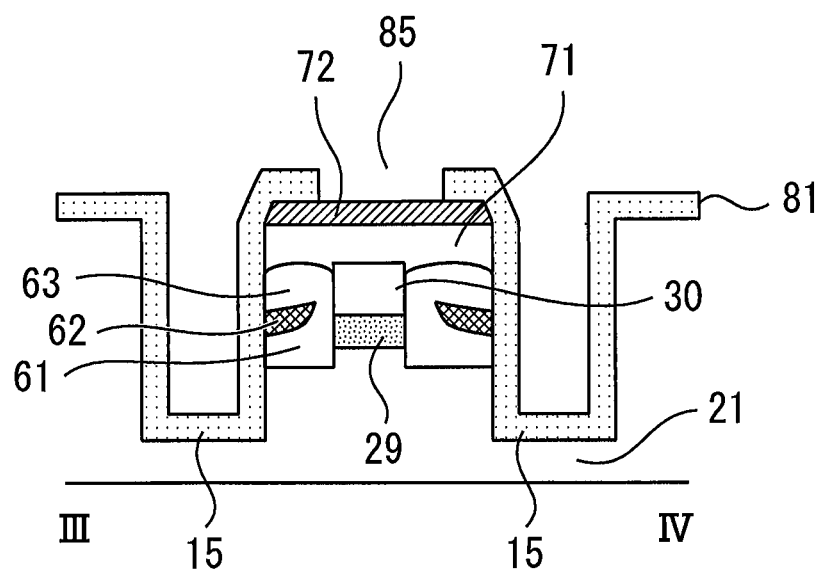
Figure 126:
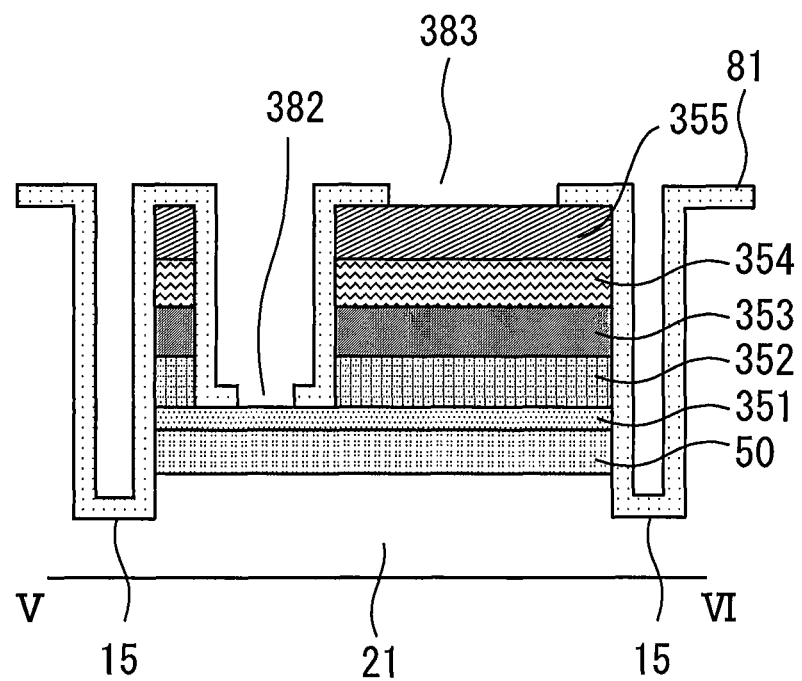
Figure 127:
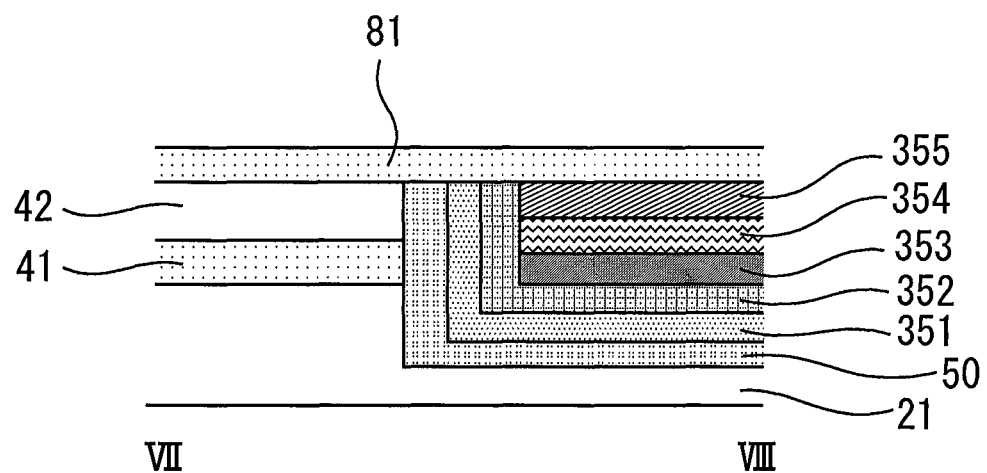

Next, the openings 84, 85, 382, and 383 are formed in the insulating film 81. FIG. 123 is a plan view showing a state in which the openings 84, 85, 382, and 383 have been formed in the insulating film 81 in the second embodiment. FIG. 124 is a cross-sectional view obtained by cutting FIG. 123 along a line I-II. FIG. 125 is a cross-sectional view obtained by cutting FIG. 123 along a line III-IV. FIG. 126 is a cross-sectional view obtained by cutting FIG. 123 along a line V-VI. FIG. 127 is a cross-sectional view obtained by cutting FIG. 123 along a line VII-VIII.

The opening 382 is formed so as to expose the contact layer 351 at the bottom surface of the contact hole 380. The opening 383 is formed so that the contact layer 355 is exposed in the photodiode forming portion 312a. The structures of the openings 84 and 85 are the same as those of the first embodiment.

Next, an electrode 87 is formed on the insulating film 81. As shown in FIGS. 90 to 94, the structure of the electrode 87 in the laser forming portion 10a and the modulator forming portion 11a is the same as that of the first embodiment. The anode 87a is provided so as to fill the opening 383 in the photodiode forming portion 312a and contact the contact layer 355. The cathode 87b is provided so as to fill the opening 382 in the photodiode forming portion 312a and contact the contact layer 351.

Next, a back surface step is executed. The back surface step is the same as that in the first embodiment. From the above steps, the semiconductor optical integrated device 300 shown in FIGS. 90 to 94 is formed. In the second embodiment, the same effect as that of the first embodiment can be obtained.

Note that the technical features described in the above embodiments may be combined as appropriate.

REFERENCE SIGNS LIST 100, 300 semiconductor optical integrated device, 10 laser, 12 photodiode, 13a,13b,13c waveguide, 19,319 light receiving surface, 21 conductive substrate, 43 end face, 50 semi-insulating semiconductor layer, 87a anode, 87b cathode, 90 electrode

The invention claimed is:
1. A semiconductor optical integrated device comprising:
a conductive substrate having a front surface and a back surface which is a surface on an opposite side to the front surface;
a laser provided to the front surface of the conductive substrate;
a semi-insulating semiconductor layer provided to the front surface of the conductive substrate;
a photodiode provided on the semi-insulating semiconductor layer;
trenches provided on both sides of the photodiode from an upper surface of the photodiode to the conductive substrate;
a waveguide that is provided to the front surface of the conductive substrate and guides output light of the laser to the photodiode; and
a first electrode provided to the back surface of the conductive substrate,
wherein an anode of the photodiode and a cathode of the photodiode are drawn from an upper surface side of the photodiode,
the waveguide and the photodiode are separated from each other by the semi-insulating semiconductor layer,
the anode and the cathode of the photodiode are electrically separated from the first electrode,
the waveguide includes a first waveguide connected to an output of the laser, and a second waveguide for branching a part of the output light of the laser from the first waveguide, and guiding the part of the output light to the photodiode,
the semi-insulating semiconductor layer extends along an end face of the second waveguide which faces a light receiving surface of the photodiode, and the photodiode includes a first conductivity type cladding layer, an i-type light absorption layer, and a second conductivity type cladding layer in order from the conductive substrate side.

2. The semiconductor optical integrated device according to claim 1, wherein the first electrode is an electrode of the laser.

3. The semiconductor optical integrated device according to claim 1, wherein the conductive substrate is made of conductive InP, and the semi-insulating semiconductor layer is made of InP doped with Fe.

4. The semiconductor optical integrated device according to claim 1, wherein the first conductivity type cladding layer is an n-InP cladding layer, the i-type light absorption layer is an i-InGaAsP light absorption layer, and the second conductivity type cladding layer is a p-InP cladding layer.

5. The semiconductor optical integrated device according to claim 1, wherein the first conductivity type cladding layer is a p-InP cladding layer, the i-type light absorption layer is an i-InGaAsP light absorption layer, and the second conductivity type cladding layer is an n-InP cladding layer.

6. A semiconductor optical integrated device comprising:
a conductive substrate having a front surface and a back surface which is a surface on an opposite side to the front surface;
a laser provided to the front surface of the conductive substrate;
a semi-insulating semiconductor layer provided to the front surface of the conductive substrate;
a photodiode provided on the semi-insulating semiconductor layer;
a waveguide that is provided to the front surface of the conductive substrate and guides output light of the laser to the photodiode; and
a first electrode provided to the back surface of the conductive substrate,
wherein an anode of the photodiode and a cathode of the photodiode are drawn from an upper surface side of the photodiode,
the waveguide and the photodiode are separated from each other by the semi-insulating semiconductor layer,
the anode and the cathode of the photodiode are electrically separated from the first electrode,
the waveguide includes a first waveguide connected to an output of the laser, and a second waveguide for branching a part of the output light of the laser from the first waveguide, and guiding the part of the output light to the photodiode,
the semi-insulating semiconductor layer extends along an end face of the second waveguide which faces a light receiving surface of the photodiode, and
the photodiode includes an n-InP cladding layer, an i-InGaAsP light absorption layer, and a p-InP cladding layer in order from the conductive substrate side.

7. A semiconductor optical integrated device comprising:
a conductive substrate having a front surface and a back surface which is a surface on an opposite side to the front surface;
a laser provided to the front surface of the conductive substrate;
a semi-insulating semiconductor layer provided to the front surface of the conductive substrate;
a photodiode provided on the semi-insulating semiconductor layer;
a waveguide that is provided to the front surface of the conductive substrate and guides output light of the laser to the photodiode; and
a first electrode provided to the back surface of the conductive substrate,
wherein an anode of the photodiode and a cathode of the photodiode are drawn from an upper surface side of the photodiode,
the waveguide and the photodiode are separated from each other by the semi-insulating semiconductor layer,
the anode and the cathode of the photodiode are electrically separated from the first electrode,
the waveguide includes a first waveguide connected to an output of the laser, and a second waveguide for branching a part of the output light of the laser from the first waveguide, and guiding the part of the output light to the photodiode,
the semi-insulating semiconductor layer extends along an end face of the second waveguide which faces a light receiving surface of the photodiode, and
the photodiode includes a p-InP cladding layer, an i-InGaAsP light absorption layer, and an n-InP cladding layer in order from the conductive substrate side.

* * * * *